United States Patent
Tsujimoto et al.

(10) Patent No.: US 9,577,164 B2
(45) Date of Patent: Feb. 21, 2017

(54) SEMICONDUCTOR LIGHT EMITTING DEVICE AND OPTICAL FILM

(71) Applicant: Asahi Kasei E-materials Corporation, Tokyo (JP)

(72) Inventors: Hiroyuki Tsujimoto, Tokyo (JP); Atsushi Suzuki, Tokyo (JP); Junji Kato, Tokyo (JP); Shozo Takada, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/914,552

(22) PCT Filed: Sep. 1, 2014

(86) PCT No.: PCT/JP2014/072935
§ 371 (c)(1),
(2) Date: Feb. 25, 2016

(87) PCT Pub. No.: WO2015/030237
PCT Pub. Date: Mar. 5, 2015

(65) Prior Publication Data
US 2016/0211425 A1 Jul. 21, 2016

(30) Foreign Application Priority Data

Aug. 30, 2013 (JP) ................................. 2013-180656
Nov. 8, 2013 (JP) ................................. 2013-231933
(Continued)

(51) Int. Cl.
*H01L 33/00* (2010.01)
*H01L 33/58* (2010.01)
(Continued)

(52) U.S. Cl.
CPC ............. *H01L 33/58* (2013.01); *H01L 33/005* (2013.01); *H01L 33/0012* (2013.01);
(Continued)

(58) Field of Classification Search
CPC ............................ H01L 33/58; H01L 33/0012
See application file for complete search history.

(56) References Cited

U.S. PATENT DOCUMENTS

| 2005/0056831 A1 | 3/2005 | Senda et al. |
| 2007/0023763 A1 | 2/2007 | Takigawa et al. |

(Continued)

FOREIGN PATENT DOCUMENTS

| JP | 2005-93728 A | 4/2005 |
| JP | 2006-278751 A | 10/2006 |

(Continued)

OTHER PUBLICATIONS

International Preliminary Report on Patentability and the translation of the Written Opinion of the International Searching Authority (Forms PCT/IB/338, PCT/IB/373 and PCT/ISA/237) dated Mar. 10, 2016, for International Application No. PCT/JP2014/072935.

(Continued)

*Primary Examiner* — Dung Le
(74) *Attorney, Agent, or Firm* — Birch, Stewart, Kolasch & Birch, LLP

(57) ABSTRACT

A semiconductor light emitting device, which can endure a dicing step for singulation, is superior in resistance to a high/low thermal cycle, and exhibits a high light extraction efficiency, and an optical film, which can be used favorably for producing the semiconductor light emitting device, are to be provided. The invention provides a semiconductor light emitting device comprising a semiconductor layer, an A layer, and a B layer, in which the semiconductor light emitting device is configured such that at least a part of emitted light from the semiconductor layer is emitted outward from the B layer through the A layer, the thickness of (Continued)

the A layer is from 1 nm to 200 nm, the B layer has a first major surface and a second major surface, while the first major surface faces the A layer and the second major surface has a concave-convex microstructure, the B layer contains an inorganic substance at 60 mass-% or more on the basis of the total mass of the B layer, and the content of an inorganic substance present in the A layer is lower than the content of the inorganic substance present in the B layer.

30 Claims, 8 Drawing Sheets

(30) Foreign Application Priority Data

| Nov. 27, 2013 | (JP) | ................................. | 2013-245367 |
| Dec. 27, 2013 | (JP) | ................................. | 2013-272828 |
| Dec. 27, 2013 | (JP) | ................................. | 2013-273002 |

(51) Int. Cl.
*H01L 33/22* (2010.01)
*H01L 33/44* (2010.01)

(52) U.S. Cl.
CPC .............. *H01L 33/22* (2013.01); *H01L 33/44* (2013.01); *H01L 2933/0025* (2013.01); *H01L 2933/0058* (2013.01)

(56) References Cited

U.S. PATENT DOCUMENTS

| 2013/0186467 A1* | 7/2013 | Saeki | .................... B29C 33/424 136/259 |
| 2013/0234179 A1 | 9/2013 | Yamada et al. | |
| 2014/0342121 A1* | 11/2014 | Taguchi | ................. G02B 1/105 428/141 |
| 2015/0129915 A1* | 5/2015 | Lee | ......................... H01L 33/20 257/98 |

FOREIGN PATENT DOCUMENTS

| JP | 2007-35967 A | 2/2007 |
| JP | 2009-229507 A | 10/2009 |
| JP | 2011-228674 A | 11/2011 |
| JP | 2013/001781 A1 | 1/2013 |

OTHER PUBLICATIONS

International Search Report dated Sep. 30, 2014, for International Application No. PCT/JP2014/072935.

* cited by examiner

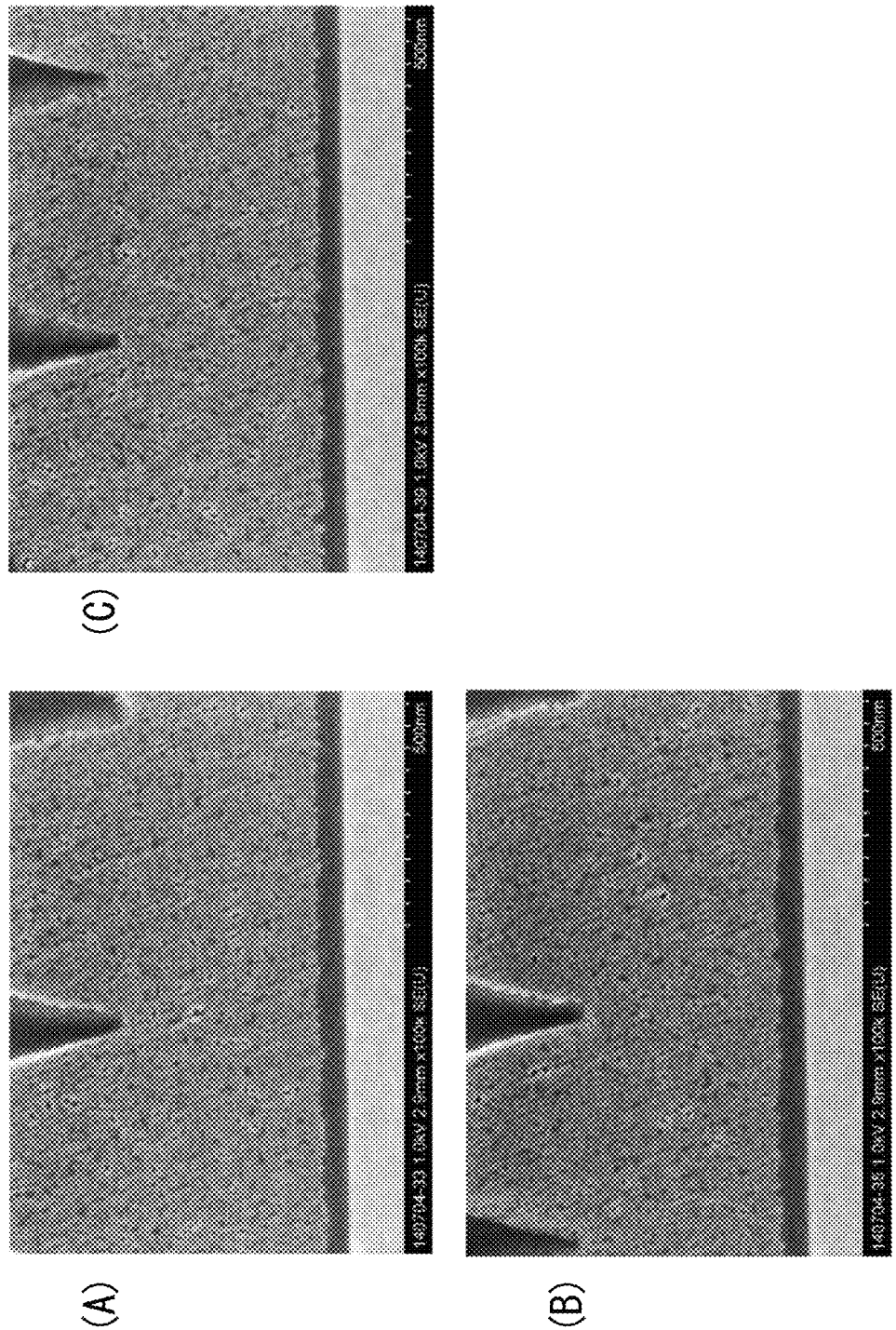

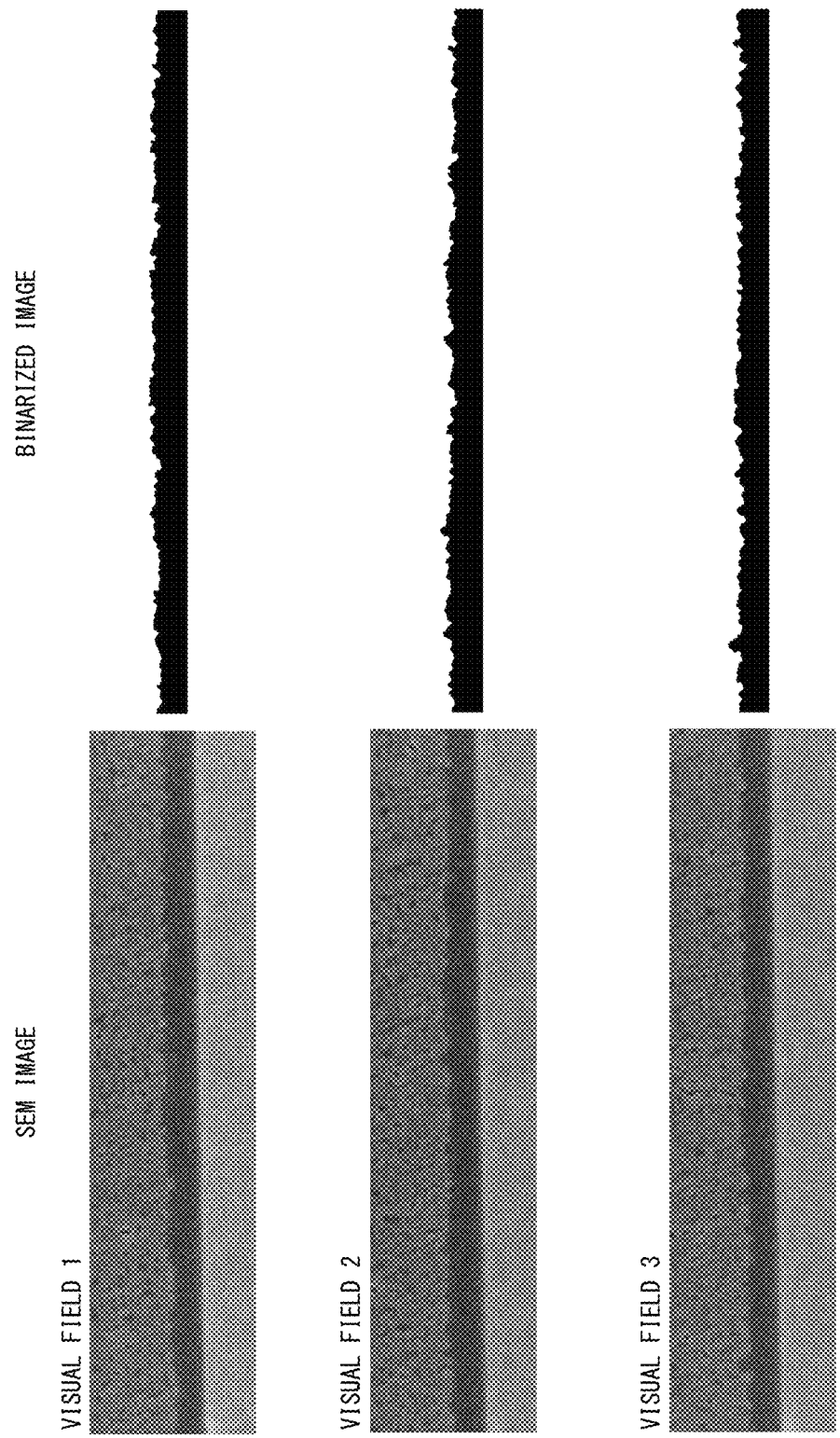

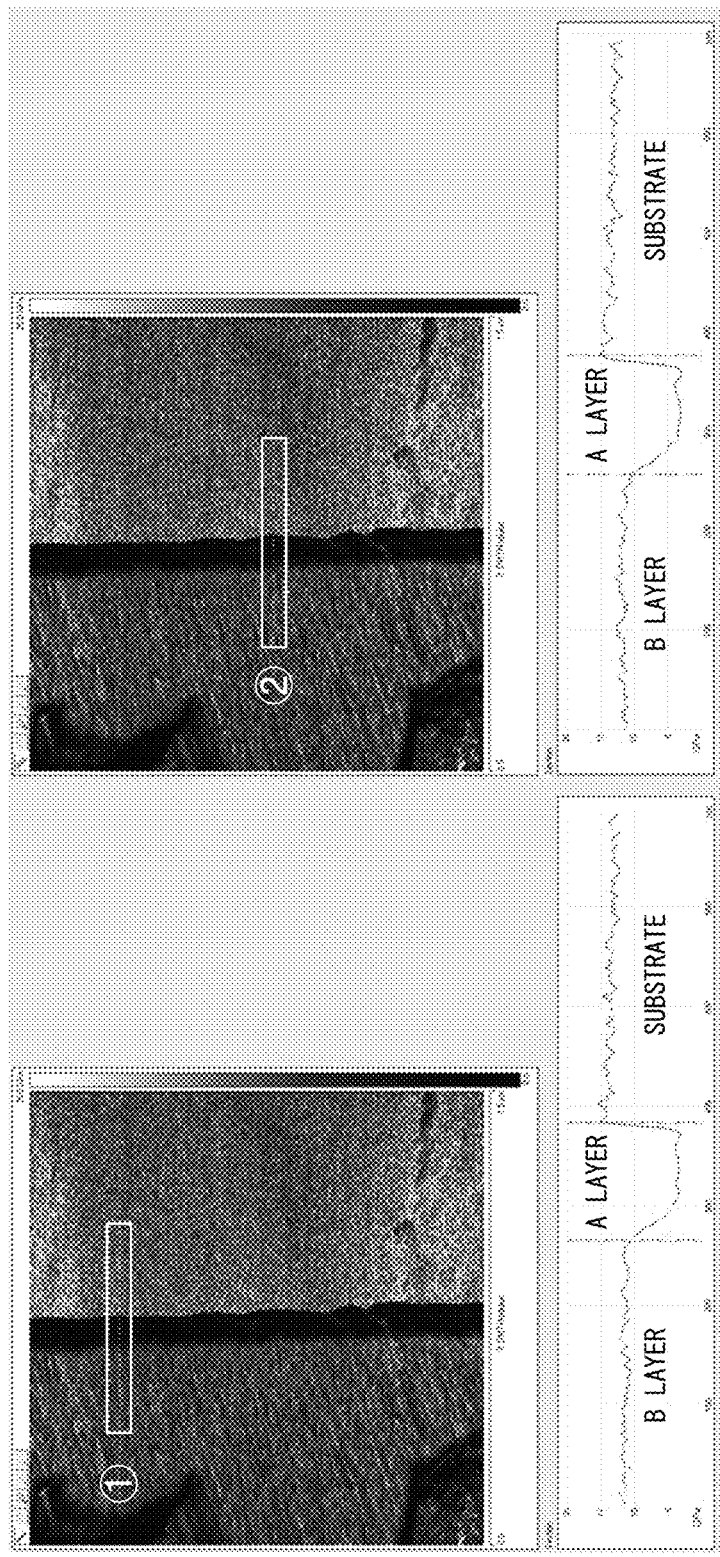

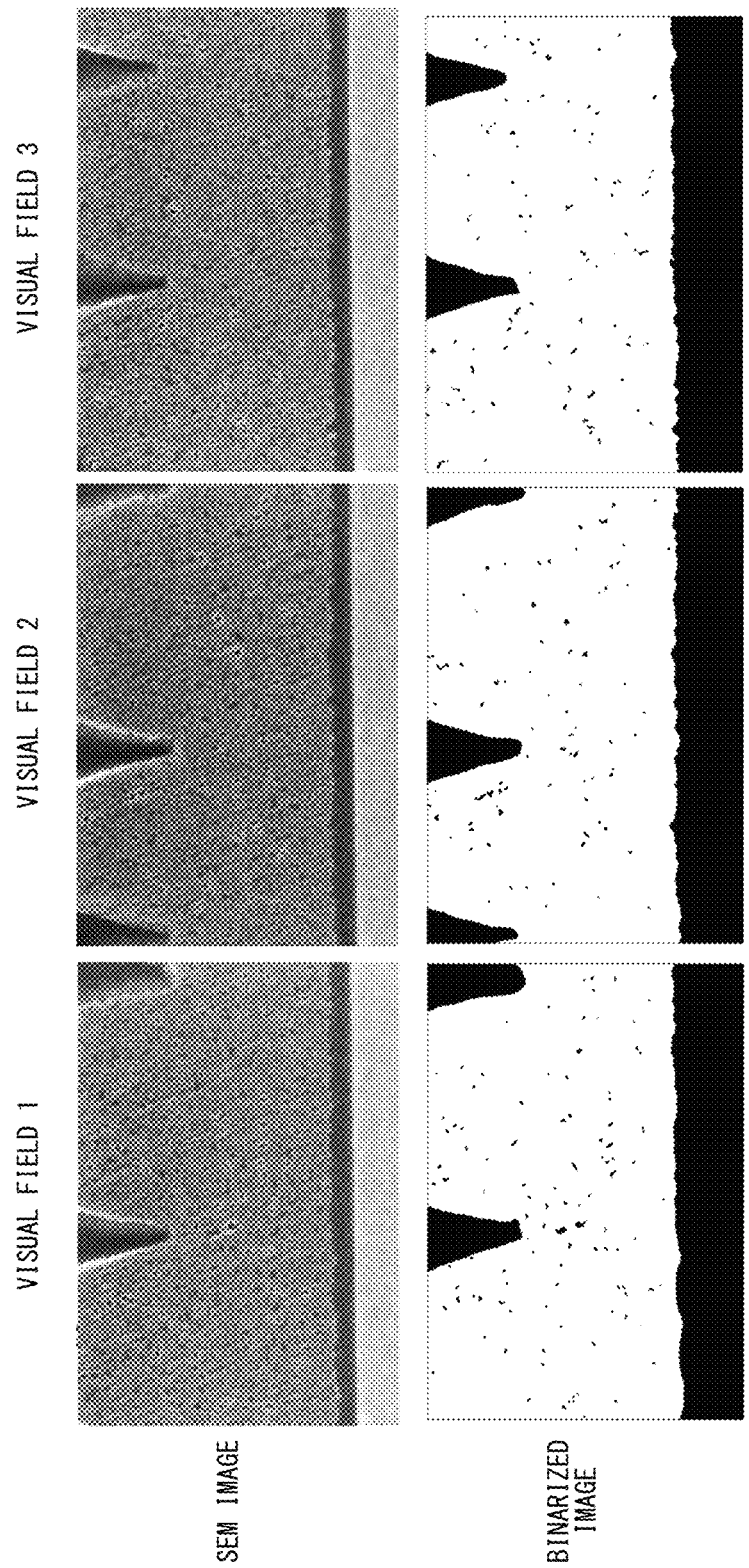

SEMICONDUCTOR LIGHT EMITTING DEVICE AND OPTICAL FILM

FIELD OF THE INVENTION

The present invention relates to a semiconductor light emitting device, and a method for producing the same, as well as an optical film, and a method for producing the same.

DESCRIPTION OF THE RELATED ART

With respect to a semiconductor light emitting device such as a LED, it has been heretofore known to seal a device structure with a translucent resin, such as an epoxy resin, and a silicone resin. In such a semiconductor light emitting device, the refractive index of a surface part of the light emitting device structure is higher than the refractive index of the translucent resin, and therefore there is an angle range where conditions for total reflection are met at an interface between the light emitting device structure and the sealing component. Within the angle, incident light to the interface from the inner part of the device cannot be extracted out of the light emitting device.

Patent Literature 1 describes a flip chip type GaN-based semiconductor light emitting device, wherein a laminate comprising a light emission layer composed of a GaN semiconductor is formed on the upper surface of a substrate, and the device is configured such that flip-chip assembly is possible allowing light to be extracted from the lower surface of the substrate, characterized in that a concave-convex structure, which is composed of an optically transparent material having a refractive index equivalent to or higher than the refractive index of a material of the substrate, and able to scatter light, is formed on the lower surface of the substrate.

Patent Literature 2 describes a light emission apparatus characterized by comprising a substrate having translucency with respect to a predetermined wavelength, a semiconductor layer formed on the substrate and having an active unit emitting light with a predetermined wavelength, and a bubble containing body predetermined wavelength, and a bubble containing body, which is formed on a surface opposite to the side of the substrate where the semiconductor layer is formed, and has translucency with respect to the predetermined wavelength.

Patent Literature 3 describes a semiconductor light emission apparatus characterized in that the apparatus comprises a semiconductor laminate constituted with a plurality of laminated semiconductor layers comprising a light emission layer, and a light extraction layer composed of a resin material formed on at least a part of a surface of the semiconductor laminate, wherein the resin material contains a particle, the refractive index of the particle with respect to the emitted light is higher than the refractive index of the resin material with respect to the emitted light, and the diameter of the particle is smaller than the wavelength of the emitted light inside the resin material; and describes further that the density of the particle decreases along the emission direction of the emitted light, and a concave-convex profile with a periodic structure is formed on a surface of the light extraction layer.

Total reflection of light leads to a loss in a light emission efficiency, and may cause, due to conversion of light to heat, not only decrease in the brightness of a light emitting device, but also deterioration of the heat dissipation capacity. Heat generation in a device deteriorates a resin, and may break the device. Therefore, it is an essential engineering item for a light emission apparatus from the standpoint of the reliability of a device, to prevent total reflection at an interface and to extract light at a high efficiency.

Various techniques have been investigated for preventing total reflection at an interface and improving an extraction efficiency of light.

Examples of a method for improving an extraction efficiency of light include a control of a sealing shape, a PSS for which a microstructure is formed on a sapphire and a semiconductor layer is grown thereon, and a method by which a light diffusion layer is provided on a surface of a light emission layer. As a simple method for imparting an improving effect on light extraction efficiency to a light emitting device, Patent Literature 4 describes a seal film constituted with an optical film and an adhesive film, wherein the optical film has concave-convex or variety in refractive index, and describes further that by sticking the seal film to a device structure, a light extraction capacity and a sealing capacity can be imparted, and the process can be simplified.

With respect to a seal film described in Patent Literature 4, the glass transition temperature of the optical film is 60° C. or more, the glass transition temperature of the adhesive film is 130° C. or less, and the refractive index of the adhesive film is 1.42 or more. In this regard, the seal film is a transparent seal film, in which (1) there is concave-convex with an average groove depth of 0.1 µm or more, or a refractive index distribution with a refractive index variation as large as a refractive index difference of 0.2 or more, on a surface of the optical film opposite to the adhesive film, (2) there is a structure with a refractive index distribution with a refractive index variation as large as a refractive index difference of 0.015 or more inside the optical film, or (3) there is concave-convex with an average groove depth of 0.1 µm or more at an interface between the optical film and the adhesive film.

CITATION LIST

Patent Literature

[Patent Literature 1] Japanese Patent Application Laid-Open (JP-A) No. 2006-278751
[Patent Literature 2] JP-A No. 2005-93728
[Patent Literature 3] JP-A No. 2007-035967
[Patent Literature 4] JP-A No. 2009-229507

SUMMARY OF THE INVENTION

Technical Problem

The light extraction efficiency has so far reached the higher range between 100 and 200 lm/W. From now on improvement of the light extraction efficiency by 10 to 20 lm/W annually is desired. In other words, technologies, which can improve the light extraction efficiency annually by 5% or more and preferably 10% or more with respect to the light extraction efficiency achieved so far, are desired.

However, with respect to a semiconductor light emitting device described in Patent Literature 1, the adhesion between a sapphire substrate and a concave-convex structure composed of $Al_{0.5}Ga_{0.5}N$ in a dot pattern grown on the sapphire substrate is so weak, that the concave-convex structure is apt to be detached from the sapphire to decrease the yield in a dicing step for singulating a wafer. In the case of a light emission apparatus described in Patent Literature 2, a diffusion layer is a bubble containing layer, and therefore the strength is extremely poor due to bubbles, and the adhesion of the bubble containing layer at an interface is extremely weak. In the case of a semiconductor device described in Patent Literature 3, the adhesion at an interface is extremely weak due to precipitation and aggregation of particles inside a resin.

In the case of a seal film described in Patent Literature 4, the light resistance of an optical film or an adhesive is so poor that discoloration or degradation occurs by long term use. Further, by heat generation through long time use of a light emitting device deformation or cracking occurs. Further, with respect to a seal film described in Patent Literature 4, the elastic modulus of an adhesive layer before a curing treatment is low, and therefore the tackiness of the adhesive layer remains, so that the lamination property and the operability at transfer become inferior. Since a seal film described in Patent Literature 4 undergoes a thermal resin curing step for combining an adhesive layer, the combination of a concave-convex imparting structure layer requires a long time.

In view of the conventional art, an object of the invention is to provide a semiconductor light emitting device, which can endure a dicing step for singulation, is superior in resistance to a high/low thermal cycle due to superior adherence between an adherend as a component of the light emitting device and a concave-convex microstructure layer, and exhibits a high light extraction efficiency, and a method for producing the same.

Another object of the invention is to provide an optical film for producing a semiconductor light emitting device, in which the adherence between an adherend component in the light emitting device and a concave-convex microstructure layer is superior, discoloration or degradation of the an adhesive layer and a concave-convex microstructure layer by light does not occur, and deformation or cracking by heat does not occur, so that the device can endure a long term use.

Another object of the invention is to provide an optical film for producing a semiconductor light emitting device, in which the adherence between an adherend component in the light emitting device and a concave-convex microstructure layer is superior, and a concave-convex microstructure layer can be formed favorably by thermal lamination.

Another object of the invention is to provide a method for producing an optical film for producing a semiconductor light emitting device, which imparts a superior adherence between an adherend component in the light emitting device and a concave-convex microstructure layer, exhibits high transferability, and can form a concave-convex microstructure layer during a short time process step.

Means for Solving Problem

To attain the objects, the present inventors investigated diligently and repeated experiments to find that the objects can be attained by the following solutions, thereby completing the invention. Namely, the invention is as follows.

[1] A semiconductor light emitting device comprising a semiconductor layer, an A layer, and a B layer, wherein:
the semiconductor light emitting device is configured such that at least a part of emitted light from the semiconductor layer is emitted outward from the B layer through the A layer,
the thickness of the A layer is from 1 nm to 200 nm,
the B layer has a first major surface and a second major surface, while the first major surface faces the A layer and the second major surface has a concave-convex microstructure,
the B layer contains an inorganic substance at 60 mass-% or more on the basis of the total mass of the B layer, and
the content of an inorganic substance present in the A layer is lower than the content of the inorganic substance present in the B layer.

[2] The semiconductor light emitting device according to the above mode 1, wherein:
the refractive index of the B layer is 1.60 or more, and
the refractive index of the A layer is smaller than the refractive index of the B layer.

[3] The semiconductor light emitting device according to the mode 1 or 2, wherein the elastic modulus of the A layer is smaller than the elastic modulus of the B layer, provided that an elastic modulus is measured based on a sectional elastic modulus profile of the semiconductor light emitting device using an atomic force microscope.

[4] The semiconductor light emitting device according to any one of the modes 1 to 3, wherein the A layer contains an inorganic substance at 60 mass-% or less on the basis of the total mass of the A layer.

[5] The semiconductor light emitting device according to the mode 4, wherein the A layer contains an inorganic substance at 40 mass-% or less on the basis of the total mass of the A layer.

[6] The semiconductor light emitting device according to any one of the modes 1 to 5, wherein the thickness of the A layer is from 1 nm to 100 nm.

[7] The semiconductor light emitting device according to any one of the modes 1 to 6, wherein the height of the concave-convex microstructure of the B layer is from 300 nm to 1,500 nm.

[8] The semiconductor light emitting device according to any one of the modes 1 to 7, wherein the porosity of the B layer attributable to voids with a major diameter of 50 nm or less present in the B layer is 5% or less.

[9] The semiconductor light emitting device according to any one of the modes 1 to 8, further comprising a C layer either or both of: on the second major surface of the B layer; and between the A layer and the B layer.

[10] The semiconductor light emitting device according to the mode 9, wherein the C layer contains at least one kind selected from the group consisting of silicon oxide, aluminum oxide, zirconium oxide, silicon nitride, aluminum nitride, ITO ($In_2O_3$—$SnO_2$), and AZO ($ZnO$—$Al_2O_3$).

[11] The semiconductor light emitting device according to the mode 9 or 10, wherein the thickness of the C layer is from 1 nm to 150 nm.

[12] The semiconductor light emitting device according to any one of the modes 1 to 11, further comprising a sealing material.

[13] An optical film for being stuck on at least a part of a light emitting surface of a semiconductor light emitting device, wherein:
the optical film comprises an A layer and a B layer,
the thickness of the A layer is from 1 nm to 200 nm,
the B layer has a first major surface and a second major surface, while the first major surface faces the A layer, and the second major surface has a concave-convex microstructure,
the A layer contains an inorganic substance at 60 mass-% or less on the basis of the total mass of the A layer,
the B layer contains an inorganic substance at 60 mass-% or more on the basis of the total mass of the B layer, and
the content of the inorganic substance present in the A layer is less than the content of the inorganic substance present in the B layer.

[14] The optical film according to the mode 13, wherein:
the refractive index of the B layer is 1.60 or more, and
the refractive index of the A layer is less than the refractive index of the B layer.

[15] The optical film according to the mode 13 or 14, wherein:
the glass transition temperature of the A layer is 10° C. or more,
the storage elastic modulus of the A layer at a temperature higher than the glass transition temperature by 20° C. is 10 MPa or less,
the ratio of the storage elastic modulus of the A layer at a temperature lower than the glass transition temperature by 20° C. to the storage elastic modulus of the A layer at a temperature higher than the glass transition temperature by 20° C. is from 3 to 600.

[16] The optical film according to the mode 15, wherein the storage elastic modulus of the A layer at a temperature lower than the glass transition temperature by 20° C. is 10 MPa or more.

[17] The optical film according to any one of the modes 13 to 16, wherein the elastic modulus of the A layer is smaller than the elastic modulus of the B layer, provided that an elastic modulus is measured based on a sectional elastic modulus profile of the optical film using an atomic force microscope.

[18] The optical film according to any one of the modes 13 to 17, wherein the A layer contains an inorganic substance at 40 mass-% or less on the basis of the total mass of the A layer.

[19] The optical film according to any one of the modes 13 to 18, wherein the thickness of the A layer is from 1 nm to 100 nm.

[20] The optical film according to any one of the modes 13 to 19, wherein the height of the concave-convex microstructure of the B layer is from 300 nm to 1,500 nm.

[21] The optical film according to any one of the modes 13 to 20, wherein the porosity of the B layer attributable to voids with a major diameter of 50 nm or less present in the B layer is 5% or less.

[22] The optical film according to any one of the modes 13 to 21, wherein the A layer contains metal oxide particles, and the average primary particle diameter of the metal oxide particles is 100 nm or less.

[23] The optical film according to any one of the modes 13 to 22, wherein the surface roughness Rz of a surface, which faces the A layer, of a layer adjacent to the A layer is two-thirds or less of the thickness of the A layer.

[24] The optical film according to any one of the modes 13 to 23, further comprising a protective layer.

[25] The optical film according to the mode 24, wherein the protective layer comprises a base layer, and a resin mold layer having a concave-convex microstructure.

[26] The optical film according to the mode 25, wherein the concave-convex microstructure of the resin mold layer and the concave-convex microstructure of the B layer face each other having profiles that are complement each other.

[27] A method for producing the optical film according to any one of the modes 13 to 26 comprising:
forming the B layer by transferring, or casting and curing, using a resin mold layer having a concave-convex microstructure, and
coating the A layer onto the first major surface of the B layer.

[28] A method for producing the semiconductor light emitting device according to any one of the modes 1 to 12 comprising:
forming a laminate comprising the semiconductor layer, and
forming on a surface of the laminate an A layer and the B layer with interpositioning of the A layer.

[29] A method for producing a semiconductor light emitting device comprising a semiconductor layer, an A layer, and a B layer, wherein:
the semiconductor light emitting device is configured such that at least a part of emitted light from the semiconductor layer is emitted out of the B layer through the A layer,
the thickness of the A layer is from 1 nm to 200 nm,
the B layer has a first major surface and a second major surface, while the first major surface faces the A layer, and the second major surface has a concave-convex microstructure,
the A layer contains an inorganic substance at 60 mass-% or less on the basis of the total mass of the A layer,
the B layer contains an inorganic substance at 60 mass-% or more on the basis of the total mass of the B layer, and
the content of the inorganic substance present in the A layer is less than the content of the inorganic substance present in the B layer, and wherein:
the method comprises:
forming a laminate comprising the semiconductor layer, and
laminating the optical film according to any one of the modes 13 to 26 on a surface of the laminate at a temperature not lower than the glass transition temperature of the A layer such that the A layer faces the laminate.

[30] The method according to the mode 29, wherein:
the optical film further comprises a protective layer placed to face the A layer with interpositioning of the B layer, and
the method further comprises peeling the protective layer after lamination at a temperature not higher than the glass transition temperature of the A layer.

Effect of Invention

With respect to a semiconductor light emitting device disclosed herein, the adherence between an adherend, which is a component in the light emitting device, and a concave-convex microstructure layer, which is a shape imparting layer, is superior, and therefore a semiconductor light emitting device, which can endure a singulating dicing step, is highly resistant to a high/low thermal cycle, and exhibits a high light extraction efficiency, can be provided.

An optical film disclosed herein exhibits superior adherence between an adherend, which is a component in the light emitting device, and a concave-convex microstructure layer, when used in a semiconductor light emitting device, and therefore contributes to provision of a semiconductor light emitting device exhibiting high durability without deterioration even after long term use. An optical film disclosed herein can exhibit high light resistance and heat resistance, and/or show high transferability of a concave-convex microstructure layer to an adherend by thermal lamination, and/or show high transferability in forming a concave-convex microstructure layer during production of a semiconductor light emitting device, therefore offer an advantage that the process can be curtailed.

BRIEF DESCRIPTION OF THE DRAWINGS

FIG. 7 is pictures depicting examples of sectional SEM images in 3 different visual fields at 100,000× magnification.

FIG. 8 is pictures depicting examples of binarized images of an adhesive layer sandwiched by a substrate and a concave-convex microstructure layer.

FIG. 9 is pictures depicting examples of results of DMT Modulus from cross-sectional SPM observation (QNM mode) in 2 different visual fields.

FIG. 10 is illustrative diagrams depicting an example of a calculation of a porosity of a concave-convex microstructure layer in the 3 visual fields depicted in FIG. 7.

DETAILED DESCRIPTION OF THE INVENTION

Figure 1:
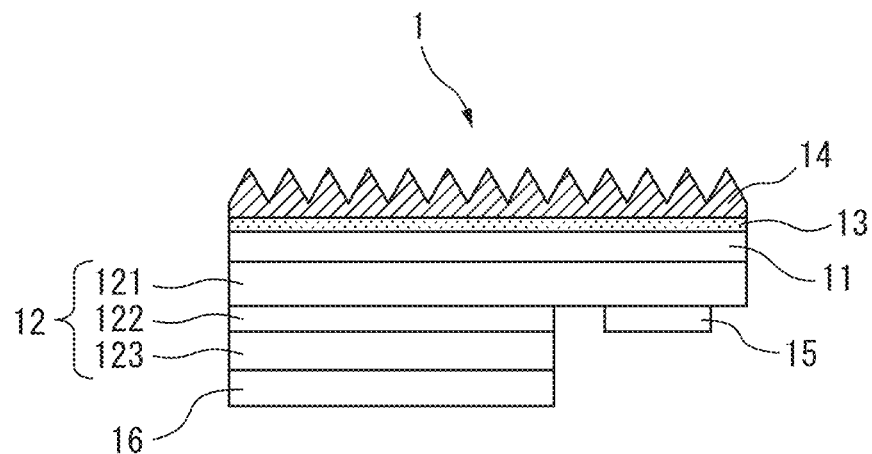
FIG. 1 is a cross-sectional view depicting an example of a semiconductor light emitting device according to an Embodiment of the invention.

An embodiment for implementing the present invention (hereinafter also referred to as "Embodiment") will be described in detail below. The invention will be described in detail below. In this regard, the invention is not limited to the following embodiments, and various alterations may be employed without departing from its spirit and scope.

This disclosure provides mainly a semiconductor light emitting device comprising a specific combination of a concave-convex microstructure layer and an adhesive layer, and an optical film suitable for producing the semiconductor light emitting device.

[Semiconductor Light Emitting Device]

An aspect of the invention provides a semiconductor light emitting device comprising a semiconductor layer, an A layer, and a B layer, wherein:

the semiconductor light emitting device is configured such that at least a part of emitted light from the semiconductor layer is emitted outward from the B layer through the A layer, the thickness of the A layer is from 1 nm to 200 nm, the B layer has a first major surface and a second major surface, while the first major surface faces the A layer and the second major surface has a concave-convex microstructure, the B layer contains an inorganic substance at 60 mass-% or more on the basis of the total mass of the B layer, and the content of an inorganic substance present in the A layer is lower than the content of the inorganic substance present in the B layer.

The A layer is interpositioned between the B layer and the semiconductor layer, and contributes favorable adherence between the B layer and an adherend, which is a component in the semiconductor light emitting device. Since an A layer can have a function to bind components which face each other across the A layer, an A layer may be also referred to herein as an "adhesive layer".

A B layer is a layer having a concave-convex microstructure, and may be also referred to herein as a "concave-convex microstructure layer".

For a semiconductor light emitting device disclosed herein a light extraction method may be selected freely according to a purpose, and it may be a semiconductor light emitting device of an upper surface emission type represented by a face-up type, a semiconductor light emitting device of a lower surface emission type represented by a flip chip type, and a semiconductor light emitting device of a direct-attached type. In an exemplified mode, a semiconductor light emitting device is a LED light emitting device. In an exemplified mode, a semiconductor light emitting device is an organic EL device. As the first to the third Embodiments, preferable examples of different light extraction forms are described, provided that the invention be not limited thereto.

For example, the first Embodiments provides a semiconductor light emitting device comprising a growth substrate, a semiconductor layer on a surface of the growth substrate, an adhesive layer on the other surface of the growth substrate, and a concave-convex microstructure layer bonded to the growth substrate through the adhesive layer. This structure corresponds to a so-called bottom emission type.

(Constitution of Semiconductor Light Emitting Device 1)

FIG. 1 is a cross-sectional view depicting an example of semiconductor light emitting device according to the first Embodiment. Referring to FIG. 1 a flip chip type LED device as the semiconductor light emitting device 1 provided by the present Embodiment includes a growth substrate 11, a semiconductor layer 12 formed on a surface of the growth substrate 11, an adhesive layer 13 as an A layer formed on the other surface of the growth substrate 11, and a concave-convex microstructure layer 14 as a B layer bonded to the growth substrate 11 through the adhesive layer 13. In the exemplified mode, as a semiconductor layer 12 a n-semiconductor layer 121, a light emission layer 122, and a p-semiconductor layer 123 are laminated on the growth substrate 11. On the n-semiconductor layer 121 in a region where the light emission layer 122 and the p-semiconductor layer 123 are removed by etching, a p-electrode 15 is formed, and on the p-semiconductor layer 123 a p-electrode 16 is formed. The semiconductor layer 12 is typically composed of a nitride compound, and more typically a GaN compound.

Further, the second Embodiments provides a semiconductor light emitting device comprising a growth substrate, a semiconductor layer on a surface of the growth substrate, a transparent electroconductive layer on the semiconductor layer, an adhesive layer on the transparent electroconductive layer, and a concave-convex microstructure layer bonded to the transparent electroconductive layer through the adhesive layer. This structure corresponds to a so-called top emission type.

Figure 2:
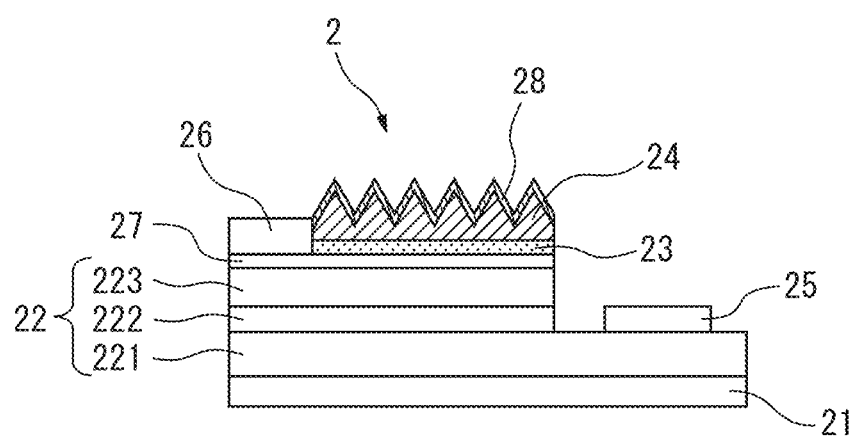
FIG. 2 is a cross-sectional view depicting an example of a semiconductor light emitting device according to an Embodiment of the invention.

FIG. 2 is a cross-sectional view depicting an example of semiconductor light emitting device according to the second Embodiment. A semiconductor light emitting device 2 according to the Embodiment includes a growth substrate 21, and a semiconductor layer 22 formed on a surface of the growth substrate 21. The second Embodiment is different from the first Embodiment in the constitution in which a transparent electroconductive layer 27 (which is a p-side transparent electroconductive layer in FIG. 2) on a semiconductor layer 22 (which includes a n-semiconductor layer 221, a light emission layer 222, and a p-semiconductor layer 223), an adhesive layer 23 as an A layer formed on a surface of the transparent electroconductive layer 27 opposite to the semiconductor layer 22, and a concave-convex microstructure layer 24 as a B layer bonded to the transparent electroconductive layer 27 through the adhesive layer 23 are formed layer by layer. A n-electrode 25 is formed on the n-semiconductor layer 221, and a p-electrode 26 is formed on the p-semiconductor layer 223 with interpositioning of the transparent electroconductive layer 27. In this regard, FIG. 2 depicts an example, in which a light emitting device 2 has further a photocatalytically inactive layer 28 described below.

Further, the third Embodiments provides a semiconductor light emitting device comprising a semiconductor layer, an adhesive layer on the semiconductor layer, and a concave-convex microstructure layer bonded to the semiconductor layer through the adhesive layer.

Figure 3:
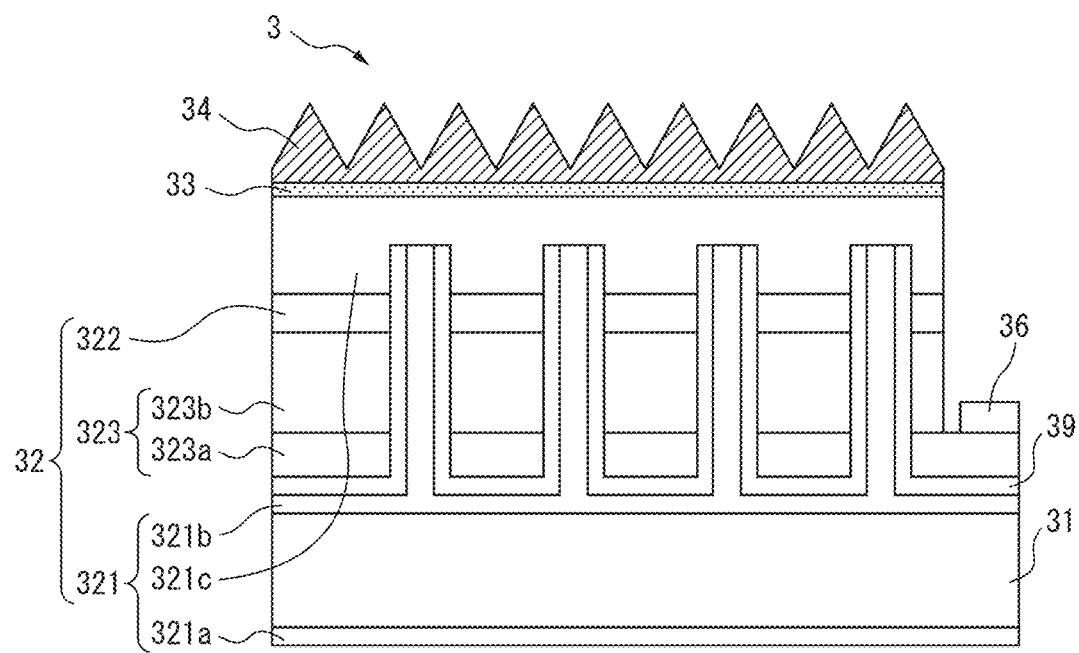
FIG. 3 is a cross-sectional view depicting an example of a semiconductor light emitting device according to an Embodiment of the invention.

FIG. 3 is a cross-sectional view depicting an example of a semiconductor light emitting device according to the third Embodiment. A semiconductor light emitting device 3 according to the Embodiment includes a semiconductor layer 32, an adhesive layer 33 as an A layer, and a concave-convex microstructure layer 34 as a B layer. An n-semiconductor layer 321 includes n-contact layers 321a, 321b, and n-cladding layer 321c. A p-semiconductor layer 323 includes a p-contact layer 323a, and a p-cladding layer 323b. On both sides of an electrically conductive substrate 31 the n-contact layers 321, 321b are formed. On the n-contact layer 321b, the p-contact layer 323a, with interpositioning of the insulation layer 39, the p-cladding layer 323b, a light emission layer 322, the n-cladding layer 321c are formed. On the n-contact layer 321a, a n-electrode (not illustrated) is formed, and on the p-contact layer 323a, a p-electrode 36 is formed. On the n-cladding layer 321c, the adhesive layer 33, and the concave-convex microstructure layer 34 are formed.

In a preferable mode, a part comprising an adhesive layer and a concave-convex microstructure layer in a semiconductor light emitting device may be, but not limited to, an optical film described below that the invention also provides. In a typical mode, features of an adhesive layer and a concave-convex microstructure layer of an optical film are similar to features described below with respect to an adhesive layer and a concave-convex microstructure layer of a semiconductor light emitting device.

Each element will be described below taking a GaN-based semiconductor light emitting device as an example, provided that the invention be not limited thereto.

(Growth Substrate)

As a growth substrate, a semiconductor substrate, such as a gallium nitride including GaN, and silicon carbide; an oxide substrate, such as sapphire, spinel, zinc oxide, and magnesium oxide; silicon; zirconium boride may be used. From a viewpoint of versatility, GaN, silicon carbide, and sapphire are preferable, and from a viewpoint of productivity sapphire is especially preferable.

A surface for forming a semiconductor layer of a growth substrate may be smooth or concave-convex. When concave-convex with a dimension more than the wavelength of light is formed, the angle of the returning light reflected at the bottom side of a light emitting device is changed, and therefore the external quantum efficiency may be enhanced because light beyond a critical angle may be changed to below the critical angle. When concave-convex with a dimension less than the wavelength of light is formed, an effect of enhancement of the internal quantum efficiency may be also obtained, because crystal defects in a semiconductor layer may be reduced.

(Semiconductor Layer)

A semiconductor layer may be formed on a growth substrate with interpositioning of a buffer layer composed of a gallium nitride-based compound semiconductor, or formed directly on the substrate. On a n-semiconductor layer, and a p-semiconductor layer or a transparent electroconductive layer, a n-electrode and a p-electrode are to be placed respectively for connecting a conductor, etc. to establish an electrical connection with the outside system.

A semiconductor layer is constituted with a n-semiconductor layer and a p-semiconductor layer and a light emission layer sandwiched between the two. A n-semiconductor layer is, for example, a laminate of a GaN layer as the first n-type cladding layer and an $In_{0.02}Ga_{0.98}N$ layer as the second n-type cladding layer. The thickness of the n-semiconductor layer is ordinarily approx. 2 μm to 3 μm.

A p-semiconductor layer is, for example, a laminate of an $Al_{0.15}Ga_{0.85}N$ layer as the first p-type cladding layer, an $Al_{0.2}Ga_{0.8}N$ layer as the second p-type cladding layer, and a GaN layer as a p-type contact layer. The thickness of the p-semiconductor layer is ordinarily approx. 200 nm to 300 nm.

Further, a light emission layer is configured, for example, as a multiple quantum well structure (MQW) layering an $In_{0.01}Ga_{0.99}N$ layer as a barrier layer having a broad forbidden band, and an $In_{0.11}Ga_{0.89}N$ layer as a well layer having a narrow forbidden band alternately 3 times regularly one on another. The thickness of the light emission layer is ordinarily approx. 25 nm to 150 nm.

There is no particular restriction on a constitution and a forming method for a semiconductor layer, and prevailing ones for a semiconductor light emitting device may be adopted, and for example a semiconductor layer constituted with a well known nitride compound semiconductor may be formed by a well known method, such as a metal organic chemical vapor deposition method (MOCVD method), a molecular beam epitaxy method (MBE method), a halide vapor phase epitaxy method (HVPE method), a sputtering method, an ion plating method, and an electron shower method. As for the constitution of a semiconductor light emitting device, a homostructure, a heterostructure, or a double heterostructure may be used. Further, a quantum well structure (a single quantum well structure or a multiple quantum well structure) may be adopted. When a GaN crystalline layer is grown on a growth substrate (hereinafter also referred to simply as "substrate"), a known structure or technique for decreasing a dislocation density may be interpositioned between a substrate and a GaN-system crystalline layer. Examples of a crystal growth method include a growth method intercalating a GaN low temperature buffer layer, an epitaxial lateral overgrowth method (ELO method, also called as a selective growth method, etc.) to be performed by attaching a patterned mask on to a substrate surface, and a growth method to be performed by roughening a substrate surface (LEPS method, facet LEPS method).

(Electrode)

On a n-semiconductor layer, and a p-semiconductor layer or a transparent electroconductive layer, a n-electrode and a p-electrode are provided respectively for connecting a conductor, etc. to establish an electrical connection with the outside system.

Although there is no particular restriction on the materials for both the electrodes, a material, which can reflect without a loss light generated by a light emission layer, and establish a favorable ohmic connection with a semiconductor layer, and a p-semiconductor layer or a transparent electroconductive layer, is preferable. Examples of such a material include aluminum (Al), titanium (Ti), nickel (Ni), chromium (Cr), indium (In), tin (Sn), molybdenum (Mo), silver (Ag), gold (Au), niobium (Nb), tantalum (Ta), vanadium (V), platinum (Pt), lead (Pb), beryllium (Be), indium oxide ($In_2O_3$), a gold-silicon alloy (Au—Si alloy), a gold-germanium alloy (Au—Ge alloy), a gold-zinc alloy (Au—Zn alloy), and a gold-beryllium alloy (Au—Be alloy). Further, a plurality of layers composed of materials selected from the above materials may be laminated and used. For both the electrodes, for example, a laminate, for which a gold (Au) layer or the like is laminated on a chromium (Cr) layer, or a titanium (Ti) layer as a base layer, may be used.

(Transparent Electroconductive Layer)

As a transparent electroconductive layer, a metal oxide type, such as indium oxide tin (ITO), tin oxide ($SnO_2$), and zinc oxide (ZnO), is used. Among them especially indium oxide tin (ITO: $In_2O_3$—$SnO_2$) is appropriate, since it exhibits not only a high transmittance with respect to ultraviolet light and blue light, but also establishes a favorable ohmic contact with a p-semiconductor layer as a p-side transparent electroconductive layer.

The thickness of a transparent electroconductive layer is preferably from 50 nm to 500 nm. When the thickness is 50 nm or more, a favorable ohmic contact with a semiconductor layer tends to be established, and when the thickness is 500 nm or less, the light absorption amount in a transparent electroconductive layer tends to be reduced to improve the light extraction efficiency, both of which are preferable.

In the case of the second Embodiment, a semiconductor light emitting device may have a reflection layer at an optional position between a growth substrate 21 and a semiconductor layer 22. Light directed to a growth substrate is reflected by a reflection layer toward a light extracting direction, so that light can be collected effectively in the light extracting direction.

As a reflection layer, for example, a metallic thin film layer, or a distributed Bragg reflectors (DBR), in which a plurality of high refractive index layers, and low refractive index layers are layered, so that an effect of mutual intensification of light reflected at the high refractive index layers and the low refractive index layers by a Bragg reflection due to a light interference effect can be obtained, is preferably used. As the thickness of each high refractive index layer and low refractive index layer and the number of laminated layers, values optimal to the wavelength of light emitted from a light emission layer may be selected.

(A Layer)

A semiconductor light emitting device disclosed herein is provided with an adhesive layer 13, 23, 33 as an A layer. An adhesive layer exhibits merits of being superior in adherence to an adherend (such as a growth substrate, a semiconductor layer, and a transparent electroconductive layer), and a concave-convex microstructure layer, able to endure a dicing step for singulation, and superior in resistance to a high/low thermal cycle. Although the reason behind such merits is not very clear, it is conceivably because the linear expansion coefficient difference between 2 layers constituting an adhesion interface can be reduced, in other words the linear expansion coefficient difference between a concave-convex microstructure layer and adhesive layer, and the linear expansion coefficient difference between a growth substrate, etc. and an adhesive layer can be reduced, and also because surfaces can be strongly wetted owing to an adhesive layer that can be formed so as to have a surface free energy between the surface energy of an adherend and the surface free energy of a concave-convex microstructure layer. Consequently, in a typical case, an adhesive layer and a concave-convex microstructure layer directly contact each other without interpositioning another layer.

An adhesive layer can be formed using an adhesive which can be reacted and cured by heat or light (for example, UV light). As an adhesive an acrylic resin, a methacrylic resin, an epoxy resin, a polythioether resin, a polyimide resin, a silicone resin, etc., which have a heat or light latent curing capacity, may be used.

By using a photo initiator, such as a photo radical initiator, and a photo cation generator, the resin-based adhesives can become adhesive by light exposure, and therefore are superior in terms of productivity.

As a curing catalyst for an adhesive, in addition to a well known acid or base, such as hydrochloric acid, and ammonia, an acid salt, such as a perchlorate, a hydrochloride, a sulfate, and a carboxylate, represented by ammonium perchlorate, ammonium chloride, ammonium sulfate, ammonium nitrate, sodium acetate, etc. as well as a metallic compound, such as a metal salt, zinc, cobalt, tin, titanium, and aluminum may be used.

As a curing catalyst, the variety of curing catalysts may be used singly, or in combination of two or more kinds thereof. The consumption of a curing catalyst is preferably from 0.05 mass-% to 5 mass-% with respect to the solid amount in a liquid containing an adhesive for forming an adhesive layer as a coated film layer.

An adhesive may contain a compound including a functional group, which reacts and cures by heat or light. Examples of the functional group include a unsaturated bond group, such as an acrylic group, a methacrylic group, and a styryl group, a ring-opening polymerizing group, such as an epoxy group, and an oxetane group, and a hydrogen-bonding functional group. Therefore, the reaction may be a hydrosilylation reaction, an ene-thiol reaction, a Huisgen reaction, etc. A compound having a hydrogen-bonding functional group is preferable as the adhesive. When such a compound is combined with a substrate having a hydroxy group (for example, sapphire, or ITO), and a concave-convex microstructure layer having a hydroxy group, preferably the compound can form hydrogen bonds with hydroxy groups of the growth substrate and the concave-convex microstructure layer, so as to favorably bond the growth substrate with the concave-convex microstructure layer tightly.

Therefore, it is preferable that both a growth substrate and a concave-convex microstructure layer have a hydroxy group, and an adhesive layer contains a compound having a functional group, which can form a hydrogen bond.

Examples of a functional group, which can form a hydrogen bond, include a hydroxy group, a thiol group (substituted or not-substituted), an amido group, an amino group, a carbonyl group, and a hydrogen atom directly bonded to a silicon atom. From a viewpoint of adhesive strength a hydroxy group, an amino group, an amido group, and a hydrogen atom directly bonded to a silicon atom are preferable, and among them, from a viewpoint of weather resistance a hydroxy group, and a hydrogen atom directly bonded to a silicon atom are more preferable. Since a hydrogen atom directly bonded to a silicon atom, and a hydroxy group can form a metal oxide bond by a reaction with a hydroxy group of a growth substrate surface or a concave-convex microstructure layer in addition to a hydrogen bond, an improvement effect of the adherence becomes more significant, therefore they are especially preferable.

Examples of a preferable compound to be contained in an adhesive include a tetra-functional alkoxy silane, such as tetraethoxysilane and tetramethoxysilane; and a silicate derived therefrom by a hydrolysis or a condensation reaction; a silane coupling agent, such as vinyltrimethoxysilane, vinyltriethoxysilane, 2-(3,4-epoxycyclohexyl)ethyl trimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryl trimethoxysilane, 3-methacryloxypropylmethyl dimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propyl amine, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatopropyltriethoxysilane, and an oligomer derived from the silane coupling agent by a hydrolysis or a condensation reaction; an organic titanium compound and a condensation product thereof, such as tetraisopropyl titanate, tetra-n-butyl titanate, a butyl titanate dimer, tetraoctyl titanate, titanium diisopropoxy bis(acetylacetonate), titanium tetraacetylacetonate, titanium ethyl acetoacetate, titanium 2-ethylhexoxy-bis(2-ethyl-3-hydroxyhexoxide), titanium diisopropoxy-bis(ethyl acetate), titanium lactate ammonium salt, titanium lactate, titanium triethanol aminate, titanium ethyl aminate, titanium ethylaminoethanolate, titanium isostearate, and titanium diisopropoxy-bis(ethyl acetoacetate); and an organic zirconium compound and a condensation product thereof, such as n-propyl zirconate, n-butyl zirconate, zirconium tetraacetylacetonate, and zirconium monoacetylacetonate. The above may be used singly or in combination of plural kinds thereof. Among others, from a viewpoint of reactivity, preferable examples include a tetrafunctional alkoxysilane, such as tetraethoxysilane, and tetramethoxysilane; or an alkoxy silane having a N atom, such as 3-aminopropyltrimethoxysilane, 3-aminopropyltriethoxysilane, 3-triethoxysilyl-N-(1,3-dimethyl-butylidene) propylamine, N-phenyl-3-aminopropyltrimethoxysilane, N-(vinylbenzyl)-2-aminoethyl-3-aminopropyltrimethoxysilane hydrochloride, and 3-ureidopropyltriethoxysilane.

A growth substrate is composed of the above material, namely an inorganic material. In a mode, as an adhesive for forming an adhesive layer, in order to bond well a growth substrate, etc., for example, sapphire or ITO, with a concave-convex microstructure layer, a metallic compound adhesive may be used. A metallic compound adhesive is preferable also from a viewpoint of weather resistance. A metallic compound adhesive means herein an adhesive containing a metallic compound. Examples of a metallic compound adhesive include an adhesive containing, for example, the silane compound, etc. as a matrix component, and additionally a metallic compound.

The content of an inorganic substance present in an adhesive layer is less than the content of an inorganic substance present in a concave-convex microstructure layer. Although an adhesive layer may contain an inorganic particle, it should preferably contain substantially no inorganic particle. Examples of an inorganic particle, which an adhesive layer may contain, include a metal nitride such as silicon nitride, and a metal oxide, such as barium titanate, ITO, and silica. The average primary particle diameter of an inorganic particle is from a viewpoint of superior transparency when dispersed in a resin or a metallic compound acting as a dispersing medium preferably 100 nm or less, more preferably 60 nm or less, further preferably 50 nm or less, further preferably 40 nm or less, and still further preferably 30 nm or less. The average primary particle diameter is a value measured by the method described herein at the Example section, or a method which is deemed equivalent thereto by a person skilled in the art.

In a preferable mode, an adhesive layer contains an inorganic substance preferably at 60 mass-% or less on the basis of the total mass of the adhesive layer, and more preferably at 40 mass-% or less. The low content of an inorganic substance in an adhesive layer is advantageous from a viewpoint of attainment of favorable flexibility and adhesiveness of an adhesive layer. For example, when an adhesive layer is formed by coating, etc. on an adherend in a semiconductor light emitting device, the content of an inorganic substance in an adhesive layer may be relatively high. In this case the content of an inorganic substance may be preferably 90 mass-% or less, and more preferably 80 mass-% or less. Meanwhile, in a case in which an optical film described below is to be formed, when the content of an inorganic substance in an adhesive layer is excessive, production of an optical film may become difficult, or the adhesive property of an adhesive layer may become poor. The content of an inorganic substance in an adhesive layer of an optical film is 60 mass-% or less on the basis of the total mass of the adhesive layer, preferably 40 mass-% or less, and more preferably 30 mass-% or less. Although there is no particular restriction on the lower limit of the content of an inorganic substance present in an adhesive layer, it may be preferably 1 mass-% or more, and more preferably 10 mass-% or more.

In a typical mode, an adhesive layer contains a matrix which is one or more to be selected from the group consisting of a resin and a metal oxide, and does not contain an inorganic particle or contains an inorganic particle dispersed in the matrix preferably at a content less than 30 mass-% on the basis of the total mass of the adhesive layer, and more preferably at a content less than 10 mass-%.

The thickness of an adhesive layer is preferably not more than ½ of the wavelength of light emitted from a light emission layer in order to prevent light scattering by an adhesive layer and to extract the light effectively, and more preferably not more than ¼ of the wavelength in order to reduce light scattering further. From this viewpoint, the thickness of an adhesive layer is from 1 nm to 200 nm. The thickness is preferably from 3 nm to 150 nm, more preferably from 5 nm to 125 nm, and further preferably from 5 nm to 100 nm. An adhesive layer with such a thickness is preferable, because it can change its form conforming to the concave-convex of a surface of an adherend (for example, a substrate, and a concave-convex microstructure layer). Meanwhile, from a viewpoint of achieving both improvement of light extraction efficiency and improvement of high/low thermal cycle resistance, the thickness of an adhesive layer is preferably from 1 nm to 100 nm. The thickness is a value measured by the method described herein at the Example section using a scanning electron microscope, or a method which is deemed equivalent thereto by a person skilled in the art.

In a preferable mode, the refractive index of an adhesive layer is less than the refractive index of a concave-convex microstructure layer. An adhesive layer is preferably composed of a material which is more flexible than a concave-convex microstructure layer. The fact that the refractive index of an adhesive layer is less than the refractive index of a concave-convex microstructure layer corresponds generally to that the adhesive layer is composed of a relatively flexible material. A flexible adhesive layer contributes to superior adherence between an adherend and a concave-convex microstructure layer.

The refractive index of an adhesive layer is preferably 1.9 or less, more preferably 1.7 or less, and further preferably 1.6 or less; and is preferably 1.3 or more, more preferably 1.35 or more, and further preferably 1.4 or more. The refractive index is herein a value measured by an ellipsometer.

In a preferable mode, the elastic modulus of an adhesive layer, when an elastic modulus is measured based on a sectional elastic modulus profile of a semiconductor light emitting device using an atomic force microscope, is less than the elastic modulus of a concave-convex microstructure layer. This means the adhesive layer is more flexible than the concave-convex microstructure layer. A flexible adhesive layer contributes to favorable adherence between an adherend and a concave-convex microstructure layer. The elastic modulus is a value measured by the method using an atomic force microscope described herein at the Example section, or a method which is deemed equivalent thereto by a person skilled in the art.

The elastic modulus of an adhesive layer is from viewpoints of adhesive property and high/low thermal cycle resistance preferably 0.9-fold or less, more preferably 0.8-fold or less, and further preferably 0.7-fold or less relative to the elastic modulus of a concave-convex microstructure layer. The elastic moduli of an adhesive layer and a concave-convex microstructure layer can be measured by forming respective films and by using an indentation method.

An adhesive layer has preferably a glass transition temperature, since the transferability at thermal lamination can be enhanced. A glass transition temperature is preferably a temperature of 10° C. or higher, from a viewpoint of decrease in the Young's modulus above a glass transition temperature more preferably 15° C. or higher, and from a viewpoint of a sticking property further preferably 20° C. or higher. From a viewpoint of production, a glass transition temperature is preferably 200° C. or lower, more preferably 160° C. or lower, and further preferably 140° C. or lower. A glass transition temperature is calculated from a peak temperature of a loss factor tan δ, which is the ratio of a storage elastic modulus G' to a loss elastic modulus G" measured by a dynamic viscoelasticity measuring apparatus.

In a preferable mode, the storage elastic modulus of an adhesive layer at a temperature higher than the glass transition temperature of an adhesive layer by 20° C. (herein also referred to as "glass transition temperature+20° C.") is 10 MPa or less. In a preferable mode, the ratio of the storage elastic modulus of an adhesive layer at a temperature lower than the glass transition temperature of an adhesive layer by 20° C. (herein also referred to as "glass transition temperature−20° C.") to the storage elastic modulus of the adhesive layer at a glass transition temperature+20° C. [(the storage elastic modulus of the adhesive layer at a glass transition temperature−20° C.)/(the storage elastic modulus of the adhesive layer at a glass transition temperature+20° C.)] is from 3 to 600.

When the storage elastic modulus G' above a glass transition temperature decreases, a resin becomes softer, so that an adhesive layer can fill gaps and adhere more easily to a base during thermal lamination. Therefore, the storage elastic modulus at a glass transition temperature+20° C. is preferably 10 MPa or less, from a viewpoint of increase in adhesive strength owing to an anchoring effect derived from the surface conformity more preferably 5 MPa or less, and from a viewpoint of reduction of transfer defect further preferably 3 MPa or less. The storage elastic modulus is from a viewpoint of shape stability during execution of thermal lamination preferably 0.1 MPa or more, more preferably 0.5 MPa or more, and further preferably 1 MPa or more.

On the other hand, when the storage elastic modulus G' below a glass transition temperature increases, a resin becomes harder, a protective layer can be peeled more easily after thermal lamination, and a concave-convex microstructure layer can adhere more easily to an adherend to increase the reliability for bonding significantly. Therefore, the storage elastic modulus at a glass transition temperature−20° C. is preferably 10 MPa or more, from a viewpoint of higher adhesive strength between a concave-convex microstructure layer and an adherend more preferably 20 MPa or more, and from viewpoints of disappearance of tackiness and improvement of handling property further preferably 30 MPa or more. From a viewpoint of flexibility, the storage elastic modulus is preferably 5,000 MPa or less, more preferably 2,000 MPa or less, and further preferably 1,000 MPa or less.

The ratio of storage elastic modulus at −20° C. and +20° C. with respect to the glass transition temperature as the reference [(the storage elastic modulus of the adhesive layer at the glass transition temperature−20° C.)/(the storage elastic modulus of the adhesive layer at the glass transition temperature+20° C.)] is preferably from 3 to 600 from a viewpoint of reduction of a not-transferred part of a pattern of a concave-convex microstructure layer, when an optical film comprising an adhesive layer and a concave-convex microstructure layer is combined with an adherend by thermal lamination and thereafter a protective layer is peeled, more preferably the ratio of the storage elastic modulus at the glass transition temperature−20° C. to the storage elastic modulus at the glass transition temperature+ 20° C. is from 10 to 550 from a viewpoint of higher adherence between a concave-convex microstructure layer and an adherend, and further preferably 15 or more from a viewpoint of the strength of an adhesive layer. Further, the ratio is preferably 500 or less from a viewpoint of resistance to cracking of an adhesive layer.

A storage elastic modulus can be decreased freely by adding a plasticizer, etc., or reducing the molecular weight of a resin, and increased freely by increasing the molecular weight of a resin or the crosslink density of a resin constituting an adhesive layer. As the adhesive, an organic silicone is preferable, and especially a phenyl silicone is more preferable. Further, some acrylic adhesives can be used favorably by adjusting the composition or the molecular weight.

(B Layer)

A concave-convex microstructure layer as a B layer has the first major surface and the second major surface, wherein the first major surface faces an adhesive layer, and the second major surface has a concave-convex microstructure.

In a mode disclosed herein a concave-convex microstructure layer contains an inorganic substance at 60 mass-% or more on the basis of the total mass of the concave-convex microstructure layer. Such a concave-convex microstructure layer is advantageous from a viewpoint of formation of a concave-convex microstructure layer having a refractive index equivalent to a growth substrate. In a typical mode, a concave-convex microstructure layer contains an inorganic particle. In a preferable mode, a concave-convex microstructure layer contains a matrix, which is one or more selected from the group consisting of a resin and a metal oxide. In a preferable mode, a concave-convex microstructure layer contains an inorganic particle dispersed in the matrix at 30 mass-% or more on the basis of the total mass of the concave-convex microstructure layer.

The content of an inorganic substance in a concave-convex microstructure layer is especially from a viewpoint of heat resistance 60 mass-% or more, preferably 70 mass-% or more, and more preferably 80 mass-% or more. The content of an inorganic substance may be even 100 mass-%.

The terms "high refractive index", and "high refraction" mean herein that a refractive index measured by an ellipsometer is 1.60 or more.

The term "nanoparticle" means herein a particle with an average primary particle diameter of 100 nm or less.

An inorganic particle is typically a nanoparticle, and more typically a high refractive index nanoparticle.

An inorganic substance, or an inorganic particle may contain one or more kinds selected from a metal nitride such as silicon nitride, a metal oxide, barium titanate, ITO, etc. The refractive index of an inorganic substance, or an inorganic particle is preferably 1.60 or more. In a preferable mode, an inorganic particle is a metal oxide particle with a refractive index of 1.60 or more.

As the metal oxide, from a viewpoint of achievement of a preferable refractive index, a metal oxide containing 1, or 2 or more kinds to be selected from the group consisting of Zr, Ti, Sn, Ce, Ta, Nb, Zn, Ba, and Sr.

From viewpoints of refractive index, availability, and economic efficiency, an inorganic substance, or an inorganic particle contains especially preferably 1, or 2 or more kinds to be selected from the group consisting of titanium oxide, zirconium oxide, barium titanate, and ITO.

The average primary particle diameter of an inorganic particle is preferably 100 nm or less from viewpoints that a quantum effect depending on a size is significant, and that the transparency is superior when dispersed in a resin, namely a dispersing medium, more preferably 60 nm or less, further preferably 50 nm or less, still further preferably 40 nm or less, and still further preferably 30 nm or less. Meanwhile, the average primary particle diameter is preferably 5 nm or more from viewpoints of securance of dispersibility and transparency, more preferably 10 nm or more, and further preferably 20 nm or more. An average primary particle diameter means herein a number average value. The average primary particle diameter is a number average value of 50 particles measured by the method using a scanning electron microscope described herein at the Example section, or a method which is deemed equivalent thereto by a person skilled in the art.

As a resin contained in a matrix of a concave-convex microstructure layer, for example, 1, or 2 or more kinds to be selected from the group consisting of a silicone resin, an epoxy resin, a polyimide resin, and an acrylic resin, as well as a resin obtained by modifying the same, may be used.

Meanwhile, a mode, in which a concave-convex microstructure layer contains 1 or more materials to be selected from a high refractive index inorganic material, and a translucent high refractive index material such as an organic resin including an atom having a high atomic refraction or molecular refraction, is also disclosed herein. Such a material is also advantageous from a viewpoint of formation of a concave-convex microstructure layer having a refractive index equivalent to a growth substrate. Such concave-convex microstructure layer may be used in place of the aforedescribed concave-convex microstructure layer.

Examples of the high refractive index inorganic material include a semiconductor, such as gallium nitride for example GaN, and silicon carbide; a metal oxide, such as sapphire, spinel, zinc oxide, magnesium oxide, titanium oxide, zirconium oxide, tantalum oxide, and niobium oxide; and a high refractive index inorganic material equivalent to a growth substrate 11, such as barium titanate, strontium titanate, and zirconium boride. Especially from a viewpoint of a handling property, a concave-convex microstructure layer includes preferably a skeleton composed of a metal oxide. That fact that a skeleton composed of a metal oxide is included means herein that a bond of metal atom-oxygen atom-metal atom is included.

Examples of an organic resin including an atom having a high atomic refraction or a molecular refraction include a resin having an atom, such as sulfur, and selenium, and an organic resin having in the skeleton an aromatic ring such as a benzene ring, and a heterocyclic ring such as a triazine skeleton. By introduction of a heat-reactive or light-reactive functional group, such as an unsaturated bond group or a thiol group, into the resin, a pattern can be easily transferred from a concave-convex mold to form a concave-convex microstructure layer.

As a metal oxide that a matrix of a concave-convex microstructure layer contains, 1, or 2 or more kinds to be selected from the group consisting of a silicate, a silicate oligomer, a titania sol, and a zirconia sol may be used.

The content of an inorganic particle, preferably the content of a metal oxide, in a concave-convex microstructure layer is preferably 30 mass-% or more especially from a viewpoint of heat resistance, more preferably 50 mass-% or more, and further preferably 70 mass-% or more. There is no particular restriction on the upper limit of the content, and it may as high as 100 mass-%. The inorganic particle should preferably have a refractive index similar to the outermost surface of a light emitting device to be bonded together.

A concave-convex microstructure layer has as a microstructure typically a large number of projections. With respect to each projection the top and the bottom can be demarcated. As for the dimension of a microstructure, the width of a microstructure (typically, the width of the bottom of the projection) is preferably approximately the same as or less than the effective wavelength of a semiconductor light emitting device (especially a p-semiconductor layer), and the height of a microstructure (typically the height from the bottom to the top of the projection) is preferably approximately the same as or more than the effective wavelength of a semiconductor light emitting device (especially a p-semiconductor layer). In this case, at an interface between a semiconductor light emitting device and a surrounding sealing component, the refractive index difference between the two sides is mitigated so as to suppress reflection of light and to obtain favorably a light scattering effect. As the result, a larger portion of light that exceeds a critical angle, totally reflects at an interface between a semiconductor light emitting device and a surrounding sealing component, and is confined inside a transparent layer or a semiconductor layer, when there exists no concave-convex microstructure, can now hits the interface within the critical angle due to change in the light travelling direction, and therefore the light extraction amount is improved.

Especially, the height of a microstructure in a concave-convex microstructure layer is preferably from 300 nm to 1,500 nm, more preferably from 330 nm to 1,300 nm, and further preferably from 350 nm to 1,200 nm. When the height of a microstructure is 300 nm or more, it is advantageous from a viewpoint of a light scattering effect. When the height is 1,500 nm or less, it is advantageous from a viewpoint of productivity.

The width of a microstructure is preferably from 100 nm to 2,000 nm, more preferably from 200 nm to 1,500 nm, and further preferably from 250 nm to 1,400 nm. When the width of a microstructure is 100 nm or more, it is advantageous from a viewpoint of a light extraction property. When the width is 2,000 nm or less, it is advantageous from viewpoints of yield and productivity.

The thickness of a concave-convex microstructure layer is preferably from 1 nm to 2,000 nm, more preferably from 3 nm to 1,800 nm, and further preferably from 5 nm to 1,500 nm. When the thickness is 1 nm or more, it is advantageous from a viewpoint of adherence with a growth substrate. When the thickness is 2,000 nm or less, it is advantageous from a viewpoint of crack resistance. The thickness of a concave-convex microstructure layer means herein a thickness at a recess of a concave-convex microstructure layer (typically a thickness under the bottom of the projection).

The height and width of a microstructure in a concave-convex microstructure layer as well as the thickness of a concave-convex microstructure layer are values respectively measured by the method using a scanning electron microscope described herein at the Example section, or a method which is deemed equivalent thereto by a person skilled in the art.

As for the refractive index of a concave-convex microstructure layer, a refractive index closer to that of a growth substrate is preferable, and is preferably 1.60 or more from a viewpoint of light extraction efficiency, and further preferably 1.70 or more. The refractive index is from a viewpoint of the transparency of a concave-convex microstructure layer preferably 2.0 or less, and further preferably 1.95 or less.

In a preferable mode the porosity of a concave-convex microstructure layer attributable to voids with a major diameter of 50 nm or less present in a concave-convex microstructure layer (hereinafter also referred to simply as "porosity") is 5% or less, and more preferably 1% or less. A concave-convex microstructure layer with a low content of voids with a major diameter of 50 nm or less contributes to a favorable light extraction efficiency of a semiconductor light emitting device. Although there is possibility that a concave-convex microstructure layer contains a void with a major diameter exceeding 50 nm, in a preferable mode a concave-convex microstructure layer has substantially no void with a major diameter exceeding 50 nm. Meanwhile, when the porosity is 0.1% or more, favorable flexibility is imparted to a concave-convex microstructure layer, so that production of a semiconductor light emitting device becomes easier, and therefore it is preferable. The porosity is more preferably 0.2% or more. The major diameter of a void and the porosity are values measured by the method described herein at the Example section, or a method which is deemed equivalent thereto by a person skilled in the art.

(C layer)

In a preferable mode, a semiconductor light emitting device further comprises a C layer either or both of: on the second major surface of a concave-convex microstructure layer; and between an adhesive layer and a concave-convex microstructure layer. A C layer is typically a photocatalytically inactive layer. In other words, when a semiconductor light emitting device contains a component having photocatalytic activity such as titanium oxide in a concave-convex microstructure layer, it is preferable that a photocatalytically inactive layer 28 is formed as a C layer, for example, as depicted in FIG. 2 directly on a concave-convex microstructure layer 24 (namely, on a surface of a concave-convex microstructure layer 24 opposite to the surface on which an adhesive layer 23 is formed), or between the concave-convex microstructure layer 24 and the adhesive layer 23, or at both locations. When a photocatalytically inactive layer is formed, a sealing material and/or an adhesive layer can be protected from degradation by a photocatalytic action, so that a semiconductor light emitting device with superior light resistance can be produced.

From viewpoints of a function for preventing a photocatalytic action at an interface with a sealing material and/or an adhesive layer, and additionally a light transmission capacity, a photocatalytically inactive layer is preferably composed of a translucent material having a transmittance of 80% or more in a wavelength range of from 300 to 550 nm. The transmittance can be confirmed with visible-ultraviolet spectrometry.

For a photocatalytically inactive layer, either of an insulative transparent film or an electrically conductive transparent film may be used.

For an insulative transparent film to be used as a photocatalytically inactive layer, various insulative substances may be used, and preferable examples thereof include silicon oxide (for example, $SiO_2$), aluminum oxide (for example, $Al_2O_3$), zirconium oxide, hafnium oxide (for example, $HfO_2$), niobium oxide (for example, $Nb_2O_5$), tantalum oxide (for example, $Ta_2O_5$), silicon nitride (for example, $Si_3N_4$), and aluminum nitride (for example, AlN). Use of $SiO_2$, or $Al_2O_3$ is more preferable, since vapor deposition by sputtering is easy.

When $SiO_2$ is deposited as a film by CVD, TEOS (tetraethoxysilane), TMS (trimethoxysilane), $SiH_4$, etc. may be used as a source material. Meanwhile, when $Al_2O_3$ is deposited as a film by CVD, TMA (trimethylaluminum), DMA (dimethylaluminum), alkoxy compounds (isopropoxydimethylaluminum, sec-butoxydimethylaluminum, isopropoxydiethylaluminum, tert-butoxydimethylaluminum, etc.) may be used as a source material.

For an electrically conductive transparent film to be used as a photocatalytically inactive layer various substances having electrical conductivity may be used, and use of ITO ($In_2O_3$—$SnO_2$), AZO (ZnO—$Al_2O_3$), IZO ($In_2O_3$—ZnO), GZO (ZnO—$Ga_2O_3$), etc. is preferable.

Among others, a photocatalytically inactive layer composed of at least one kind of material to be selected from the group consisting of silicon oxide, aluminum oxide, zirconium oxide, silicon nitride, aluminum nitride, ITO ($In_2O_3$—$SnO_2$), and AZO (ZnO—$Al_2O_3$) is more preferable from a viewpoint of versatility.

Since the refractive indices of ITO and IZO are 1.9, and the refractive indices of AZO and GZO are 2.1, they are advantageous for improving the light extraction efficiency.

For depositing a photocatalytically inactive layer as a film, a known depositing method, such as a sputtering method, a CVD method, and a SOG method, may be applied.

Although there is no particular restriction on the film thickness of a photocatalytically inactive layer, a range of from 1 nm to 150 nm is preferable. From a viewpoint of a photocatalyst inhibitory effect, the film thickness is preferably 1 nm or more, more preferably 2 nm or more, and further preferably 3 nm or more; and the film thickness is preferably 150 nm or less from a viewpoint of light extraction efficiency, and especially from a viewpoint of productivity further preferably 100 nm or less. The film thickness is a value measured with a cross-sectional SEM. In this regard, when a photocatalytically inactive layer is formed on the second major surface of a concave-convex microstructure layer (namely, a surface with a concave-convex microstructure), the film thickness is an average value of the thickness of thinnest part and the thickness of thickest part of the layer in a visual field.

(Sealing Material)

In a preferable mode, a semiconductor light emitting device may further include a sealing material. A sealing material may be placed in contact with a concave-convex microstructure layer. A material for a sealing material may be the same as a sealing material generally used for a LED, and examples thereof include an epoxy resin, and a silicone resin. A sealing material may be a mold, which has been used for forming a concave-convex microstructure layer, and not removed and retained there even after formation of the concave-convex microstructure layer. Further, in a specific mode, in which an optical film described below includes a mold as a protective layer, the protective layer can function as a sealing material for a semiconductor light emitting device. The mold and the protective layer will be described in detail below.

[Optical Film]

Another aspect of the invention provides:

an optical film for being stuck on at least a part of a light emitting surface of a semiconductor light emitting device, wherein:

the optical film comprises an A layer and a B layer, the thickness of the A layer is from 1 nm to 200 nm, the B layer has a first major surface and a second major surface, while the first major surface faces the A layer, and the second major surface has a concave-convex microstructure, the A layer contains an inorganic substance at 60 mass-% or less on the basis of the total mass of the A layer, the B layer contains an inorganic substance at 60 mass-% or more on the basis of the total mass of the B layer, and the content of the inorganic substance present in the A layer is less than the content of the inorganic substance present in the B layer. In this regard, a "light emitting surface" means a surface of the semiconductor light emitting device, from which at least a part of emitted light from the semiconductor layer is emitted outward.

Figure 4:
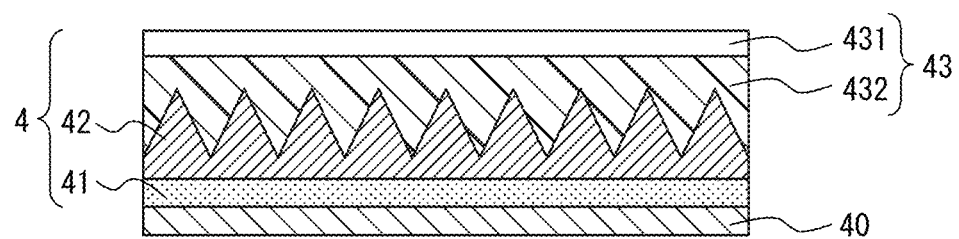
FIG. 4 is a cross-sectional view depicting an example of an optical film according to an Embodiment of the invention.

Referring to FIG. 4, an optical film 4 includes an adhesive layer 41 as an A layer and a concave-convex microstructure layer 42 as a B layer. In an exemplified mode an optical film 4 may further include a protective layer 43 described below. A protective layer 43 may include a base film 431 and a resin mold layer 432. The optical film 4 will be stuck to an adherend 40.

In a typical mode, an optical film 4 is stuck to a desired site on a semiconductor light emitting device with an adhesive layer 41, so that the film exists on at least a part of a light emitting surface of a semiconductor light emitting device. A component working as an adherend 40 in a semiconductor light emitting device is optional depending on the constitution of a semiconductor light emitting device, and it is for example a growth substrate, a semiconductor layer, and a transparent electroconductive layer. Examples of a material for the adherend include sapphire, silicon, GaN, and silicon carbide, and from a viewpoint of versatility preferable examples are ITO, and sapphire.

(Adhesive Layer and Concave-Convex Microstructure Layer)

Since an adhesive layer and a concave-convex microstructure layer of an optical film may have the same characteristics as described above with respect to an adhesive layer and a concave-convex microstructure layer of a semiconductor light emitting device, the descriptions of such characteristics will not be reiterated here.

From viewpoints of easy production of an optical film and an adhesive property of an adhesive layer, the content of an inorganic substance present in an adhesive layer is 60 mass-% or less on the basis of the total mass of the adhesive layer, preferably 40 mass-% or less, and more preferably 30 mass-% or less.

In a preferable mode, the surface roughness of a surface, which faces an adhesive layer, of a layer adjacent to the adhesive layer (namely, the first major surface of a concave-convex microstructure layer, and a surface provided with an adhesive layer of a component of a semiconductor light emitting device) is two-thirds or less of the thickness of the adhesive layer. Although the flatness of a surface can be evaluated by a 10-point average roughness Rz, an arithmetic average roughness Ra, or a maximum roughness height Ry, a surface roughness means herein a 10-point average roughness Rz of an adherend surface. Rz means herein a value calculated by the method described at the Example section.

The surface roughness is preferably two-thirds or less of the thickness of an adhesive layer, more preferably one-half or less of the thickness of an adhesive layer, and further preferably one-fifths or less of the thickness of an adhesive layer. Meanwhile, the surface roughness is preferably 1 nm or more. When the surface roughness is two-thirds or less of the thickness of an adhesive layer, it is advantageous from a viewpoint of adhesiveness of ITO, sapphire, etc. to a substrate. Meanwhile, when the surface roughness is 1 nm or more, it is advantageous from a viewpoint of adhesiveness of an adhesive layer with a concave-convex microstructure layer owing to an anchoring effect.

A surface roughness is a value measured by the method using an atomic force microscope described herein at the Example section, or a method which is deemed equivalent thereto by a person skilled in the art. A value of an 10-point average roughness Rz can be also calculated by using an image photographed with a scanning electron microscope, and deducting an average value of 5 sites where the first major surface of a concave-convex microstructure layer is closest from a bonded surface with an adherend, from an average value of 5 sites where the first major surface of a concave-convex microstructure layer is farthest from a bonded surface with an adherend.

(Protective Layer)

Referring to FIG. 4, an optical film 4 may further includes a protective layer 43 for protecting a concave-convex microstructure layer. A protective layer may be a mold having a concave-convex microstructure which conforms to (namely being complementary to) a concave-convex microstructure of a concave-convex microstructure layer.

As the mold, a metallic mold, a glass mold, a resin mold, etc. may be used. From viewpoints of cost, productivity, and mold releasability, especially a method using a resin mold is preferable. In this regard, a resin mold may be designed appropriately corresponding to a material to be used, and examples thereof include a film composed of a single composition, wherein the film itself has a concave-convex profile, and one constituted with a base layer and a resin mold layer, which is formed on the base layer and has a concave-convex microstructure.

A base layer may be, for example, a flat base film. As a material for a base film, a transparent film, such as PET, TAC, COP, and PEN, may be used. From viewpoints of cost and productivity, PET and TAC are more preferable.

The thickness of a base film is preferably from 30 μm to 500 μm, and from viewpoints of versatility and superior windability to a roll more preferably from 50 μm to 300 μm.

Although there is no particular restriction on a resin for forming a resin mold layer, a resin curable by heat or light is preferable, and from a viewpoint of productivity a resin curable by exposure to light is more preferable. Examples of a resin curable by light include an acrylic resin, an epoxy resin, and a silicone resin. A resin for forming a resin mold layer more preferably contains an atom, such as a Si atom and a F atom. Such a resin is advantageous in that a resin mold layer has superior mold releasability from a concave-convex microstructure layer after a process in which a resin mold layer is stuck to a material for a concave-convex microstructure layer, and a concave-convex microstructure of the resin mold layer is transferred to the material to form a concave-convex microstructure layer.

In a mode in which a sheet-formed concave-convex microstructure layer is formed with a mold, it is advantageous when a mold is composed of a material also usable as a sealing material for LED, such as an epoxy resin and a silicone resin. Because in this case an optical sheet comprising a concave-convex microstructure layer and a sealing material mold can be formed simultaneously with production of a concave-convex microstructure layer, and therefore it becomes possible to shorten a sealing step.

[Production of Optical Film]

A concave-convex microstructure layer on which a desired concave-convex microstructure is formed may be produced by various methods according to a material used. For example, a concave-convex microstructure layer containing an inorganic particle can be formed by: (1) a method, by which a flat film is formed from a molding material containing a material for a matrix and an inorganic particle, and then the flat film is etched, (2) a method comprising forming a coated film of an uncured dispersion (for example, a composition containing a resin or a metal oxide precursor, and an inorganic particle), and thereafter (i) transferring a concave-convex structure to the coated film using a mold and then drying the coated film, or (ii) casting and curing the uncured dispersion in a mold by light or heat, or (3) a method, by which a molding material containing a material for a matrix and an inorganic particle is shaped by press processing, injection molding, etc. The molding material may further contain a diluent such as a solvent.

As a solvent, any solvents conventionally known may be used. Examples thereof include water, an alcohol, an ester, a ketone, an ether, an aliphatic hydrocarbon compound, an aromatic hydrocarbon compound, and an amide compound.

Examples of the alcohol include a monohydric alcohol, such as methyl alcohol, ethyl alcohol, propyl alcohol, and butyl alcohol; a polyhydric alcohol, such as ethylene glycol, diethylene glycol, propylene glycol, glycerine, trimethylolpropane, and hexanetriol; and a monoether of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, and propylene glycol monobutyl ether.

Examples of the ester include methyl acetate, ethyl acetate, butyl acetate, and γ-butyrolactone. Examples of the ketone include acetone, methyl ethyl ketone, and methyl isoamyl ketone.

Examples of the ether include, in addition to the monoether of a polyhydric alcohol, a polyhydric alcohol ether prepared by alkyl-etherifying all of the hydroxy groups of a polyhydric alcohol, such as ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dibutyl ether, diethylene glycol dimethyl ether, diethylene glycol methyl ethyl ether, and diethylene glycol diethyl ether; tetrahydrofuran; 1,4-dioxane; and anisole.

Examples of the aliphatic hydrocarbon compound include hexane, heptane, octane, nonane, and decane.

Examples of the aromatic hydrocarbon compound include benzene, toluene, and xylene.

Examples of the amide compound include dimethylformamide, dimethylacetamide, and methylpyrrolidone.

Among the solvents, an alcohol, such as methanol, ethanol, isopropanol, and butanol; a ketone, such as acetone, methyl ethyl ketone, and methyl isobutyl ketone: an ether, such as ethylene glycol monomethyl ether, diethylene glycol monobutyl ether, propylene glycol monomethyl ether, and propylene glycol monoethyl ether; and an amide compound, such as dimethylformamide, dimethylacetamide, and N-methylpyrrolidone, are preferable, because they are miscible well with water.

The solvents may be used singly or in combination of a plurality of solvents.

The flat film may be formed, for example, by a well known method, such as a metal organic chemical vapor deposition method (MOCVD method), a molecular beam epitaxy method (MBE method), a halide vapor phase epitaxy method (HVPE method), a sputtering method, an ion plating method, and an electron shower method.

An Embodiment hereof relates especially to the method (2). In other word, an Embodiment hereof provides a method for producing an optical film as described above, which comprises:

forming the concave-convex microstructure layer using a resin mold layer having a concave-convex microstructure, by transferring, or casting and curing, and coating the adhesive layer on to the first major surface of the concave-convex microstructure layer.

In the method (2), the precursor can function as a dispersing medium for an inorganic particle. Examples of the precursor include a low-molecular-weight compound as a metal oxide precursor (for example, silicate), an oligomer (for example, silicate oligomer), a titania sol, a zirconia sol, a silicone resin, an epoxy resin, a polyimide resin, an acrylic resin. The resins may have been modified. From a viewpoint of developability by light exposure, a combination of a photo initiator and a resin having a light reactive functional group (such as a modified silicone resin, a modified epoxy resin, a modified polyimide resin, and an acrylic resin) is preferable. From a viewpoint of versatility, a modified silicone resin, a metal oxide precursor, and an acrylic resin are preferable, from a viewpoint of weather resistance, a modified silicone resin, and a metal oxide precursor are desirable, and from a viewpoint of strength, a metal oxide precursor that is vitrified by curing is more preferable.

Examples of a silicone resin include KR-282, KR-311, KR-211, KR-216, KR213, KR9218, KR5206, ES-1001N, ES-1002T, ES-1023, KR5230, KR5235, KR-400, KR-401, KR-251, KE3423, KE1842, KF-96L, KF-96A, KF-96H, KF-96, ASP-2010-A/B, KER-6110-A/B, ASP-1050P-AB, ASP-1120-A/B, SCR-1011-A/B, SCR-1012-A/B-R, SCR-1016-A/B, SCR-1018A (S2)/B, FER-7061-A/B, FER-7110-A/B, KER-2500-A/B, KER-2500N-A/B, KER-2910-A/B, KER-6000-A/B, KER-6150-A/B, KER-6200-A/B, KER-6075-F, KER-6020-F, KER-6230-F, KER-3000-M2, KER-3200-T7, X-32-2551, SMP-2840, KER-2000-DAM, KER-2020-DAM, KER-4130M-UV, KER-4130H-UV, KER- 4000-UV, SMP-7004, X-32-3300-A/B (the above are produced by Shin-Etsu Silicone); AMS-1203, AMS-132, AMS-152, AMS-162, AMS-163, AMS-191, AMS-2202, AMS-233, AMS-242, ATM-1112, ATM-1322, ATM-1322M50, CMS-222, CMS-626, CMS-832, DBE-C25, DBE-U12, DBE-U22, DBL-C31, DBL-C32, DBP-C22, DBP-V052, DBP-V102, DCE-V7512, DGM-000, DMS-A11, DMS-A12, DMS-A15, DMS-A21, DMS-A211, DMS-A214, DMS-A31, DMS-A32, DMS-A32R, DMS-A35, DMS-B12, DMS-B25, DMS-B31, DMS-C15, DMS-C16, DMS-C21, DMS-C23, DMS-CA21, DMS-D33, DMS-E09, DMS-E11, DMS-E12, DMS-E21, DMS-EC13, DMS-EC17, DMS-EX21, DMS-H03, DMS-H11, DMS-H21, DMS-H25DMS-H31, DMS-H41, DMS-HV15, DMS-HV22, DMS-Hm15, DMS-Hm25, DMS-K05, DMS-K13, DMS-K26, DMS-L21, DMS-LP21, DMS-N05, DMS-N12, DMS-NB32, DMS-R05, DMS-R22, DMS-R31, DMS-S12, DMS-S14, DMS-S15, DMS-S21, DMS-S27, DMS-S31, DMS-S32, DMS-S33, DMS-S33M50, DMS-S35, DMS-S42, DMS-S45, DMS-S51, DMS-SM21DMS-U21, DMS-V00, DMS-V03, DMS-V05, DMS-V21, DMS-V22, DMS-V25, DMS-V25R, DMS-V31, DMS-V31S15, DMS-V33, DMS-V35, DMS-V35R, DMS-V41, DMS-V42, DMS-V46, DMS-V51, DMS-V52, DMS-Vm31, DMS-Vm35, DMS-XE11DMS-XM11, DMS-XT11, DMS-Z21, EBP-234, ECMS-127, ECMS-227, ECMS-327, ECMS-92, EDV-2022, EMS-622, FMS-9921, FMS-9922, FMS-K11, FMV-4035, FMV-4042, HAM-301, HAM-3012, HDP-111, HES-992, HMS-013, HMS-031, HMS-053, HMS-064, HMS-071, HMS-082, HMS-151, HMS-301, HMS-501, HMS-991, HMS-992, HMS-993, HMS-H271, HMS-HM271, HPM-502, HQM-105, HQM-107, LMS-152, MCR-A11, MCR-A12, MCR-B12, MCR-C12, MCR-C18, MCR-C22, MCR-C61, MCR-C62, MCR-E11, MCR-E21, MCR-H07, MCR-H11, MCR-H21, MCR-M07, MCR-M11, MCR-M17, MCR-M22, MCR-V21, MCR-V41, MCS-C13, MCS-E15, MCS-M11, MCS-MX11, MCS-V212, MCS-VX15, MCT-EP13, MFR-M15, MFS-M15, MTV-112, PDS-0338, PDS-1615, PDV-0325, PDV-0331, PDV-0341, PDV-0346, PDV-0525, PDV-0535, PDV-0541, PDV-1625, PDV-1631, PDV-1635, PDV-1641, PDV-2331, PDV-2335, PMM-HV12, PMS-E11, PMS-E15, PMS-H03, PMS-H11, PMV-9925, PSI-021, PSI-026, PSIPO-019, PSITI-019, PSN-2M01, PSN-2M02, PSN-2M11, PSS-1C01, PSS-1H01, PSS-1K02, PSS-1M01, PSS-1P01, PSS-1P11, PVV-3522, RMS-033, RMS-044, RMS-083, RTT-1011, SLT-3A101, SLT-3A302, SLT-3A802, SMS-022, SMS-042, SMS-142, SMS-992, SQD-255, SQO-299, SQS-261, SQT-221, SSP-040, SSP-050, SSP-055, SSP-056, SSP-058, SSP-060, SSP-065, SSP-070, SSP-080, SSP-085, SSP-255, SST-3M01, SST-3M02, SST-3MH1.1, SST-3P01, SST-3PM1, SST-3PM2, SST-3PM4, SST-3PP1, SST-3PV1, SST-3Q01, SST-3R01, SST-A8C42, SST-BAE1.2, SST-BBE1.2, SST-BCE1.2, SST-H8C42, SST-H8H01, SST-H8HS8, SST-R8C42, UBS-0541, UBS-0822, UCS-052, UMS-182, UMS-992, UTT-1012, VAT-4326, VDH-422, VDS-1013, VDT-123, VDT-127, VDT-131, VDT-163, VDT-431, VDT-5035, VDT-731, VDT-954, VDV-0131, VEE-005, VGF-991, VGM-021, VGP-061, VMM-010, VMS-005, VMS-T11, VPE-005, VPT-1323, VQM-135, VQM-146, VQX-221, VTT-106, WSA-7011, WSA-7021, WSA-9911, WSAF-1511, WSAV-6511, and XMS-5025.2 (the above are produced by Gelest Inc.). The resins may be used singly, or in combination of 2 or more kinds thereof.

Although the content of an inorganic particle in the dispersion cannot be decided uniformly, because the refractive index varies depending on the type of an inorganic particle and a dispersing medium to be used, it is preferable to adjust the type of an inorganic particle and a dispersing medium, and the content of an inorganic particle, so that the refractive index of a concave-convex microstructure layer can be regulated within a range of from 1.6 to 2.0. By regulating as above the type of an inorganic particle and a dispersing medium (for example, a resin), and the content of an inorganic particle, total reflection at an interface between a light emission region and a light transmission region of a light emitting device may be mitigated, so that the light extraction efficiency of a light emitting device can be improved significantly.

A leveling agent may be added to the dispersion so as to make the surface smooth. Although there is no particular restriction on a leveling agent, preferably one having a composition soluble in the dispersing medium should be selected. From a viewpoint of refractive index, the addition amount with respect to the total solid content in a dispersion is preferably from 0.05 mass-% to 2 mass-%.

A method using a mold is preferable from a viewpoint of productivity. For coating an uncured dispersion by this method, a spin coater, a bar coater, a capillary coater, a R & R coater, a slot die coater, a lip coater, a comma coater, a gravure coater, or the like may be used. From viewpoints of productivity and film thickness regulation, coating with a gravure coater is preferable.

An adhesive layer may be formed on the first major surface of a concave-convex microstructure layer by a method by which an adhesive layer is directly coated on a concave-convex microstructure layer, or a method by which an adhesive layer coated in advance on a base is combined with a concave-convex microstructure layer. For coating an adhesive layer a spin coater, a bar coater, a capillary coater, a R & R coater, a slot die coater, a lip coater, a comma coater, a gravure coater, or the like may be used. From viewpoints of productivity and film thickness regulation, coating with a gravure coater, a capillary coater, or a lip coater is preferable.

For regulating the thickness of an adhesive layer, an adhesive as a material for an adhesive layer may be used in a state diluted with a solvent, or used without dilution. When diluted with a solvent, there is no particular restriction on the amount of a solvent to be used, insofar as adhesion is not impaired. For convenience of regulation of the film thickness, the content of a solvent with respect to the total liquid is preferably from 3 mass-% to 98 mass-%, and more preferably from 5 mass-% to 95 mass-%.

When an adhesive layer is directly coated on a concave-convex microstructure layer, a surface of a concave-convex microstructure layer may be surface-treated in advance with ozone, plasma, corona, etc. in order to enhance the wettability with an adhesive.

When an adhesive layer is formed singly on a base by coating, there is no particular restriction on a base to be used, however from a viewpoint of convenience of film formation use of a base with little surface ruggedness is preferable. Further from a viewpoint of peelability of an adhesive layer from a base after bonding of an adhesive layer and a concave-convex microstructure layer, a base which surface is subjected to a release treatment is preferable.

[Production of Semiconductor Light Emitting Device]

A mode of a method for producing the semiconductor light emitting device described hereinabove includes:

forming a laminate comprising the semiconductor layer, and forming on a surface of the laminate the adhesive layer and the concave-convex microstructure layer with interpositioning of the adhesive layer.

A mode of a method for producing the semiconductor light emitting device described herein includes:

forming a laminate comprising the semiconductor layer, and laminating the optical film hereof on a surface of the laminate at a temperature not lower than the glass transition temperature of the adhesive layer such that the adhesive layer faces the laminate. In this mode an optical film may further include a protective layer placed facing an adhesive layer and with interpositioning of a concave-convex microstructure layer. In this case, there may be peeling off a protective layer at a temperature not higher than the glass transition temperature of an adhesive layer after lamination, or the protective layer may be not peeled and retained as a sealing material for a semiconductor light emitting device.

Figure 5:
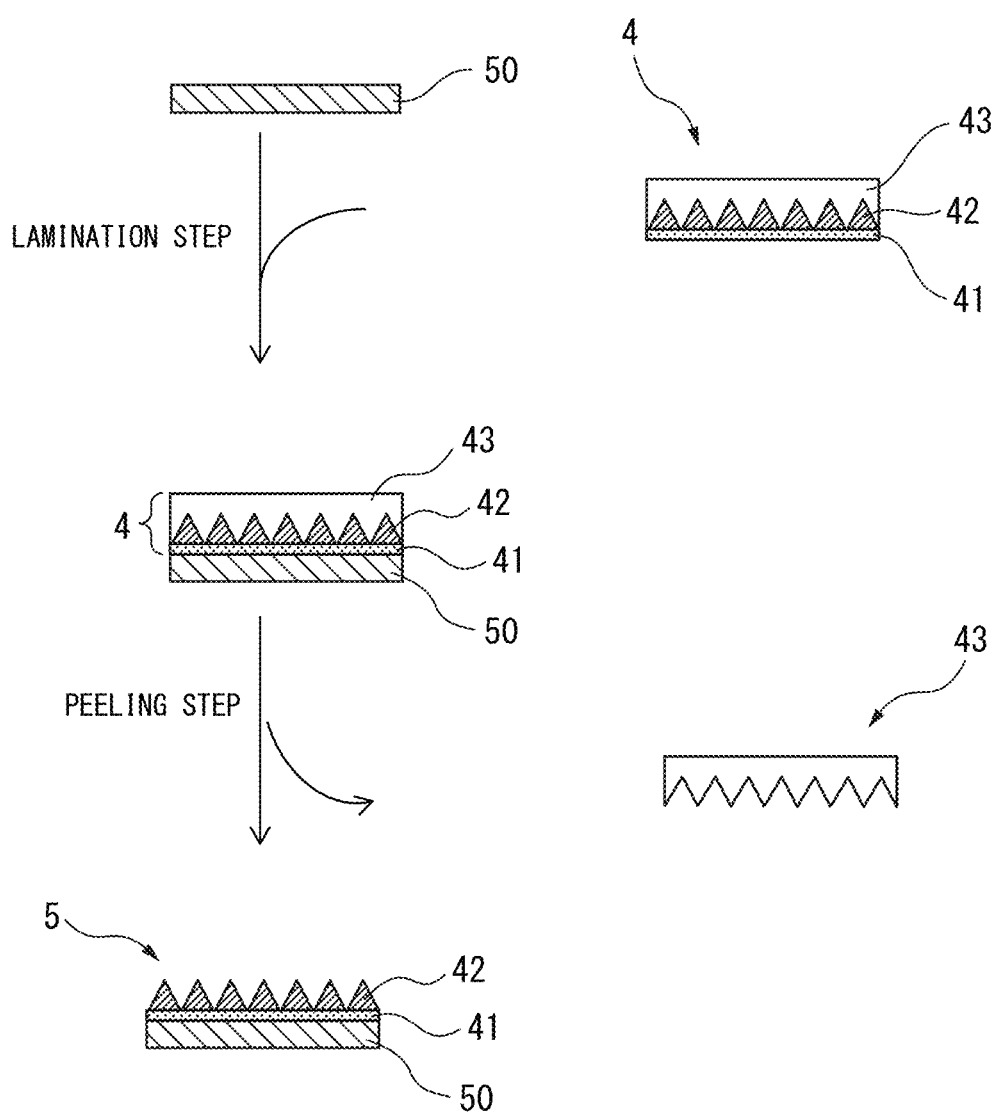
FIG. 5 is an illustrative diagram depicting an example of a method for producing a semiconductor light emitting device according to an Embodiment of the invention.

FIG. 5 is an illustrative diagram depicting an example of a method for producing a semiconductor light emitting device according to an Embodiment of the invention. Referring to FIG. 5, a method for producing a semiconductor light emitting device may include laminating an optical film 4 on a laminate 50 (namely, a lamination step), and then peeling off a protective layer 43 (namely, a peeling step). In this way a light emitter 5 having an adhesive layer and a concave-convex microstructure layer on a laminate can be formed, and further a semiconductor light emitting device comprising such a light emitter may be produced.

In an Embodiment, a method for producing a semiconductor light emitting device may include forming a semiconductor layer on a surface of a growth substrate, and forming a concave-convex microstructure layer on the other surface of the growth substrate with interpositioning of an adhesive layer.

In another Embodiment, a method for producing a semiconductor light emitting device may include forming a laminate having a growth substrate, a semiconductor layer on a surface of the growth substrate, and a transparent electroconductive layer formed on the semiconductor layer, and forming a concave-convex microstructure layer on a surface opposite to a surface, which is in contact with the semiconductor layer, of the transparent electroconductive layer in the laminate with interpositioning of an adhesive layer.

In another Embodiment, a method for producing a semiconductor light emitting device may also include forming a semiconductor layer, and forming a concave-convex microstructure layer on a surface of the semiconductor layer with interpositioning of an adhesive layer.

Referring to FIG. 1, an example method for producing a semiconductor light emitting device 1 will be described below by way of an example in which a semiconductor light emitting device is a GaN LED device.

Firstly, a wafer-form sapphire substrate is prepared as a growth substrate 11. Next, an AlN buffer layer is formed on a surface of the growth substrate 11. A laminate is formed by layering a n-GaN layer as a n-semiconductor layer 121, a light emission layer 122, and a p-GaN layer as a p-semiconductor layer 123 successively on the AlN buffer layer, and then an exposed region of the n-GaN layer is formed by removing a partial region by etching through the p-GaN layer to the n-GaN layer. An n-electrode 15 is formed on the n-GaN layer exposed by etching, and a p-electrode 16 is formed on the p-GaN layer. After forming the electrodes, and separating each individual LED device by a dicer, an insulation film (not illustrated in FIG. 1) is formed on a surface excluding the electrodes. In this regard, separation of individual LED devices may be also performed by a method other than cutting by a dicer, for example, by scribing.

An adhesive layer may be formed at any stage during production of a device corresponding to the constitution of the device. Therefore, examples of an adherend for an adhesive layer include a transparent electroconductive layer such as ITO, and a growth substrate, such as sapphire, silicon, GaN, and silicon carbide. Typically, an adherend is ITO or sapphire. An adhesive layer may be incorporated in a form of the optical film into a semiconductor light emitting device by dry lamination, or an adhesive layer may be formed singly on an adherend of a semiconductor light emitting device by wet-lamination (namely, coating) or by dry lamination. From a viewpoint of a shorter combining time, dry lamination is preferable. As a method for forming an adhesive layer on an adherend, the same method as used for forming an adhesive layer on a base, described above with respect to production of an optical film may be used.

When an adhesive as a material for an adhesive layer contains a solid resin having a glass transition temperature, the adhesive is laminated on an adherend under a condition with heat and pressure, and then a concave-convex microstructure layer may be additionally laminated, or an optical film may be laminated on an adherend under a condition with heat and pressure. Although lamination may be performed also in the air, from a viewpoint of mitigation of decrease in the yield of a laminate due to mixing of air it is more preferable to conduct lamination in a vacuum using a vacuum lamination machine. In this regard, an adhesive layer may be post-baked after formation.

A lamination temperature (especially the temperature of an adhesive layer during lamination) is preferably not less than the glass transition temperature of an adhesive layer, more preferably not less than the glass transition temperature+10° C., because an adhesive layer becomes softer to improve a sticking property, and further preferably a temperature not less than the glass transition temperature+20° C. from a viewpoint of gap filling ability with respect to a surface with a larger surface roughness. Although there is no particular restriction on the upper limit of a temperature during sticking, 220° C. or less is preferable from a viewpoint of the durability of an optical film, and 200° C. or less is more preferable from a viewpoint of productivity.

There is no particular restriction on the lamination pressure, and it is preferably 0.1 bar or more from a viewpoint of avoidance of floating an optical film and prevention of mixing of air, and preferably 10 bar or less from a viewpoint of prevention of breakage of a component of a semiconductor light emitting device. From a viewpoint of improvement of a shape conforming property of an optical film with respect to an adherend, the lamination pressure is more preferably 0.2 bar or more, and more preferably 9 bar or less from a viewpoint of prevention of breakage of the structure of a concave-convex microstructure layer.

The lamination time is preferably 1 sec or more from a viewpoint of decreasing a transfer defect, and preferably 3 min or less from a viewpoint of productivity. It is more preferably 3 sec or more for maintaining the temperature in transferring constant, and especially preferably 2 min or less for improving the productivity.

When an optical film comprising a protective layer having a resin mold layer and an adhesive layer having a glass transition temperature is used, the lamination temperature is ordinarily higher than the glass transition temperature of an adhesive layer. In this case, although there is no particular restriction on the time required for the adhesive layer temperature to return after lamination to the glass transition temperature or less, it is preferably 5 sec or more from a viewpoint that the temperature of a resin mold layer becomes constant and breakage of a concave-convex microstructure by peeling is prevented, and preferably 10 min or less from a viewpoint of productivity. From a viewpoint of suppression of cracking due to a thermal shock in an adhesive layer and a concave-convex microstructure layer, it is more preferably 10 sec or more, and more preferably 8 min or less for maintaining the temperature in peeling a resin mold layer constant.

Peeling of a protective layer may be automated using a peeling apparatus, etc., or may be performed manually. Although the peeling angle with respect to a protective layer may be optional, it is preferably 30° or more with respect to the in-plane direction of a concave-convex microstructure layer (especially first major surface) for the sake of suppression of an influence from the side of a protective layer and reduction of adherence between a protective layer and a concave-convex microstructure layer, and peeling at 150° or less is preferable for the sake of prevention of breakage due to overload on to a concave-convex microstructure.

[Use of Semiconductor Light Emitting Device]

A semiconductor light emitting device can be formed as above. For example, for forming a LED lamp using a LED device as a semiconductor light emitting device, firstly a LED device is mounted on a ceramic substrate provided with a wiring pattern, for example, in the case of a semiconductor light emitting device of the first Embodiment through a Au bump, or in the case of a semiconductor light emitting device of the second Embodiment through a Au wire. Next, the LED device structure is sealed with a sealing material seamlessly to a package. The sealing material may be a protective layer of an optical film as described above.

Referring further to FIG. 1, when the wiring pattern of a LED lamp is connected with a power source unit (not illustrated) and energized, a voltage is applied through the wiring pattern to a n-electrode 15 and a p-electrode 16 in a forward direction, so that a recombination between a hole and an electron carrier takes place in a light emission layer 122 and light emission occurs. Out of blue light originated from the emission, such blue light as irradiated from the light emission layer 122 to the direction of a concave-convex microstructure layer 14 enters a sealing material through the concave-convex microstructure layer 14, and radiates from the sealing material outward.

Blue light irradiated from a light emission layer 122 toward a p-GaN layer is reflected at a p-electrode 16 and directed toward a concave-convex microstructure layer 14. In this case light within a range defined by a critical angle of a concave-convex microstructure layer 14 passes through the concave-convex microstructure layer 14 and radiates outward from a LED device.

Light arrived at a concave-convex microstructure layer 14 radiates outward at a high efficiency. Namely, in this case the difference in refractive index at an interface between the upper and lower layers is mitigated and reflection of light is suppressed, and further an effect of light scattering can be obtained. As the result, a larger portion of light that exceeds a critical angle, totally reflects at an interface and is confined inside a transparent layer or a semiconductor layer, when there exists no concave-convex microstructure, can now hits the interface within the critical angle due to change in the light travelling direction, and therefore the light extraction amount is improved.

A semiconductor light emitting device, and a semiconductor package disclosed herein can be applied to an illumination apparatus. An illumination apparatus is typically provided with a semiconductor light emitting device disclosed herein, and at least either of a fluorescent body or a phosphorescent body that radiates light upon receipt of emitted light from the semiconductor light emitting device. By this constitution, an illumination apparatus enabling high brightness and illuminance can be obtained.

The illumination apparatus may include a semiconductor light emitting device disclosed herein and a transparent resin covering or encapsulating the same. In a typical mode, the transparent resin contains a fluorescent body or a phosphorescent body. Ultraviolet to near-ultraviolet light of a semiconductor light emitting device can be converted to white light, etc. by the fluorescent body or the phosphorescent body. Further, for enhancing the light condensing capacity, a light reflection component such as a concave mirror may be provided on a transparent resin. Such an illumination apparatus requires a lower power consumption than a conventional fluorescent lamp, and is smaller sized, and therefore is effective as a small-sized high brightness illumination apparatus.

EXAMPLES

The Embodiment will be described specifically by way of Examples below, provided that the Embodiment be not limited thereto.

<Evaluation of Characteristics>

Each semiconductor light emitting device and optical film produced in each Example was evaluated by the following apparatus and methods. Each measurement was conducted, unless otherwise specified, at a room temperature of 23° C. and a humidity of 50% RH, and in an atmosphere of 1 atm.

(1) Measurements of Thickness of Adhesive Layer, and Roughness of Interface Between Concave-Convex Microstructure Layer and Adhesive Layer A sample, in which a cross-section is cut by dicing, was fixed on a workbench, and a cross-section perpendicular to a substrate surface was subjected to a BIB (Broad Ion Beam) processing and then observed with a SEM. The conditions of the BIB processing and the SEM observation are shown below.

BIB processing condition:
Apparatus used: E-3500 (produced by Hitachi High-Technologies Corp.)
Ion species: Ar+
Acceleration voltage: 4 kV
SEM observation condition
Apparatus used: S-4800 (produced by Hitachi High-Technologies Corp.)
Acceleration voltage: 1 kV
Detection mode: secondary electron
Detection information: shape From an image obtained by an cross-sectional SEM observation (100,000-fold magnified image, visual field width: approx. 1.27 [µm]≈1,278 [pixel]×0.9921875 [nm/pixel]), an adhesive layer sandwiched by a substrate and a concave-convex microstructure layer was extracted. An interface between a substrate and an adhesive layer was extracted manually utilizing a dark contrast of the adhesive layer in the obtained image. With respect to extraction of an interface between an adhesive layer and a concave-convex microstructure layer was extracted, an adhesive layer was extracted as an image utilizing a dark contrast of the adhesive layer in the obtained image, and by conducting a binarization processing by an image analysis software. A part, which a binarization processing could not cover, was complemented by manual judgment. The thickness of an adhesive layer was determined from an obtained extracted image of an adhesive layer and a pixel number of the image, and the average value and the standard deviation were calculated. Further, from the thickness information, an arithmetic average roughness (Ra), a maximum roughness height (Ry), and a 10-point average roughness (Rz) at an interface of a concave-convex microstructure layer and an adhesive layer were calculated by a method according to JIS B 0601 (1994), and the ratio of the arithmetic average roughness of an interface to the thickness of an adhesive layer was calculated. The roughness of an interface corresponds to the roughness of a surface, which faces an adhesive layer, of a concave-convex microstructure layer, which is a layer adjacent to the adhesive layer. The above operations were conducted in 3 visual fields depicted in FIG. 7 (A) to (C), and a number average value was calculated.

FIG. 7 is pictures depicting examples of sectional SEM images in 3 different visual fields at 100,000× magnification.

FIG. 8 is pictures depicting examples of binarized images of an adhesive layer sandwiched by a substrate and a concave-convex microstructure layer. In this regard, the images depicted in FIGS. 7 to 10 are for a model sample having a concave-convex microstructure layer formed using NRC3132P (a propylene glycol monomethyl ether solution with a solid concentration of 20 mass-% comprising titanium oxide, produced by Nagase ChemteX Corporation), and an adhesive layer formed using a 10 mass-% solution of SCR-1011 (produced by Shin-Etsu Silicone) in propylene glycol monomethyl ether 2-acetate (PGMEA).

TABLE 1

Thickness of adhesive layer, and Ra, Ry, and Rz calculated from FIG. 8

|  | Thickness of adhesive layer (nm) | Standard deviation (%) | Ra (nm) | Ry (nm) | Rz (nm) |
| --- | --- | --- | --- | --- | --- |
| Visual field 1 (FIG. 7 (A)) | 59.0 | 7.7 | 4.54 | 24.80 | 23.81 |
| Visual field 2 (FIG. 7 (B)) | 58.6 | 7.7 | 4.75 | 32.74 | 31.15 |
| Visual field 3 (FIG. 7 (C)) | 54.4 | 7.4 | 3.92 | 32.74 | 30.56 |

The ratio of the 10-point average surface roughness (Rz) of an interface to the thickness of an adhesive layer not less than 2/3 was denoted as D, less than 2/3 and not less than 0.55 was denoted as C, less than 0.55 and more than 0.25 was denoted as B, and less than 0.25 was denoted as A. In this regard, a film thickness described below is the obtained number average value of 3 visual fields rounded to a nearest multiple of 5 nm. For example, when a digit x on the order of 1 nm of the number average value was 0, 1, or 2, the digit x was rounded to 0, when the digit was 3, 4, 5, 6, or 7, the digit x was rounded to 5, and when the digit was 8, or 9, the digit on the order of 10 nm was added by 1 and the digit x on the order of 1 nm was subtracted to 0.

(2) Particle Diameter of Inorganic Particle

From an image (image magnified 100,000-fold, detection mode: secondary electron image with energy filter function) obtained by a cross-sectional SEM observation in "(9) measurement of porosity attributable to voids with major diameter of 50 nm or less" described below, 50 inorganic particles were specified, and the average primary particle diameter was determined. An averaged value of 3 visual fields was calculated to obtain the average primary particle diameter.

(3) Content of Inorganic Substance

A powder sample (approx. 10 mg) of an A layer or a B layer shaved off from a semiconductor light emitting device or an optical film was dried in the atmosphere at 100° C., then cooled down to room temperature, and weighed accurately. Thereafter, an organic component was removed by heating in the atmosphere at 900° C. for 1 hour, and the residue was weighed. The value of (sample mass after heating)/(sample mass before heating) was obtained as the content of an inorganic substance.

Figure 6:
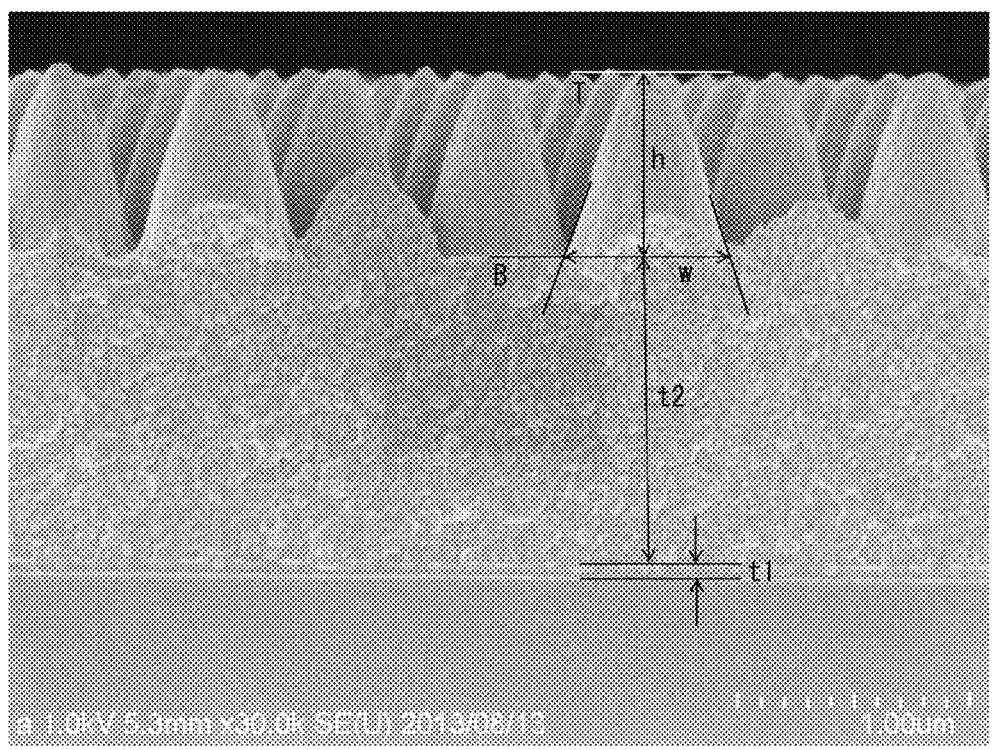
FIG. 6 is an illustrative diagram depicting a method for measuring the height and width of a microstructure in a concave-convex microstructure layer.

(3) Height of Concave-Convex Microstructure in Concave-Convex Microstructure Layer A diced chip was bonded to a 1 inch SEM stage using a carbon paste, subjected to osmium vapor deposition, and observed at 50,000× with a FE-SEM (Field Emission Scanning Electron Microscope, SU-8010, produced by Hitachi High-Technologies Corp.) to investigate the height and width of a microstructure of a concave-convex microstructure layer, the thickness of a concave-convex microstructure layer, and the thickness of an adhesive layer. In the electron microscopic image, as depicted in FIG. 6, the bottom B and the top T of a projection as a concave-convex microstructure were demarcated, and the height h of a microstructure was measured. Also the width w of a projection as a concave-convex microstructure, and the thickness t2 of a concave-convex microstructure layer were respectively demarcate and measured.

(4) Surface Roughness

A surface of a prepared concave-convex imparting sheet was measured with an AFM (VN-8000, produced by Keyence Corporation), and a 10-point average surface roughness Rz was determined using an attached analysis software (VN-HIV8). Measurement conditions were:
observation visual field of 20 μm×20 μm, and scanning rate of 0.45 s/line.

(5) Refractive Index

As the refractive index values for a concave-convex microstructure layer and an adhesive layer, values were obtained by measuring an inorganic particle dispersion used as a material for a concave-convex microstructure layer and an adhesive layer in each Example, as well as a concave-convex microstructure layer and an adhesive layer sampled from a semiconductor light emitting device, by the following method.

Examples 1A to 35A, Examples 1A' to 12A', and Examples 1B to 7B

A PDMS (polydimethylsiloxane) resin (KE106, produced by Shin-Etsu Chemical Co., Ltd.) was coated on a smooth glass plate having received a release treatment, heated at 120° C. for 1 min, released from the glass plate, and thereafter heated at 150° C. for 30 min to cure completely the PDMS to form a flat plate mold (50 mm).

An inorganic particle dispersion as a material for a concave-convex microstructure layer was dropped on to a silicon wafer, to which the flat plate mold was layered, left standing in an environment of a temperature of 23° C. and a humidity of 50% RH for 20 min, and then after removing the flat plate mold left standing under the same conditions for 24 hours. The product was cured optionally by heating at 120° C. for 1 min, or by exposing to light at 1,000 mJ/cm$^2$, or by conducting both. A material for an adhesive was spin-coated on a silicon wafer, heated at 120° C. for 1 min to obtain a thin film. A refractive index was measured with respect to a thin film thus formed by an automated ellipsometer (DVA-36LA, produced by Mizojiri Optical Co., Ltd.) at a wavelength of 589 nm.

Meanwhile the refractive indices of a powder of a concave-convex microstructure layer and a powder of an adhesive layer (approx. 10 mg) obtained by shaving respectively a concave-convex microstructure layer and an adhesive layer of a semiconductor light emitting device were measured using a refractive index contact liquid (produced by Shimadzu Corporation). A liquid with a refractive index less than 1.50 was denoted as X, the same more than 1.50 and less than 1.60 was denoted as Y, the same not less than 1.60 and less than 1.65 was denoted as Z1, and the same not less than 1.65 was denoted as Z2.

Examples 1C to 7C

A resin to form a concave-convex microstructure layer, or a resin to form an adhesive layer was coated with a spin coater on a silicon wafer to a thickness of 100 nm, heated at 120° C. for 1 min, and cured by exposing to light at 1,000 mJ/cm$^2$. The refractive index was measured by an automated ellipsometer (DVA-36LA, produced by Mizojiri Optical Co., Ltd) at a wavelength of 589 nm.

(7) Glass Transition Temperature

A glass transition temperature was defined as a peak temperature of a loss factor tan δ, which is the ratio of a storage elastic modulus G' to a loss elastic modulus G'' measured by a dynamic viscoelasticity measuring apparatus.

(8) Elastic Modulus of Adhesive Layer

A sample, in which a cross-section was cut by dicing, was fixed on a workbench, and subjected to the BIB (Broad Ion Beam) processing to prepare an observation sample. An elastic modulus profile measurement was conducted with an atomic force microscope (scanning probe microscope (SPM)) under the following conditions. The spring constant of a probe was calculated by the Sander method. With respect to values used for the calculation, catalog values were used for the length and thickness of a cantilever, and actual values found on the apparatus were used for the resonance frequency and Q value. The tip diameter of an explorer was measured by a tip check sample attached to the apparatus, and therefrom a tip curvature radius R was calculated using a tip checking function of the analysis software Nanoscope Analysis.

SPM observation conditions:
Apparatus used: DIMENSION ICON, produced by Bruker AXS GmbH
Measurement mode: QNM (Quantitative Nanomechanical Mapping Mode)
Probe: RTESPA type (k=40 N/m, R=10 nm)
FIG. 9 is pictures depicting examples of results of DMT Modulus from cross-sectional SPM observation (QNM mode) in 2 different visual fields. A sample exhibiting a magnitude relationship between elastic moduli of concave-convex microstructure layer>adhesive layer was rated as OK, and other samples were rated as NG. It has been known that an absolute value of a measured value of elastic modulus to be obtained by a QNM mode of an atomic force microscope may be changed in some cases by a calibration of a cantilever, or an adjustment of a measurement condition. However, with respect to a magnitude relationship of measured values of elastic moduli, whether or not sapphire substrate>adhesive layer, or concave-convex microstructure layer>adhesive layer was very obvious from FIG. 9.

(9) Measurement of Porosity Attributable to Voids with Major Diameter of 50 nm or Less A sample, in which a cross-section was cut by dicing, was fixed on a workbench, subjected to the BIB (Broad Ion Beam) processing, and observed by SEM. The SEM observation conditions were as follows.
SEM observation conditions
Apparatus used: S-4800 (produced by Hitachi High-Technologies Corp.)
Acceleration voltage: 1.5 kV
Detection mode: secondary electron (energy filter function)
Detection information: shape+composition
FIG. 10 is illustrative diagrams depicting an example of a calculation of a porosity of a concave-convex microstructure layer in the 3 visual fields depicted in FIG. 7. A concave-convex microstructure layer was cut out from an image (magnified 100,000-fold) obtained by a cross-sectional SEM observation, and further voids present in the concave-convex microstructure layer were extracted. For the extraction, a binarization processing was carried out by an image analysis software utilizing a bright contrast around a void due to an edge effect, and a dark contrast of a void itself in the obtained image. In this case, a binarization processing was conducted, such that a concave-convex microstructure layer was made white, and a void, a substrate, and a background were made black. With respect to a part, which a binarization processing could not cover, was complemented by manual judgment. Whether the major diameter of a void is as long as 50 nm or not was judged by the length in the longitudinal direction, and only a void with a major diameter of 50 nm or less was counted as an evaluation target. With respect to an obtained extracted image of voids, the ratio of an area of a portion corresponding to voids to an area of portions corresponding to a concave-convex microstructure layer and voids was calculated as a porosity in the concave-convex microstructure layer. The operation was repeated for 3 visual fields, and a number average value thereof was used as a porosity. The porosity values calculated from FIG. 10 were as follows: visual field 1: 0.84%, visual field 2: 0.68%, and visual field 3: 0.76%. A porosity less than 1% was denoted as 2A, not less than 1% and less than 5% was denoted as 1A, and not less than 5% was denoted as C.

(10) Transferability

Examples 1C to 7C

An optical film was layered on a 2-inch sapphire substrate and bonded together using a vacuum laminator (MVLP, produced by Meiki Co., Ltd.) under a condition set forth in Table 4, and then peeled off under a condition set forth in Table 4 to prepare a laminate for testing. A surface of the laminate for testing was examined visually, and when not less than 80% of the area of an adhesive layer and a concave-convex microstructure layer was transferred to the sapphire substrate, it was denoted as 2A; when not less than 30% and less than 80% was transferred, it was denoted as 1A; and when less than 30% was transferred, it was denoted as C.

(11) Adhesiveness

Examples 1A to 35A, and Examples 1A' to 12A'

An adhesive layer in a form of a flat film was coated on a 2-inch sapphire substrate, and 11 lines were scribed on a test surface (adhesive layer surface) deep enough to reach a basis material (namely, the sapphire substrate) with a cutter knife using a cutter guide to form a right angle lattice pattern of 100 cells at 2 mm intervals. A CELLOTAPE (registered trademark) was stuck with a strong pressure to an area of the right angle lattice pattern, then an edge of the tape was pulled off in one stroke at an angle of 45°, and the condition of the right angle lattice pattern was compared with a reference chart and rated. When an area not less than 90% of the total test surface remained intact, the test surface was rated as 2A; when not less than 50% and less than 90% remained, it was rated as 1A; and when less than 50% remained, it was rated as B.

Examples 1B to 7B

An optical film was laminated on a 2-inch sapphire substrate in a vacuum at 150° C. to prepare a laminate for testing. After peeling a mold, a surface of the laminate for testing on the side of the optical film was photographed as a test surface, and an area where a concave-convex profile was transferred was calculated. When the concave-convex profile was transferred in an area not less than 80% of the total test surface, the test surface was rated as 1A; when the concave-convex profile was transferred not less than 50% and less than 80%, it was rated as B; and when the concave-convex profile was transferred less than 50%, it was rated as C.

Examples 1C to 7C

A laminate for testing was prepared according to the same procedures as (10) above. A surface of the laminate for testing on the side of the optical film was used as a test surface. On this surface, 11 lines were scribed deep enough to reach a basis material (namely, the sapphire wafer) with a cutter knife using a cutter guide to form a right angle lattice pattern of 100 cells at 2 mm intervals. A CELLOTAPE (registered trademark) was stuck with a strong pressure to an area of the right angle lattice pattern, then an edge of the tape was pulled off in one stroke at an angle of 45°, and the condition of the right angle lattice pattern was compared with a reference chart and rated. When not less than 95% of the total test surface remained intact, the test surface was rated as 2A; when not less than 90% and less than 95% remained, it was rated as 1A; when not less than 50% and less than 90% remained, it was rated as B; and when less than 50% remained, it was rated as C.

(12) Dicing Property

A sapphire substrate, on which a concave-convex microstructure layer was formed, was fixed on a certain scribing processing apparatus by the intermediary of an adhesive layer, subjected to a scribing processing, and then a dicing die bonding sheet was expanded using a certain expanding apparatus. Thereafter, the sapphire substrate and the dicing die bonding sheet were cut simultaneously along the scribing lines. When a substrate and a concave-convex microstructure layer were found to be adhered tightly after dicing as the result of an observation at a magnification of from 200 to 3,000-fold with a microscope (VHX500, produced by Keyence Corporation), it was rated as 1A, and when a defect, such as delamination, or cracking, was found, it was rated as B.

(13) High/Low Thermal Cycle Resistance

A 1 mm-LED chip, to which a concave-convex microstructure layer was bonded, was subjected to a high/low cycle test, repeating a cycle of 30 min, namely at 125° C. for 15 min, and at −45° C. for 15 min. A chip in which cracking or delamination was not recognized after 100 cycles was rated as 2A, a chip in which cracking or delamination was not recognized after 80 cycles was rated as 1A, a chip in which cracking or delamination was not recognized after 20 cycles but cracking or delamination was recognized after 80 cycles was rated as B, and a chip in which cracking or delamination was recognized after 20 cycles or less was rated as C.

(14) Light Resistance Test

Examples 1A to 35A, and Examples 1A' to 12A'

A 1 mm-LED chip, to which a concave-convex microstructure layer was bonded, was subjected to an energization test at 350 mA in an atmosphere of 150° C., and observed with a microscope (VHX500, produced by Keyence Corporation). A chip in which deterioration of a sealing resin was not recognized after an elapse of 100 hours was rated as 1A, a chip in which deterioration of a sealing resin was not recognized after an elapse of 50 hours, but deterioration of a sealing resin was recognized after an elapse of 100 hours was rated as B, and a chip in which deterioration of a sealing resin was recognized after an elapse of 50 hours was rated as C.

Examples 1B to 7B

A 1 mm-LED chip, to which a concave-convex microstructure layer was bonded, was irradiated with light of 365 nm at an intensity of 7 w in an atmosphere of 50° C., and examined visually after irradiation. A chip in which yellowing was not recognized after irradiation for 200 hours was rated as 1A, a chip in which yellowing was recognized after irradiation for 200 hours, but yellowing was not recognized after irradiation for 100 hours was rated as B, and a chip in which yellowing was recognized after irradiation for 100 hours was rated as C.

(15) Heat Resistance

A 1 mm-LED chip, to which a concave-convex microstructure layer was bonded, was heated in an atmosphere of 150° C. for 500 hours. After heating a chip was examined visually and with a microscope (VHX-500, produced by Keyence Corporation), and a chip in which cracking or deformation was not recognized was rated as 1A, and a chip in which cracking or deformation was recognized was rated as C.

(16) Light Extraction Property Test

When the respective electrode pads of a semiconductor light emitting device produced in each Example were energized such that a current flows in a forward direction at 20 mA in an environment of 25° C., a light output power was measured. An light output power from a semiconductor light emitting device having a flat light extraction layer, which was not profiled, was measured identically, and used as the reference.

Examples 1A to 35A

A device for which the improvement of light extraction in terms of a light output power ratio with respect to the reference was not less than 20% was rated as 4A, a device for which the improvement of light extraction was less than 20% and not less than 15% was rated as 3A, a device for which the improvement of light extraction was less than 15% and not less than 10% was rated as 2A, a device for which the improvement of light extraction was less than 10% and not less than 5% was rated as 1A, a device for which the improvement of light extraction was less than 5% and not less than −5% was rated as B, and a device for which the improvement of light extraction was less than −5% was rated as C.

Examples 1B to 7B

A device for which the improvement of light extraction in terms of a light output power ratio was not less than 8% was rated as 1A, a device for which the improvement of light extraction was less than 8% and not less than 3% was rated as B, and a device for which the improvement of light extraction was less than 3% was rated as C.

Examples 1A to 35A

Example 1A

Production of Mold

A PDMS resin (KE106, produced by Shin-Etsu Chemical Co., Ltd.) was cast on a master mold (PET film) having received a release treatment and having projections with a microstructure height of 700 nm, and a microstructure width of 700 nm, heated at 120° C. for 1 min, removed from the PET film, and heated at 150° C. for 30 min to cure completely the PDMS, thereby completing production of a mold (50 mm), to which a concave-convex profile was reversely transferred.

<Production of Concave-Convex Imparting Sheet>

An inorganic particle dispersion was prepared by mixing 92 parts by mass of a commercially-supplied 15 wt % methanol-diluted $TiO_2$ nano-state dispersion (SRD-M, average primary particle diameter 4 nm, produced by Sakai Chemical Industry Co., Ltd.), and 8 parts by mass of tetraethoxysilane. The dispersion was coated on a mold using a bar coater and covered with a PET film. This unit was left standing in an environment of a temperature of 23° C. and a humidity of 50% RH for 20 hours for drying, then the PET film was removed to obtain a concave-convex imparting sheet.

<Production of Device>

On a sapphire substrate, (1) an AlGaN low temperature buffer layer, (2) a n-type GaN layer, (3) a n-type AlGaN cladding layer, (4) an InGaN light emission layer (MQW), (5) a p-type AlGaN cladding layer, and (6) a p-type GaN layer were layered one on another in the mentioned order by MOCVD, and additionally (7) an ITO layer was layered by electron beam vapor deposition. Then a resist was patterned by photolithography, and a light extraction layer in regions where a p-side electrode, and a n-side electrode were to be formed was removed by dry etching. The resist was removed temporarily, and a region where a n-side electrode was to be formed was further subjected to an etching processing, in which resist patterning by photolithography and ITO etching, and dry etching by a chlorine-based gas were further carried out, so that a n-type GaN layer was exposed. The resist was removed again, a resist was patterned by photolithography, a metal was vapor-deposited by a lift-off method to provide electrode pads and complete a p-side electrode and a n-side electrode. A device was produced as above.

<Production of Semiconductor Light Emitting Device>

On a sapphire substrate of the device produced as above, a mixture of 99 parts by mass of tetramethoxysilane (produced by Tokyo Chemical Industry Co., Ltd.), and 1 part by mass of titanium diisopropoxy-bis(ethyl acetoacetate) (TC750, produced by Matsumoto Fine Chemical Co., Ltd.) was coated as an adhesive layer with a spin coater (MS-A100, Mikasa Co., Ltd.,) to a film thickness set forth in Table 1, on which the concave-convex mold was combined. The combination in this condition was pressed at a pressure of 0.05 MPa using a nanoimprinter (EUN-4200, produced by Engineering System Co., Ltd.). A laminate having a constitution of mold/concave-convex microstructure layer/adhesive layer/device taken out of the nanoimprinter was left standing in an environment of a temperature of 23° C. and a humidity of 50% RH for 20 min, and then the mold was removed. The unit was left standing in an oven at 150° C. for 2 hours for curing completely tetramethoxysilane to constitute an adhesive layer, and singulated by dicing into 1 mm chips to obtain semiconductor light emitting devices. On the obtained semiconductor light emitting device a LED sealing material (SCR-1016, produced by Shin-Etsu Silicone) was formed in a shape of a 3 mmφ-hemispherical lens, and heated at 100° C. for 1 hour and at 150° C. for 5 hours to seal the semiconductor light emitting device.

The produced semiconductor light emitting device was evaluated in terms of characteristics of a light extraction layer and characteristics of a semiconductor light emitting device by the above methods. The results are shown in the following Table 1.

Example 2A

Production of Mold

Identical with Example 1A, except that the master mold (PET film) was changed to that having received a release treatment and having a microstructure height of 350 nm.

<Production of Concave-Convex Imparting Sheet>

Identical with Example 1A, except that the inorganic particle dispersion was changed to a mixture of 76 parts by mass of a $TiO_2$ nano-state dispersion (SRD-M, produced by Sakai Chemical Industry Co., Ltd.), and 24 parts by mass of tetraethoxysilane.

<Production of Device>

Identical with Example 1A.

<Impartation of Microstructure>

Identical with Example 1A, except that as an adhesive layer a mixture of 99 parts by mass of tetramethoxysilane, 1 part by mass of zirconium tetraacetyl acetate (ZC-150, produced by Matsumoto Fine Chemical Co., Ltd.), and 100 parts by mass of hexanol (produced by Wako Pure Chemical Industries, Ltd.) was coated to make the coating thickness of an adhesive layer as the film thickness described in Table 1.

Example 3A

Production of Mold

Identical with Example 1A, except that the master mold (PET film) was changed to that having a microstructure height of 1,400 nm.
<Production of Concave-Convex Imparting Sheet>
Identical with Example 1A, except that the inorganic particle dispersion was changed to a mixture of 54 parts by mass of a $TiO_2$ nano-state dispersion (SRD-M, produced by Sakai Chemical Industry Co., Ltd.), and 44 parts by mass of tetraethoxysilane.
<Production of Device>
Identical with Example 1A.
<Impartation of Microstructure>
Identical with Example 1A, except that as an adhesive layer a mixture of 99 parts by mass of tetramethoxysilane, 1 part by mass of titanium diisopropoxy-bis(ethyl acetoacetate) (TC750, produced by Matsumoto Fine Chemical Co., Ltd.), and 100 parts by mass of hexanol (produced by Wako Pure Chemical Industries, Ltd.) was coated to make the coating thickness of an adhesive layer as the film thickness described in Table 1.

Example 4A

Production of Mold

Identical with Example 1A.
<Production of Concave-Convex Imparting Sheet>
Identical with Example 1A, except that the material for the concave-convex microstructure layer was changed to a titanium oxide oligomer solution (T3072, produced by Matsumoto Fine Chemical Co., Ltd.).
<Production of Device>
Identical with Example 1A.
<Impartation of Microstructure>
Identical with Example 1A, except that the coating thickness of the adhesive layer was changed to the film thickness described in Table 1.

Example 5A

Production of Mold

Identical with Example 1A.
<Production of Concave-Convex Imparting Sheet>
A curable composition was obtained by adding and mixing well 76 parts by mass of 1,3-benzenedithiol (produced by Sigma-Aldrich, Inc.), 24 parts by mass of tetravinylsilane (produced by Shin-Etsu Silicone), 1.5 parts by mass of bis(2,4,6-trimethylbenzoyl)phenyl phosphine oxide (Irgacure® 819, produced by BASF SE), and 0.0025 part by mass of N-nitrosophenylhydroxyamine aluminum salt (Q-1301, produced by Wako Pure Chemical Industries, Ltd.). The composition was coated on a mold using a bar coater, and irradiated with ultraviolet light at a light intensity of 1,000 $mJ/cm^2$ using a metal halide lamp (CV-110Q-G, produced by Fusion UV Systems Japan) to obtain a concave-convex imparting sheet.

<Production of Device>
Identical with Example 1A.
<Impartation of Microstructure>
On a sapphire of the device, a curable composition prepared by adding and mixing well 68 parts by mass of 1,2-ethanedithiol (produced by Tokyo Chemical Industry Co., Ltd.), 32 parts by mass of tetravinylsilane (produced by Shin-Etsu Silicone), 1.5 parts by mass of 2-hydroxy-2-methyl-1-phenyl-propan-1-one (Darocure® 1173, produced by BASF SE), and 0.0025 part by mass of N-nitrosophenylhydroxyamine aluminum salt (Q-1301, produced by Wako Pure Chemical Industries, Ltd.) was coated as an adhesive by a spin coater (MS-A100, produced by Mikasa Co., Ltd.) to the film thickness described in Table 1, and then a concave-convex imparting sheet was combined. The combination in this condition was pressed at a pressure of 0.05 MPa using a nanoimprinter (EUN-4200, produced by Engineering System Co., Ltd.). A laminate having a constitution of mold/concave-convex microstructure layer/adhesive layer/device taken out of the nanoimprinter was irradiated with ultraviolet light at a light intensity of 1,000 $mJ/cm^2$ using a metal halide lamp (CV-110Q-G, produced by Fusion UV Systems Japan), and after removing the mold singulated by dicing into 1 mm chips to obtain semiconductor light emitting devices. On the obtained semiconductor light emitting device a LED sealing material (SCR-1016, produced by Shin-Etsu Silicone) was formed in a shape of a 3 mmφ-hemispherical lens, and heated at 100° C. for 1 hour and at 150° C. for 5 hours to seal the semiconductor light emitting device.

Example 6A

Production of Mold

Identical with Example 1A.
<Production of Concave-Convex Imparting Sheet>
Identical with Example 5A.
<Production of Device>
Identical with Example 1A.
<Impartation of Microstructure>
Identical with Example 1A, except that as an adhesive layer a mixture of 99 parts by mass of (3-mercaptopropyl)trimethoxysilane (produced by Tokyo Chemical Industry Co., Ltd.), and 1 part by mass of titanium diisopropoxy bis(ethyl acetate) (TC401, produced by Matsumoto Fine Chemical Co., Ltd.) was coated to make the coating thickness of an adhesive layer as the film thickness described in Table 1.

Example 7A

Production of Mold

Identical with Example 1A.
<Production of Concave-Convex Imparting Sheet>
Identical with Example 1A.
<Production of Device>
Identical with Example 1A.
<Impartation of Microstructure>
Identical with Example 1A, except that the coating thickness of the adhesive layer was changed to the film thickness described in Table 1.

Example 8A

Production of Mold

Identical with Example 1A.
<Production of Concave-Convex Imparting Sheet>
Identical with Example 1A, except that the inorganic particle dispersion was changed to a mixture of 33 parts by mass of a $TiO_2$ nano-state dispersion (SRD-M, produced by Sakai Chemical Industry Co., Ltd.), and 67 parts by mass of tetraethoxysilane.
<Production of Device>
Identical with Example 1A.
<Impartation of Microstructure>
Identical with Example 1A.

Example 9A

Production of Mold

Identical with Example 1A.
<Production of Concave-Convex Imparting Sheet>
Identical with Example 1A.
<Production of Device>
Identical with Example 1A.
<Impartation of Microstructure>
On a sapphire of the device, a SCR-1016 (a methyl phenyl silicone resin, produced by Shin-Etsu Silicone) was coated as an adhesive by a spin coater (MS-A100, produced by Mikasa Co., Ltd.) to the film thickness described in Table 1, post-baked at 80° C., for 2 min, and then a concave-convex imparting sheet was combined. The combination in this condition was pressed at a pressure of 0.05 MPa using a nanoimprinter (EUN-4200, produced by Engineering System Co., Ltd.). A laminate having a constitution of mold/concave-convex microstructure layer/adhesive layer/device taken out of the nanoimprinter was left standing in an oven at 150° C. for 2 hours, and then singulated by dicing into 1 mm chips to obtain semiconductor light emitting devices. On the obtained semiconductor light emitting device a LED sealing material (SCR-1016, produced by Shin-Etsu Silicone) was formed in a shape of a 3 mmϕ-hemispherical lens, and heated at 100° C. for 1 hour and at 150° C. for 5 hours to seal the semiconductor light emitting device.

Example 10A

Production of Mold

Identical with Example 1A.
<Production of Concave-Convex Imparting Sheet>
Identical with Example 1A.
<Production of Device>
Identical with Example 1A.
<Impartation of Microstructure>
A polyimide precursor used in this Example was produced by the following method.
To a 500 mL-volume glass-made separable three-neck flask equipped with a stainless steel-made anchor agitator, a silica gel desiccating column was attached. Into the flask, 347.9 g of N-methyl-2-pyrrolidone (anhydrous) (produced by Wako Pure Chemical Industries, Ltd.), and 27.5 g of 4,4'-diaminodiphenyl ether (produced by Wakayama Seika Kogyo Co., Ltd.) were added at room temperature, and stirred to be dissolved, then the flask was cooled by ice water. When the liquid temperature in the flask reached 5° C., 0.5 g of phthalic anhydride (produced by Wako Pure Chemical Industries, Ltd.) was added, and after stirring for 5 min, 43.7 g of 3,3',4,4'-benzophenonetetracarboxylic dianhydride was added gradually into the flask, which was then stirred for 8 hours with cooling by ice water.
On a sapphire of the device, a polyimide precursor synthesized by the above method was coated as an adhesive by a spin coater (MS-A100, produced by Mikasa Co., Ltd.) to the film thickness described in Table 1, post-baked at 100° C., for 3 min, and then a concave-convex imparting sheet was combined. The combination in this condition was pressed at a pressure of 0.05 MPa and heated at 140° C. for 10 min using a nanoimprinter (EUN-4200, produced by Engineering System Co., Ltd.). A laminate having a constitution of mold/concave-convex microstructure layer/adhesive layer/device taken out of the nanoimprinter was left standing in an oven at 260° C. for 10 min, and then singulated by dicing into 1 mm chips to obtain semiconductor light emitting devices. On the obtained semiconductor light emitting device a LED sealing material (SCR-1016, produced by Shin-Etsu Silicone) was formed in a shape of a 3 mmϕ-hemispherical lens, and heated at 100° C. for 1 hour and at 150° C. for 5 hours to seal the semiconductor light emitting device.

Example 11A

Preparation of UV Curable Resin

In a glass-made shaded bottle 400 parts by mass of M-350 (a multifunctional acrylate compound, produced by Toagosei Co., Ltd.), 70 parts by mass of DAC-HP (a fluorinated antifouling additive, produced by Daikin Industries, Ltd.), and 8 parts by mass of 1-hydroxycyclohexyl phenyl ketone (Irgacure® 184, produced by BASF SE) were mixed well to obtain an UV curable resin.
<Production of Mold>
The UV curable resin was coated on a master mold (PET film) having received a release treatment and having projections with a microstructure height of 700 nm, and a microstructure width of 700 nm, and a PET film was placed thereon. The UV curable resin was exposed to light at 300 mJ/cm² and cured, which was then peeled to obtain a mold (G2 mold) having a concave micropattern with a microstructure height of 700 nm, and a microstructure width of 700 nm.
<Production of Concave-Convex Imparting Sheet>
NRC-3132P (a 20 mass-% propylene glycol monomethyl ether solution of a resin containing titanium oxide, produced by Nagase ChemteX Corporation) was coated on the G2 mold with a bar coater, and dried on a hot plate at 40° C. for 10 min. After curing through exposure to light at 300 mJ/cm², a 10 mass-%-solution of SCR 1011 (produced by Shin-Etsu Silicone) in propylene glycol monomethyl ether 2-acetate (PGMEA) was coated thereon with a bar coater to the film thickness described in Table 1, and then heated at 120° C. for 2 hours to obtain a concave-convex imparting sheet.
<Production of Device>
On a sapphire substrate, (1) an AlGaN low temperature buffer layer, (2) a n-type GaN layer, (3) a n-type AlGaN cladding layer, (4) an InGaN light emission layer (MQW), (5) a p-type AlGaN cladding layer, and (6) a p-type GaN layer were layered one on another successively by MOCVD, and additionally (7) an ITO layer was layered by electron beam vapor deposition. Thereafter, a microstructure was formed on the ITO by the following steps. Then a resist was patterned by photolithography, and a light extraction layer in regions where a p-side electrode, and a n-side electrode were to be formed was removed by dry etching. The resist was removed temporarily, and a region where a n-side electrode was to be formed was further subjected to resist patterning by photolithography and ITO etching, and dry etching by a chlorine-based gas, so that an etching processing was conducted up to a n-type GaN layer. The resist was removed again, a resist was patterned by photolithography, a metal was vapor-deposited by a lift-off method to provide electrode pads. On the obtained semiconductor light emitting device a LED sealing material (SCR-1016, produced by Shin-Etsu Silicone) was formed in a shape of a 3 mmφ-hemispherical lens, and heated at 100° C. for 1 hour and at 150° C. for 5 hours to seal the semiconductor light emitting device <Impartation of Microstructure>

A concave-convex imparting sheet was layered on the ITO layer of the semiconductor light emitting device and bonded together using a vacuum laminating machine (Meiki Co., Ltd.) at 120° C. and 4 bar, and then the G2 mold was peeled off, thereby completing a microstructure.

Example 12A

Preparation of UV Curable Resin

Identical with Example 11A.
<Production of Mold>
Identical with Example 11A.
<Production of Concave-Convex Imparting Sheet>

Identical with Example 11A, except that as an adhesive layer a propylene glycol monomethyl ether 2-acetate (PG-MEA) solution containing 20 parts by mass of a surface modified TiO$_2$ particle (SRD-M, average primary particle diameter of 6 nm, produced by Sakai Chemical Industry Co., Ltd.) and 80 parts by mass of SCR-1011 (produced by Shin-Etsu Silicone) was coated with a bar coater to the film thickness described in Table 1.
<Production of Device>
Identical with Example 11A.
<Impartation of Microstructure>

A concave-convex imparting sheet was layered on a sapphire substrate of the device produced as above, and bonded together using a vacuum laminating machine (Meiki Co., Ltd.) at 120° C. and 4 bar, and then the G2 mold was peeled off. Then, the laminate was singulated by dicing into 1 mm chips to obtain semiconductor light emitting devices. On the obtained semiconductor light emitting device a LED sealing material (SCR-1016, produced by Shin-Etsu Silicone) was formed in a shape of a 3 mmφ-hemispherical lens, and heated at 100° C. for 1 hour and at 150° C. for 5 hours to seal the semiconductor light emitting device.

Example 13A

Identical with Example 12A, except that the coating thickness of an adhesive layer was changed to the film thickness described in Table 1.

Example 14A

Preparation of UV Curable Resin

Identical with Example 11A.
<Production of Mold>
Identical with Example 11A.
<Production of Concave-Convex Imparting Sheet>
Identical with Example 12A, except that with respect to the material for the adhesive layer the amount of the surface modified TiO$_2$ particle was changed to 30 parts by mass, and the amount of the SCR-1011 (produced by Shin-Etsu Silicone) was changed to 70 parts by mass.
<Production of Device>
Identical with Example 11A.
<Impartation of Microstructure>
Identical with Example 12A.

Example 15A

Preparation of UV Curable Resin

Identical with Example 11A.
<Production of Mold>
Identical with Example 11A.
<Production of Concave-Convex Imparting Sheet>
Identical with Example 14A, except that the coating thickness of the adhesive layer was changed to the film thickness described in Table 1.
<Production of Device>
Identical with Example 11A.
<Impartation of Microstructure>
Identical with Example 12A.

Example 16A

Preparation of UV Curable Resin

Identical with Example 11A.
<Production of Mold>
Identical with Example 11A.
<Production of Concave-Convex Imparting Sheet>
Identical with Example 12A, except that the coating thickness of the adhesive layer was changed to the film thickness described in Table 1.
<Production of Device>
Identical with Example 11A.
<Impartation of Microstructure>
Identical with Example 12A.

Example 17A

Preparation of UV Curable Resin

Identical with Example 11A.
<Production of Mold>
Identical with Example 11A.
<Production of Concave-Convex Imparting Sheet>
Identical with Example 11A, except that the coating thickness of the adhesive layer was changed to the film thickness described in Table 1.

<Production of Device>
Identical with Example 11A.
<Impartation of Microstructure>
Identical with Example 12A.

Example 18A

Preparation of UV Curable Resin

Identical with Example 11A.
<Production of Mold>
Identical with Example 11A.
<Production of Concave-Convex Imparting Sheet>
Identical with Example 12A, except that the coating thickness of the adhesive layer was changed to the film thickness described in Table 1.
<Production of Device>
Identical with Example 11A.
<Impartation of Microstructure>
Identical with Example 12A.

Example 19A

Preparation of UV Curable Resin

Identical with Example 11A.
<Production of Mold>
Identical with Example 11A.
<Production of Concave-Convex Imparting Sheet>
Identical with Example 11A, except that the coating thickness of the adhesive layer was changed to the film thickness described in Table 1.
<Production of Device>
Identical with Example 11A.
<Impartation of Microstructure>
Identical with Example 12A.

Example 20A

Production of Mold

Identical with Example 1A.
<Production of Concave-Convex Imparting Sheet>
Identical with Example 1A.
<Production of Device>
Identical with Example 1A.
<Production of Semiconductor Light Emitting Device>
Identical with Example 1A, except that as an adhesive layer a propylene glycol monomethyl ether 2-acetate (PG-MEA) solution containing 40 parts by mass of a surface modified $TiO_2$ particle and 60 parts by mass of SCR-1011 (produced by Shin-Etsu Silicone) was coated with a spin coater to the film thickness described in Table 1.

Example 21A

Production of Mold

Identical with Example 1A.
<Production of Concave-Convex Imparting Sheet>
Identical with Example 1A.
<Production of Device>
Identical with Example 1A.
<Production of Semiconductor Light Emitting Device>
Identical with Example 20A, except that the coating thickness of the adhesive layer was changed to the film thickness described in Table 1.

Example 22A

Preparation of UV Curable Resin

Identical with Example 11A.
<Production of Mold>
Identical with Example 11A.
<Production of Concave-Convex Imparting Sheet>
Identical with Example 11A, except that the coating thickness of the adhesive layer was changed to the film thickness described in Table 1.
<Production of Device>
Identical with Example 11A, except that the sealing step was not performed.
<Impartation of Microstructure>
Identical with Example 12A.

Example 23A

Production of Device

Identical with Example 11A, except that the sealing step, and the microstructure imparting step were not performed.

Example 24A

Preparation of UV Curable Resin

Identical with Example 11A.
<Production of Mold>
Identical with Example 11A, except that a master mold (PET film), which received a release treatment but did not have a microstructure, was used.
<Production of Concave-Convex Imparting Sheet>
Identical with Example 11A, except that the coating thickness of the adhesive layer was changed to the film thickness described in Table 1.
<Production of Device>
Identical with Example 11A.
<Impartation of Microstructure>
Identical with Example 12A.

Example 25A

Production of Device

Identical with Example 11A, except that the microstructure imparting step was not performed.

Example 26A

Identical with Example 1A, except that the adhesive layer was not formed, and the material for the concave-convex microstructure layer was changed to a mixture of 60 parts by mass of a phenyl-modified silicone (SCR-1011, produced by Shin-Etsu Silicone), and 40 parts by mass of a surface-modified $TiO_2$ particle (SRD-M, average primary particle diameter of 6 nm, produced by Sakai Chemical Industry Co., Ltd.).

Example 27A

Identical with Example 8A, except that the adhesive layer was formed identically with Example 20A.

Example 28A

Identical with Example 14A, except that a phenyl-modified silicone (SCR-1011) was used as the material for the concave-convex microstructure layer.

Example 29A

Identical with Example 26A, except that a mixture of 80 mass-% of a phenyl-modified silicone (SCR-1011), and 20 mass-% of a surface-modified $TiO_2$ particle (SRD-M, average primary particle diameter of 6 nm, produced by Sakai Chemical Industry Co., Ltd.) was used as the material for the concave-convex microstructure layer.

Example 30A

Identical with Example 5A, except that the concave-convex microstructure layer was formed identically with Example 2A.

Example 31A

Identical with Example 12A, except that the amount of the $TiO_2$ particle in the material for the adhesive layer was changed to 10 parts by mass.

Example 32A

Identical with Example 31A, except that the adhesive layer thickness was changed to the thickness described in Table 1.

Example 33A

Identical with Example 17A, except that the adhesive layer thickness was changed to the thickness described in Table 1, and the inorganic particle dispersion used for forming the adhesive layer in Example 20A was used as a material for a concave-convex microstructure layer.

Example 34A

Identical with Example 1A, except that an adhesive layer was formed according to the material and thickness described Table 1, and a concave-convex microstructure layer was formed identically with Example 20A.

Example 35A

Identical with Example 31A, except that the adhesive layer thickness was changed to the thickness described in Table 1.

Example 1A'

Preparation of UV Curable Resin

Identical with Example 11A.
<Production of Mold>
Identical with Example 11A.
<Production of Concave-Convex Imparting Sheet>
An inorganic particle dispersion obtained by mixing 72 parts by mass of a $TiO_2$ nano-state dispersion (SRD-M, produced by Sakai Chemical Industry Co., Ltd.) and 28 parts by mass of tetraethoxysilane was coated on the G2 mold with a bar coater, and covered by a PDMS film. The unit was left standing in an environment of a temperature of 23° C. and a humidity of 50% RH for 20 hours to be dried, and then the PDMS film was removed. Thereon $SiO_2$ was sputtered to the thickness described in Table 2 using a sputtering apparatus (SH-450, produced by Ulvac Inc.). On the produced concave-convex imparting layer a 10 mass-% solution of SCR-1011 (produced by Shin-Etsu Silicone) in propylene glycol monomethyl ether 2-acetate (PGMEA) was coated to the film thickness described in Table 2 with a bar coater, and heated at 120° C., for 2 h to obtain a concave-convex imparting sheet.
<Production of Device>
Identical with Example 1A.
<Impartation of Microstructure>
A concave-convex imparting sheet was layered on a sapphire substrate of the device produced as above, and bonded together using a vacuum laminating machine (Meiki Co., Ltd.) at 120° C. and 4 bar, and then the G2 mold was peeled off. Then, the laminate was singulated by dicing into 1 mm chips to obtain semiconductor light emitting devices. On the obtained semiconductor light emitting device a LED sealing material (SCR-1016, produced by Shin-Etsu Silicone) was formed in a shape of a 3 mmφ-hemispherical lens, and heated at 100° C. for 1 hour and at 150° C. for 5 hours to seal the semiconductor light emitting device.

Example 2A'

Preparation of UV Curable Resin

Identical with Example 11A.
<Production of Mold>
Identical with Example 11A.
<Production of Concave-Convex Imparting Sheet>
On the G2 mold, on which $SiO_2$ was sputtered to the thickness described in Table 2 using a sputtering apparatus (SH-450, produced by Ulvac Inc.), an inorganic particle dispersion obtained by mixing 74 parts by mass of a $TiO_2$ nano-state dispersion (SRD-M, produced by Sakai Chemical Industry Co., Ltd.), and 26 parts by mass of tetraethoxysilane was coated with a bar coater, and covered with a PDMS film. The unit was left standing in an environment of a temperature of 23° C. and a humidity of 50% RH for 20 hours to be dried, and then the PDMS film was removed. Thereon $SiO_2$ was sputtered to the thickness described in Table 2 using a sputtering apparatus (SH-450, produced by Ulvac Inc.). Further, a 10 mass-% solution of aminopropyltrimethoxysilane (KBM-903, produced by Shin-Etsu Chemical Co., Ltd.) in ethanol was coated with a bar coater, and heated at 80° C., for 10 min to obtain a concave-convex imparting sheet with an adhesive layer.
<Production of Device>
Identical with Example 1A.
<Impartation of Microstructure>
Identical with Example 12A'.

Example 3A'

Preparation of UV Curable Resin

Identical with Example 11A.
<Production of Mold>
Identical with Example 11A.
<Production of Concave-Convex Imparting Sheet>
On the G2 mold, on which $SiO_2$ was sputtered to the thickness described in Table 2 using a sputtering apparatus (SH-450, produced by Ulvac Inc.), NRC-3132P (a 20 mass-% propylene glycol monomethyl ether solution of a resin containing titanium oxide, produced by Nagase ChemteX Corporation) was coated with a bar coater, and dried on a hot plate 40° C. for 10 min. After curing through exposure to light at 300 mJ/cm$^2$, SiO$_2$ was sputtered thereon to the thickness described in Table 2 using a sputtering apparatus (SH-450, produced by Ulvac Inc.). Further, a 10 mass-% solution of SCR-1011 (produced by Shin-Etsu Silicone) in propylene glycol monomethyl ether 2-acetate (PGMEA) was coated with a bar coater and heated at 120° C., for 2 hours to obtain a concave-convex imparting sheet.
<Production of Device>
Identical with Example 1A.
<Impartation of Microstructure>
Identical with Example 1A'.

Example 4A'

Preparation of UV Curable Resin

Identical with Example 11A.
<Production of Mold>
Identical with Example 11A.
<Production of Concave-Convex Imparting Sheet>
Identical with Example 3A'.
<Production of Device>
Identical with Example 11A.
<Impartation of Microstructure>
Identical with Example 11A.

Example 5A'

Preparation of UV Curable Resin

Identical with Example 11A.
<Production of Mold>
Identical with Example 11A.
<Production of Concave-Convex Imparting Sheet>
Identical with Example 2A', except that the inorganic particle dispersion was changed to an inorganic particle dispersion obtained by mixing 44 parts by mass of a TiO$_2$ nano-state dispersion (SRD-M, produced by Sakai Chemical Industry Co., Ltd.), and 56 parts by mass of tetraethoxysilane.
<Production of Device>
Identical with Example 11A.
<Impartation of Microstructure>
Identical with Example 11A.

Example 6A'

Preparation of UV Curable Resin

Identical with Example 11A.
<Production of Mold>
Identical with Example 11A.
<Production of Concave-Convex Imparting Sheet>
An inorganic particle dispersion obtained by mixing 74 parts by mass of SZR-M (a 30 mass-% ZrO$_2$ dispersion in methanol, average primary particle diameter of 3 nm, produced by Sakai Chemical Industry Co., Ltd.) and 26 parts by mass of tetraethoxysilane was coated on the G2 mold with a bar coater, and covered by a PDMS film. The unit was left standing in an environment of a temperature of 23° C. and a humidity of 50% RH for 20 hours to be dried, and then the PDMS film was removed. On the produced concave-convex imparting layer a 10 mass-% solution of SCR-1011 (produced by Shin-Etsu Silicone) in propylene glycol monomethyl ether 2-acetate (PGMEA) was coated to the film thickness described in Table 2 with a bar coater, and heated at 120° C., for 2 h to obtain a concave-convex imparting sheet.
<Production of Device>
Identical with Example 11A.
<Impartation of Microstructure>
Identical with Example 11A.

Example 7A'

Preparation of UV Curable Resin

Identical with Example 11A.
<Production of Mold>
Identical with Example 11A.
<Production of Concave-Convex Imparting Sheet>
On the G2 mold, on which SiO$_2$ was sputtered to the thickness described in Table 2 using a sputtering apparatus (SH-450, produced by Ulvac Inc.), an inorganic particle dispersion obtained by mixing 92 parts by mass of TiO$_2$ nano-state dispersion (SRD-M, produced by Sakai Chemical Industry Co., Ltd.), and 8 parts by mass of tetraethoxysilane was coated with a bar coater, and covered by a PDMS film. The unit was left standing in an environment of a temperature of 23° C. and a humidity of 50% RH for 20 hours to be dried, and then the PDMS film was removed. Thereon SiO$_2$ was sputtered to the thickness described in Table 2 using a sputtering apparatus (SH-450, produced by Ulvac Inc.). On the produced concave-convex imparting layer a 10 mass-% solution of SCR-1011 (produced by Shin-Etsu Silicone) in propylene glycol monomethyl ether 2-acetate (PGMEA) was coated with a bar coater to the film thickness described in Table 2, and heated at 120° C., for 2 hours to obtain a concave-convex imparting sheet.
<Production of Device>
Identical with Example 11A.
<Impartation of Microstructure>
Identical with Example 11A.

Example 8A'

Preparation of UV Curable Resin

Identical with Example 11A.
<Production of Mold>
Identical with Example 11A.
<Production of Concave-Convex Imparting Sheet>
Identical with Example 11A, except that the inorganic particle dispersion was changed to an inorganic particle dispersion obtained by mixing 1,150 parts by mass of a barium titanate dispersion (a 8 mass-% dispersion in 2-methoxy ethanol, average primary particle diameter of 10 nm, produced by GC Catalysts and Chemicals Ltd.), and 28 parts by mass of tetraethoxysilane
<Production of Device>
Identical with Example 11A.
<Impartation of Microstructure>
Identical with Example 11A.

Example 9A'

Preparation of UV Curable Resin

Identical with Example 11A.
<Production of Mold>
Identical with Example 11A.
<Production of Semiconductor Light Emitting Device>
Identical with Example 11A.
<Production of Concave-Convex Imparting Sheet>
On the G2 mold, on which SiO$_2$ was sputtered to the thickness described in Table 2 using a sputtering apparatus (SH-450, produced by Ulvac Inc.), NRC-3132P (a 20 mass-% propylene glycol monomethyl ether solution of a resin containing titanium oxide, produced by Nagase ChemteX Corporation) was coated with a bar coater, and dried on a hot plate at 40° C. for 10 min. After curing through exposure to light at 300 mJ/cm$^2$, SiO$_2$ was sputtered thereon to the thickness described in Table 2 using a sputtering apparatus (SH-450, produced by Ulvac Inc.). Further, a 10 mass-% solution of an acrylic resin (UVX-7000, produced by Denka Company Limited) in propylene glycol monomethyl ether 2-acetate (PGMEA) was coated with a bar coater and exposed to light at 300 mJ/cm$^2$ to obtain a concave-convex imparting sheet.
<Impartation of Microstructure>
Identical with Example 11A.

Example 10A'

Preparation of UV Curable Resin

Identical with Example 11A.
<Production of Mold>
Identical with Example 11A.
<Production of Concave-Convex Imparting Sheet>
Identical with Example 15A', except that the sputtering material was changed from SiO$_2$ to Al$_2$O$_3$.
<Production of Device>
Identical with Example 11A.
<Impartation of Microstructure>
Identical with Example 11A.

Example 11A'

Preparation of UV Curable Resin

Identical with Example 11A.
<Production of Mold>
Identical with Example 11A.
<Production of Concave-Convex Imparting Sheet>
Identical with Example 4A'.
<Production of Device>
Identical with Example 11A.
<Impartation of Microstructure>
Identical with Example 11A.

Example 12A'

Production of Mold

Identical with Example 1A.
<Production of Device>
Identical with Example 1A.
<Impartation of Microstructure>
A curable composition obtained by adding and mixing well 76 parts by mass of 1,3-benzenedithiol (produced by Sigma-Aldrich, Inc.), 24 parts by mass of tetravinylsilane (produced by Shin-Etsu Silicone), 1.5 parts by mass of bis(2,4,6-trimethylbenzoyl)phenyl phosphine oxide (Irgacure® 819, produced by BASF SE), and 0.0025 part by mass of N-nitrosophenylhydroxyamine aluminum salt (Q-1301, produced by Wako Pure Chemical Industries, Ltd,) was coated on the sapphire substrate of the device with a bar coater, and a produced mold was layered thereon. The unit was then irradiated with ultraviolet light from a metal halide lamp (CV-110Q-G, produced by Fusion UV Systems Japan) at a light intensity of 1,000 mJ/cm$^2$ to yield a concave-convex microstructure layer.

Examples 1B to 7B

Example 1B

Production of Mold

In a glass-made shaded bottle 400 parts by mass of M-350 (produced by Toagosei Co., Ltd.), 70 parts by mass of DAC-HP (produced by Daikin Industries, Ltd.), and 8 parts by mass of Irgacure® 184 (produced by BASF Japan Ltd.) were charged and mixed well to obtain an UV curable resin. The UV curable resin was coated on a master mold (PET film) having received a release treatment and having a concave-convex profile with a microstructure height of 700 nm, and a microstructure width of 700 nm, and a PET film was placed thereon. The UV curable resin was exposed to light at 300 mJ/cm$^2$ and cured, which was then peeled to obtain a mold (G2 mold) having a concave micropattern with a microstructure height of 700 nm, and a microstructure width of 700 nm.
<Production of Concave-Convex Imparting Sheet>
NRC-3132P (a 20 mass-% solution of a resin containing titanium oxide nanoparticles in propylene glycol monomethyl ether, produced by Nagase ChemteX Corporation) was coated on the G2 mold with a bar coater, and dried on a hot plate at 40° C. for 5 min. After exposed to light at 300 mJ/cm$^2$ and cured, a concave-convex imparting sheet was obtained.
<Production of Optical Film>
A 9 mass-% solution of SCR-1011 (produced by Shin-Etsu Silicone) in propylene glycol monomethyl ether 2-acetate (PGMEA) was coated on the concave-convex imparting sheet with a bar coater to a dry film thickness of 100 nm, and heated at 120° C. for 2 h to obtain an optical film.
<Production of Semiconductor Light Emitting Device>
On a sapphire substrate of the device produced according to the same procedures as in Example 1A, the optical film was layered and bonded together using a vacuum laminating machine (Meiki Co., Ltd.) at 120° C. and 4 bar, and then the G2 mold was peeled off. Then, the device was singulated by dicing into 1 mm chips to obtain semiconductor light emitting devices.
The obtained semiconductor light emitting device was evaluated in terms of characteristics of an optical film by the above methods. The results are shown in the following Table 3.

Example 2B

An optical film and a semiconductor light emitting device were produced according to the same procedures as in Example 1B except that as an adhesive layer a 5 mass-% ethanol solution of KBM-903 (produced by Shin-Etsu Silicone) was coated with a bar coater to a dry film thickness of 50 nm.

Example 3B

An optical film and a semiconductor light emitting device were produced according to the same procedures as in Example 1B except that as an adhesive layer a 10 mass-% solution of UVX-7000 (produced by Denki Kagaku Kogyo K.K.) in propylene glycol monomethyl ether 2-acetate (PGMEA) was coated with a bar coater to a dry film thickness of 100 nm.

Example 4B

Production of Concave-Convex Imparting Sheet

NRC-401B (a 20 mass-% solution of a resin containing oxidized zirconia nanoparticles in propylene glycol monomethyl ether, produced by Nagase ChemteX Corporation) was coated on the G2 mold with a bar coater, and dried on a hot plate at 40° C. for 5 min to obtain a concave-convex imparting sheet.
<Production of Optical Film>
Identical with Example 1B.
<Production of Semiconductor Light Emitting Device>
Identical with Example 1B, except that after removing the G2 mold the unit was heated at 200° C. for 4 hours.

Example 5B

Production of Concave-Convex Imparting Sheet

An inorganic particle dispersion obtained by mixing 90 parts by mass of T-3072 (an alcoholic solution containing a titanium oxide oligomer, produced by Matsumoto Fine Chemical Co. Ltd.), and 10 parts by mass of tetraethoxysilane was coated on the G2 mold with a bar coater, and dried on a hot plate at 30° C. for 5 min to obtain a concave-convex imparting sheet.
<Production of Optical Film>
Identical with Example 1B, except that as an adhesive layer a 10 mass-% ethanol solution of KBM-903 (produced by Shin-Etsu Silicone) was coated with a bar coater to a dry film thickness of 100 nm.
<Production of Semiconductor Light Emitting Device>
Identical with Example 1B, except that after removing the G2 mold the unit was heated at 150° C. for 2 hours.

Example 6B

Production of Concave-Convex Imparting Sheet

Identical with Example 1B, except that the G2 mold was not used, and as a concave-convex imparting sheet a prism sheet (DIAART, produced by Mitsubishi Rayon Co., Ltd.) was used.
<Production of Optical Film>
Identical with Example 1B, except that as an adhesive layer a 20 mass-% solution of SCR-1011 (produced by Shin-Etsu Silicone) in propylene glycol monomethyl ether 2-acetate (PGMEA) was coated on a surface without a concave-convex profile with a bar coater to a dry film thickness of 1,000 nm.
<Production of Semiconductor Light Emitting Device>
Identical with Example 1B, except that after lamination the mold was not removed.

Example 7B

An optical film and a semiconductor light emitting device were produced according to the same procedures as in Example 1B except that as an adhesive layer a 9 mass-% solution of a mixture of 60 parts by mass of SCR-1011 (produced by Shin-Etsu Silicone), and 40 mass-% of a surface-modified $TiO_2$ particle (SRD-M, average primary particle diameter of 6 nm, produced by Sakai Chemical Industry Co. Ltd.) in propylene glycol monomethyl ether 2-acetate (PGMEA) was coated with a bar coater to a dry film thickness of 200 nm.

Examples 1C to 7C

Example 1C

Production of Mold

A mold (G2 mold) was obtained according to the same procedures as in Example 1B.
<Production of Concave-Convex Imparting Sheet>
NRC-3132P (a 20 mass-% solution of a resin containing a titanium oxide nanoparticle in propylene glycol monomethyl ether, produced by Nagase ChemteX Corporation) was coated on the G2 mold with a bar coater, and dried on a hot plate at 40° C. for 5 min. The unit was exposed to light from a metal halide lamp (CV-110Q-G, produced by Fusion UV Systems Japan) at 1,000 $mJ/cm^2$ and cured to obtain a concave-convex imparting sheet comprising a mold and a concave-convex microstructure layer.
<Production of Optical Film>
A 10 mass-% solution of a mixture of Liquid A and Liquid B of SCR-1011 (produced by Shin-Etsu Silicone) at a mass ratio of 1:1 in propylene glycol monomethyl ether 2-acetate (PGMEA) was coated as a material for an adhesive layer on the concave-convex imparting sheet with a bar coater to a dry film thickness of 100 nm, and heated at 120° C. for 2 h to obtain an optical film.
<Production of Laminate for Testing>
A laminate for testing was produced by layering an optical film on a 2 inch sapphire wafer, bonding them together at 80° C. and 4 bar using a vacuum laminating machine (MVLP, produced by Meiki Co., Ltd.), and then peeling the G2 mold at a peel angle of 80° at 5° C.

The respective characteristics of the produced laminate for testing were evaluated. The results are shown in the following Table 4.

Example 2C

Production of Laminate for Testing

A laminate for testing was produced by layering an optical film obtained identically with Example 1C on a 5 cm glass sheet with a vapor-deposited 200 nm ITO film, bonding them together at 160° C. and 3 bar using a vacuum laminating machine, and peeling the G2 mold at a peel angle of 90° at 30° C.

The respective characteristics of the produced laminate for testing were evaluated. The results are shown in the following Table 4.

Example 3C

Production of Concave-Convex Microstructure Layer

Identical with Example 1C, except that NRC-3132P was changed to NRC-401B (a 20 mass-% solution of a resin containing oxidized zirconia nanoparticles in propylene glycol monomethyl ether 2-acetate, produced by Nagase ChemteX Corporation).

<Production of Optical Film>

A 10 mass-% solution of a mixture of Liquid A and Liquid B of ASP-1111 (produced by Shin-Etsu Silicone) at a weight ratio of 1:1 in propylene glycol monomethyl ether 2-acetate (PGMEA) was coated as a material for an adhesive layer on the concave-convex imparting sheet with a bar coater to a dry film thickness of 100 nm, and heated at 120° C. for 2 h to produce an adhesive layer.

<Production of Laminate for Testing>

A laminate for testing was produced by layering an optical film on a 2 inch sapphire wafer, bonding them together at 120° C. and 5 bar using a vacuum laminating machine, and peeling the G2 mold at a peel angle of 45° at 10° C.

The respective characteristics of the produced laminate for testing were evaluated. The results are shown in the following Table 4.

Example 4C

Production of Concave-Convex Imparting Sheet

Identical with Example 3C.

<Production of Adhesive Layer>

Identical with Example 1C, except that for a concave-convex imparting sheet KER 3000-A (produced by Shin-Etsu Chemical Co., Ltd.) was used, and the film thickness was adjusted to 100 nm.

<Production of Laminate for Testing>

A laminate for testing was produced by layering an optical film on a 2 inch sapphire wafer, bonding them together at 120° C. and 3 bar using a vacuum laminating machine, and peeling the G2 mold at a peel angle of 120° at 30° C.

The respective characteristics of the produced laminate for testing were evaluated. The results are shown in the following Table 4.

Example 5C

Production of Concave-Convex Imparting Sheet

A curable composition was obtained by adding and mixing well 68 parts by mass of 1,2-ethanedithiol (produced by Tokyo Chemical Industry Co., Ltd.), 32 parts by mass of tetravinylsilane (produced by Shin-Etsu Silicone), 1.5 parts by mass of 2-hydroxy-2-methyl-1-phenyl-propan-1-one (Darocure® 1173, produced by BASF SE), and 0.0025 part by mass of N-nitrosophenylhydroxyamine aluminum salt (Q-1301, produced by Wako Pure Chemical Industries, Ltd.). The composition was coated on a mold produced identically with Example 1C using a bar coater, and cured through exposure to light at 1,000 mJ/cm$^2$ using a metal halide lamp (CV-110Q-G, produced by Fusion UV Systems Japan) to obtain a concave-convex imparting sheet.

<Production of Optical Film>

A 10 mass-% solution of ARONIX 0239-F (Toagosei Chemical Industry Co., Ltd.) in propylene glycol monomethyl ether 2-acetate (PGMEA) was coated as a material for an adhesive layer on the concave-convex imparting sheet with a bar coater to a dry film thickness of 150 nm, and cured through exposure to light at 300 mJ/cm$^2$ using a metal halide lamp (CV-110Q-G, produced by Fusion UV Systems Japan) to obtain an optical film.

<Production of Laminate for Testing>

A laminate for testing was produced by layering an optical film on a 2 inch sapphire wafer, bonding them together at 140° C. and 4 bar using a vacuum laminating machine, and peeling the G2 mold at a peel angle of 80° at 50° C.

The respective characteristics of the produced laminate for testing were evaluated. The results are shown in the following Table 4.

Example 6C

Production of Concave-Convex Imparting Sheet

Identical with Example 3C.

<Production of Optical Film>

Identical with Example 4C.

<Production of Laminate for Testing>

A laminate for testing was produced by layering an optical film on a 2 inch sapphire wafer, bonding them together at 40° C. and 3 bar using a vacuum laminating machine, and peeling the G2 mold at a peel angle of 60° at 20° C.

The respective characteristics of the produced laminate for testing were evaluated. The results are shown in the following table.

Example 7C

Production of Laminate for Testing

A laminate for testing was produced by layering an optical film produced identically with Example 1C on a 2 inch sapphire wafer, bonding them together at 140° C. and 3 bar using a vacuum laminating machine, and peeling the G2 mold at a peel angle of 60° at 80° C.

The respective characteristics of the produced laminate for testing were evaluated. The results are shown in the following table.

TABLE 1

| | | | Adhesive layer (A layer) | | | Concave-convex microstructure layer (B layer) | |
| | Substrate | | | | Inorganic particle | | |
| Example No. | Material | Refractive index | Material | Refractive index | Thickness (nm) | particle size (nm) | Material | Refractive index |
|---|---|---|---|---|---|---|---|---|
| 1A | sapphire | 1.76 | tetramethoxysilane condens. prdct (with TC-750) | 1.40 | 100 | — | TiO$_2$ nanoparticle/ SiO$_2$ condens. prdct | 1.84 |

TABLE 1-continued

| | | | | | | | | |
|---|---|---|---|---|---|---|---|---|
| 2A | sapphire | 1.76 | tetramethoxysilane condens. prdct (with ZC-150) | 1.40 | 50 | — | $TiO_2$ nanoparticle/ $SiO_2$ condens. prdct | 1.72 |
| 3A | sapphire | 1.76 | tetramethoxysilane condens. prdct (with TC-750) | 1.40 | 40 | — | $TiO_2$ nanoparticle/ $SiO_2$ condens. prdct | 1.61 |
| 4A | sapphire | 1.76 | tetramethoxysilane condens. prdct (with TC-750) | 1.40 | 200 | — | titanium oxide oligomer | 1.88 |
| 5A | sapphire | 1.76 | ethanedithiol + tetravinylsilane crosslinkd. prdct | 1.64 | 100 | — | benzenedithiol + tetravinylsilane crosslinkd. prdct | 1.72 |
| 6A | sapphire | 1.76 | (3-mercaptopropyl) trimethoxysilane condens. prdct | 1.58 | 90 | — | benzenedithiol + tetravinylsilane crosslinkd. prdct | 1.72 |
| 7A | sapphire | 1.76 | tetramethoxysilane condens. prdct (with TC-750) | 1.40 | 1000 | — | $TiO_2$ nanoparticle/ $SiO_2$ condens. prdct | 1.84 |
| 8A | sapphire | 1.76 | tetramethoxysilane condens. prdct (with TC-750) | 1.40 | 100 | — | $TiO_2$ nanoparticle/ $SiO_2$ condens. prdct | 1.52 |
| 9A | sapphire | 1.76 | phenyl-modified silicone (SCR-1016) | 1.53 | 150 | — | $TiO_2$ nanoparticle/ $SiO_2$ condens. prdct | 1.84 |
| 10A | sapphire | 1.76 | polyimide resin | 1.60 | 95 | — | $TiO_2$ nanoparticle/ $SiO_2$ condens. prdct | 1.84 |
| 11A | ITO | 1.98 | phenyl-modified silicone (SCR-1011) | 1.53 | 50 | — | NRC-3132P | 1.91 |
| 12A | sapphire | 1.76 | phenyl-modified silicone (SCR-1011) + $TiO_2$ particle 20 wt % | 1.57 | 100 | 6 | NRC-3132P | 1.91 |
| 13A | sapphire | 1.76 | phenyl-modified silicone (SCR-1011) + $TiO_2$ particle 20 wt % | 1.57 | 50 | 6 | NRC-3132P | 1.91 |
| 14A | sapphire | 1.76 | phenyl-modified silicone (SCR-1011) + $TiO_2$ particle 30 wt % | 1.60 | 100 | 6 | NRC-3132P | 1.91 |
| 15A | sapphire | 1.76 | phenyl-modified silicone (SCR-1011) + $TiO_2$ particle 30 wt % | 1.60 | 50 | 6 | NRC-3132P | 1.91 |
| 16A | sapphire | 1.76 | phenyl-modified silicone (SCR-1011) + $TiO_2$ particle 20 wt % | 1.57 | 200 | 6 | NRC-3132P | 1.91 |
| 17A | sapphire | 1.76 | phenyl-modified silicone (SCR-1011) | 1.53 | 30 | — | NRC-3132P | 1.91 |
| 18A | sapphire | 1.76 | phenyl-modified silicone (SCR-1011) + $TiO_2$ particle 20 wt % | 1.57 | 250 | 6 | NRC-3132P | 1.91 |

| | Concave-convex microstructure layer (B layer) | | | | | |
|---|---|---|---|---|---|---|
| Example No. | Inorganic particle particle size (nm) | Inorganic particle content (mass-%) | Microstructure height (nm) | Microstructure width (nm) | Sealing material Material | Adhesive layer forming mode |
| 1A | 4 | 92 | 700 | 640 | SCR-1016 | coating |
| 2A | 4 | 76 | 300 | 640 | SCR-1016 | coating |
| 3A | 4 | 54 | 1300 | 640 | SCR-1016 | coating |
| 4A | — | — | 700 | 640 | SCR-1016 | coating |
| 5A | — | — | 700 | 640 | SCR-1016 | coating |
| 6A | — | — | 700 | 640 | SCR-1016 | coating |
| 7A | 4 | 92 | 700 | 640 | SCR-1016 | coating |
| 8A | 4 | 33 | 700 | 640 | SCR-1016 | coating |
| 9A | 4 | 92 | 700 | 640 | SCR-1016 | coating |
| 10A | 4 | 92 | 700 | 640 | SCR-1016 | coating |
| 11A | 40 | — | 700 | 640 | SCR-1016 | film |
| 12A | 40 | — | 700 | 640 | SCR-1016 | film |
| 13A | 40 | — | 700 | 640 | SCR-1016 | film |
| 14A | 40 | — | 700 | 640 | SCR-1016 | film |
| 15A | 40 | — | 700 | 640 | SCR-1016 | film |

TABLE 1-continued

| | | | | | | | |
|---|---|---|---|---|---|---|---|
| 16A | 40 | — | 700 | 640 | SCR-1016 | film | |
| 17A | 40 | — | 700 | 640 | SCR-1016 | film | |
| 18A | 40 | — | 700 | 640 | SCR-1016 | film | |

| Example No. | Inorganic substance content in adhesive layer (mass-%) | Inorganic substance content in concave-convex microstructure layer (mass-%) | Evaluation result 1 | | | | | Evaluation result 2 | | | Porosity of concave-convex microstructure layer |
|---|---|---|---|---|---|---|---|---|---|---|---|
| | | | Adhesiveness | Dicing property | High/low thermal cycle resistance | Light resistance | Light extraction improvement | Refractive index of adhesive layer | Elastic modulus of adhesive layer | Refractive index of concave-convex microstructure layer | |
| 1A | 85 | 95 | 1A | 1A | 1A | B | 3A | X | OK | Z2 | 1A |
| 2A | 85 | 95 | 1A | 1A | 1A | B | 2A | X | OK | Z2 | 1A |
| 3A | 85 | 95 | 1A | 1A | 1A | B | 1A | X | OK | Z1 | 2A |
| 4A | 85 | 90 | 1A | 1A | 1A | B | 2A | X | OK | Z2 | 1A |
| 5A | 20 | 15 | 1A | 1A | C | B | 2A | Z1 | OK | Z2 | 2A |
| 6A | 30 | 15 | 1A | 1A | C | B | 2A | Y | OK | Z2 | 2A |
| 7A | 85 | 95 | 1A | 1A | B | B | B | X | OK | Z2 | 1A |
| 8A | 85 | 95 | 1A | 1A | 1A | B | 1A | X | OK | Y | 2A |
| 9A | 30 | 95 | 2A | 1A | 2A | B | 3A | Y | OK | Z2 | 1A |
| 10A | 0 | 95 | B | 1A | B | B | 3A | Z1 | OK | Z2 | 1A |
| 11A | 29 | 85 | 2A | 1A | 2A | B | 4A | Y | OK | Z2 | 2A |
| 12A | 48 | 85 | 2A | 1A | 1A | B | 4A | Y | OK | Z2 | 2A |
| 13A | 48 | 85 | 2A | 1A | 1A | B | 4A | Y | OK | Z2 | 2A |
| 14A | 58 | 85 | 2A | 1A | 1A | B | 4A | Z1 | OK | Z2 | 2A |
| 15A | 58 | 85 | 2A | 1A | 1A | B | 4A | Z1 | OK | Z2 | 2A |
| 16A | 48 | 85 | 2A | 1A | 1A | B | 3A | Y | OK | Z2 | 2A |
| 17A | 29 | 85 | 2A | 1A | 2A | B | 4A | Y | OK | Z2 | 2A |
| 18A | 48 | 85 | 2A | 1A | 1A | B | 2A | Y | OK | Z2 | 2A |

| Example No. | Substrate | | Adhesive layer (A layer) | | | Inorganic particle particle size (nm) | Concave-convex microstructure layer (B layer) | |
|---|---|---|---|---|---|---|---|---|
| | Material | Refractive index | Material | Refractive index | Thickness (nm) | | Material | Refractive index |
| 19A | sapphire | 1.76 | phenyl-modified silicone (SCR-1011) | 1.53 | 250 | — | NRC-3132P | 1.91 |
| 20A | sapphire | 1.76 | phenyl-modified silicone (SCR-1011) + TiO$_2$ particle 40 wt % | 1.63 | 100 | 6 | TiO$_2$ nanoparticle/ SiO$_2$ condens. prdct | 1.84 |
| 21A | sapphire | 1.76 | phenyl-modified silicone (SCR-1011) + TiO$_2$ particle 40 wt % | 1.63 | 50 | 6 | TiO$_2$ nanoparticle/ SiO$_2$ condens. prdct | 1.84 |
| 22A | sapphire | 1.76 | phenyl-modified silicone (SCR-1011) | 1.53 | 30 | — | NRC-3132P | 1.91 |
| 23A | sapphire | 1.76 | — | — | — | — | — | — |
| 24A | sapphire | 1.76 | phenyl-modified silicone (SCR-1011) | 1.53 | 30 | — | NRC-3132P | 1.91 |
| 25A | sapphire | 1.76 | — | — | — | — | — | — |
| 26A | sapphire | 1.76 | — | — | — | — | phenyl-modified silicone (SCR-1011) + TiO$_2$ particle 40 wt % | 1.63 |
| 27A | sapphire | 1.76 | phenyl-modified silicone (SCR-1011) + TiO$_2$ particle 40 wt % | 1.63 | 100 | 6 | phenyl-modified silicone (SCR-1011) | 1.53 |
| 28A | sapphire | 1.76 | phenyl-modified silicone (SCR-1011) + TiO$_2$ particle 30 wt % | 1.60 | 100 | 6 | phenyl-modified silicone (SCR-1011) | 1.53 |
| 29A | sapphire | 1.76 | — | — | — | — | phenyl-modified silicone (SCR-1011) + TiO$_2$ particle 20 wt % | 1.57 |
| 30A | sapphire | 1.76 | ethanedithiol + tetravinylsilane crosslinkd. prdct | 1.64 | 100 | — | TiO$_2$ nanoparticle/ SiO$_2$ condens. prdct | 1.72 |

TABLE 1-continued

| | | | | | | | | |
|---|---|---|---|---|---|---|---|---|
| 31A | sapphire | 1.76 | phenyl-modified silicone (SCR-1011) + TiO$_2$ particle 10 wt % | 1.55 | 100 | 6 | NRC-3132P | 1.91 |
| 32A | sapphire | 1.76 | phenyl-modified silicone (SCR-1011) + TiO$_2$ particle 10 wt % | 1.55 | 200 | 6 | NRC-3132P | 1.91 |
| 33A | sapphire | 1.76 | phenyl-modified silicone (SCR-1011) | 1.53 | 50 | — | phenyl-modified silicone (SCR-1011) + TiO$_2$ particle 40 wt % | 1.63 |
| 34A | sapphire | 1.76 | phenyl-modified silicone (SCR-1011) + TiO$_2$ particle 30 wt % | 1.60 | 50 | 6 | TiO$_2$ nanoparticle/ SiO$_2$ condens. prdct | 1.84 |
| 35A | sapphire | 1.76 | phenyl-modified silicone (SCR-1011) + TiO$_2$ particle 10 wt % | 1.55 | 150 | 6 | NRC-3132P | 1.91 |

Concave-convex microstructure layer (B layer)

| Example No. | Inorganic particle particle size (nm) | Inorganic particle content (mass-%) | Microstructure height (nm) | Microstructure width (nm) | Sealing material Material | Adhesive layer forming mode |
|---|---|---|---|---|---|---|
| 19A | 40 | — | 700 | 640 | SCR-1016 | film |
| 20A | 4 | 92 | 700 | 640 | SCR-1016 | coating |
| 21A | 4 | 92 | 700 | 640 | SCR-1016 | coating |
| 22A | 40 | — | 700 | 640 | No | film |
| 23A | — | — | — | — | No | — |
| 24A | 40 | — | No | No | SCR-1016 | film |
| 25A | — | — | — | — | SCR-1016 | film |
| 26A | 4 | 40 | 700 | 640 | SCR-1016 | — |
| 27A | 4 | 33 | 700 | 640 | SCR-1016 | coating |
| 28A | — | 0 | 700 | 640 | SCR-1016 | film |
| 29A | 4 | 20 | 700 | 640 | SCR-1016 | — |
| 30A | 4 | 76 | 700 | 640 | SCR-1016 | coating |
| 31A | 40 | — | 700 | 640 | SCR-1016 | film |
| 32A | 40 | — | 700 | 640 | SCR-1016 | film |
| 33A | 4 | 40 | 700 | 640 | SCR-1016 | film |
| 34A | 4 | 92 | 700 | 640 | SCR-1016 | film |
| 35A | 40 | — | 700 | 640 | SCR-1016 | film |

| | | | Evaluation result 1 | | | | Evaluation result 2 | | | |
|---|---|---|---|---|---|---|---|---|---|---|
| Example No. | Inorganic substance content in adhesive layer (mass-%) | Inorganic substance content in concave-convex microstructure layer (mass-%) | Adhesiveness | Dicing property | High/low thermal cycle resistance | Light resistance | Light extraction improvement | Refractive index of adhesive layer | Elastic modulus of adhesive layer | Refractive index of concave-convex microstructure layer | Porosity of concave-convex microstructure layer |
| 19A | 29 | 85 | 2A | 1A | 2A | B | 2A | Y | OK | Z2 | 2A |
| 20A | 68 | 95 | B | B | B | B | 2A | Z1 | OK | Z2 | 1A |
| 21A | 68 | 95 | B | B | B | B | 2A | Z1 | OK | Z2 | 1A |
| 22A | 29 | 85 | 2A | 1A | 2A | B | C | Y | OK | Z2 | 1A |
| 23A | — | 85 | — | — | 1A | B | C | — | — | — | — |
| 24A | 29 | 85 | 2A | 1A | 2A | B | B | Y | OK | Z2 | 2A |
| 25A | — | — | — | — | 1A | B | B | — | — | — | — |
| 26A | — | 68 | B | B | C | B | 1A | — | — | Z1 | 2A |
| 27A | 68 | 29 | B | B | B | B | B | Z1 | NG | Y | 2A |
| 28A | 58 | 29 | 2A | 1A | 1A | B | B | Z1 | NG | Y | 2A |
| 29A | — | 48 | 1A | 1A | 1A | 1A | B | — | — | Y | 2A |
| 30A | 20 | 95 | 1A | 1A | 1A | B | 2A | Z1 | OK | Z2 | 2A |
| 31A | 38 | 85 | 2A | 1A | 2A | B | 4A | Y | OK | Z2 | 2A |
| 32A | 38 | 85 | 2A | 1A | 2A | B | 3A | Y | OK | Z2 | 2A |
| 33A | 29 | 68 | 2A | 1A | 2A | B | 1A | Y | OK | Z1 | 2A |
| 34A | 58 | 95 | 2A | 1A | 1A | B | 2A | Z1 | OK | Z2 | 1A |
| 35A | 38 | 85 | 2A | 1A | 2A | B | 3A | Y | OK | Z2 | 2A |

TABLE 2

| Example No. | Substrate | | Adhesive layer | | | Concave-convex microstructure layer | | |
|---|---|---|---|---|---|---|---|---|
| | | | | | Thickness | | Refractive | Inorganic particle particle size |
| | Material | Refractive index | Material | Refractive index | (nm) | Material | index | (nm) |
| 1A' | sapphire | 1.76 | phenyl-modified silicone (SCR-1011) | 1.53 | 100 | TiO$_2$ nanoparticle/ SiO$_2$ condens. prdct | 1.73 | 4 |
| 2A' | sapphire | 1.76 | aminopropyl-trimethoxysilane condens. prdct (KBM-903) | 1.42 | 40 | TiO$_2$ nanoparticle/ SiO$_2$ condens. prdct | 1.74 | 40 |
| 3A' | sapphire | 1.76 | phenyl-modified silicone (SCR-1011) | 1.53 | 70 | NRC-3132P | 1.91 | 40 |
| 4A' | ITO | 1.98 | phenyl-modified silicone (SCR-1011) | 1.53 | 100 | NRC-3132P | 1.91 | 40 |
| 5A' | ITO | 1.98 | aminopropyl-trimethoxysilane condens. prdct (KBM-903) | 1.42 | 50 | TiO$_2$ nanoparticle/ SiO$_2$ condens. prdct | 1.62 | 4 |
| 6A' | ITO | 1.98 | phenyl-modified silicone (SCR-1011) | 1.53 | 100 | ZrO$_2$ nanoparticle/ SiO$_2$ condens. prdct | 1.68 | 3 |
| 7A' | ITO | 1.98 | phenyl-modified silicone (SCR-1011) | 1.53 | 200 | TiO$_2$ nanoparticle/ SiO$_2$ condens. prdct | 1.84 | 4 |
| 8A' | ITO | 1.98 | phenyl-modified silicone (SCR-1011) | 1.53 | 100 | BaTiO$_3$ nanoparticle/ SiO$_2$ condens. prdct | 1.75 | 10 |
| 9A' | ITO | 1.98 | acrylic resin (UVX-7000) | 1.51 | 90 | NRC-3132P | 1.91 | 40 |
| 10A' | ITO | 1.98 | phenyl-modified silicone (SCR-1011) | 1.53 | 70 | NRC-3132P | 1.91 | 40 |
| 11A' | ITO | 1.98 | phenyl-modified silicone (SCR-1011) | 1.53 | 50 | NRC-3132P | 1.91 | 40 |
| 12A' | sapphire | 1.76 | No | — | — | benzenedithiol + tetravinylsilane crosslinkd. prdct | 1.72 | — |

| | Concave-convex microstructure layer | | | | Photocatalytically inactive layer on concave-convex microstructure layer | | Photocatalytically inactive layer between concave-convex microstructure layer and adhesive layer | |
|---|---|---|---|---|---|---|---|---|
| Example No. | Inorganic particle content (mass-%) | Microstructure height (nm) | Microstructure width (nm) | Sealing material Material | Material | Film thickness (nm) | Material | Film thickness |
| 1A' | 72 | 700 | 640 | SCR-1016 | SiO$_2$ | 15 | — | — |
| 2A' | 72 | 700 | 640 | SCR-1016 | SiO$_2$ | 15 | SiO$_2$ | 15 |
| 3A' | — | 700 | 640 | SCR-1016 | SiO$_2$ | 25 | SiO$_2$ | 25 |
| 4A' | — | 700 | 640 | SCR-1016 | SiO$_2$ | 3 | SiO$_2$ | 3 |
| 5A' | 44 | 700 | 640 | SCR-1016 | SiO$_2$ | 50 | SiO$_2$ | 30 |
| 6A' | 74 | 700 | 640 | SCR-1016 | — | — | — | — |
| 7A' | 92 | 700 | 640 | SCR-1016 | SiO$_2$ | 15 | SiO$_2$ | 15 |
| 8A' | 98 | 700 | 640 | SCR-1016 | — | — | — | — |
| 9A' | — | 700 | 640 | SCR-1016 | SiO$_2$ | 15 | SiO$_2$ | 15 |
| 10A' | — | 700 | 640 | SCR-1016 | Al$_2$O$_3$ | 10 | Al$_2$O$_3$ | 10 |
| 11A' | — | 700 | 640 | SCR-1016 | SiO$_2$ | 145 | SiO$_2$ | 145 |
| 12A' | — | 700 | 640 | SCR-1016 | — | — | — | — |

TABLE 2-continued

| Example No. | Inorganic substance content in adhesive layer (mass-%) | Inorganic substance content in concave-convex microstructure layer (mass-%) | Refractive index of adhesive layer | Elastic modulus of adhesive layer | Refractive index of concave-convex microstructure layer | Porosity of concave-convex microstructure layer | Adhesive-ness | Dicing property | High/low thermal cycle resistance | Light resistance |
|---|---|---|---|---|---|---|---|---|---|---|
| 1A' | 29 | 95 | Y | OK | Z2 | 1A | 2A | 1A | 2A | 1A |
| 2A' | 28 | 95 | X | OK | Z2 | 1A | 2A | B | 1A | 1A |
| 3A' | 29 | 85 | Y | OK | Z2 | 2A | 2A | 1A | 2A | 1A |
| 4A' | 29 | 85 | Y | OK | Z2 | 2A | 2A | 1A | 2A | 1A |
| 5A' | 28 | 95 | X | OK | Z1 | 1A | 2A | B | 1A | 1A |
| 6A' | 29 | 95 | Y | OK | Z2 | 1A | 2A | 1A | 2A | 1A |
| 7A' | 29 | 95 | Y | OK | Z2 | 1A | 2A | 1A | 2A | 1A |
| 8A' | 29 | 95 | Y | OK | Z2 | 1A | 2A | 1A | 2A | 1A |
| 9A' | 0 | 85 | Y | OK | Z2 | 2A | 1A | 1A | B | 1A |
| 10A' | 29 | 85 | Y | OK | Z2 | 2A | 2A | 1A | 2A | 1A |
| 11A' | 29 | 85 | Y | OK | Z2 | 2A | 2A | B | 2A | 1A |
| 12A' | — | 15 | — | — | Z2 | 2A | B | 1A | C | C |

TABLE 3

| | Adhesive layer | | | | | Concave-convex microstructure layer | |
|---|---|---|---|---|---|---|---|
| Example No. | Material | | Refractive index | Thickness (nm) | Inorganic particle particle size (nm) | Material | Inorganic particle |
| 1B | phenyl-modified silicone (SCR-1011) | | 1.53 | 100 | — | NRC-3132P | titania |
| 2B | aminopropyltrimethoxysilane condens. prdct (KBM-903) | | 1.42 | 50 | — | NRC-3132P | titania |
| 3B | acrylic resin (UVX-7000) | | 1.51 | 100 | — | NRC-3132P | titania |
| 4B | phenyl-modified silicone (SCR-1011) | | 1.53 | 100 | — | NRZ-401B | zirconia |
| 5B | aminopropyltrimethoxysilane condens. prdct (KBM-903) | | 1.42 | 100 | — | T-3072 + TEOS | titania, silica |
| 6B | phenyl-modified silicone (SCR-1011) | | 1.53 | 1000 | — | prism sheet | — |
| 7B | phenyl-modified silicone (SCR-1011) + TiO$_2$ particle 40 wt % | | 1.63 | 100 | 6 | NRC-3132P | titania |

| Example No. | Refractive index | Inorganic particle average primary particle size (nm) | Inorganic particle content (mass-%) | Microstructure height (nm) | Microstructure width (nm) | Surface roughness Rz (nm) |
|---|---|---|---|---|---|---|
| 1B | 1.91 | 40 | 85 | 700 | 700 | 20 |
| 2B | 1.91 | 40 | 85 | 700 | 700 | 20 |
| 3B | 1.91 | 40 | 85 | 700 | 700 | 20 |
| 4B | 1.74 | 50 | 50 | 700 | 700 | 30 |
| 5B | 1.7 | — | 100 | 700 | 700 | 50 |
| 6B | 1.4 | — | — | 700 | 700 | 200 |
| 7B | 1.91 | 40 | 85 | 700 | 700 | 20 |

| Example No. | Inorganic substance content in adhesive layer (mass-%) | Inorganic substance content in concave-convex microstructure layer (mass-%) | Surface roughness of concave-convex microstructure layer Rz | Refractive index of adhesive layer | Adhesive-ness | Light resistance | Light extraction | Heat resistance | Roughness of interface between concave-convex microstructure layer/adhesive layer | Refractive index of concave-convex microstructure layer |
|---|---|---|---|---|---|---|---|---|---|---|
| 1B | 29 | 85 | 1A | Y | 1A | 1A | 1A | 1A | A | Z2 |
| 2B | 45 | 85 | B | X | 1A | 1A | 1A | 1A | B | Z2 |
| 3B | 0 | 85 | 1A | Y | 1A | 1A | 1A | 1A | A | Z2 |
| 4B | 29 | 70 | B | Y | 1A | 1A | 1A | 1A | B | Z2 |
| 5B | 45 | 95 | B | X | 1A | 1A | 1A | 1A | B | Z2 |
| 6B | 29 | 0 | 1A | Y | 1A | C | C | C | A | X |
| 7B | 69 | 85 | 1A | Z1 | C | — | — | — | A | Z2 |

TABLE 4

| Example No. | Substrate Material | Substrate Refractive index | Adhesive layer Material | Adhesive layer Refractive index | Adhesive layer Thickness (nm) | Glass transition temp. (°C.) | Bonding temp. (°C.) | Peel temp. (°C.) | Concave-convex microstructure layer Material | Concave-convex microstructure layer Refractive index |
|---|---|---|---|---|---|---|---|---|---|---|
| 1C | sapphire | 1.76 | SCR-1011 | 1.53 | 100 | 44 | 80 | 5 | NRC-3132P | 1.93 |
| 2C | ITO | 1.98 | SCR-1011 | 1.53 | 100 | 44 | 160 | 30 | NRC-3132P | 1.93 |
| 3C | sapphire | 1.76 | ASP1111 | 1.56 | 100 | 25 | 120 | 10 | NRC-401B | 1.74 |
| 4C | sapphire | 1.76 | KER-3000-A | 1.43 | 100 | 86 | 120 | 30 | NRC-401B | 1.74 |
| 5C | sapphire | 1.76 | Aronix-0239-F | 1.48 | 100 | 105 | 140 | 50 | condens. prdct of 1,2-ethane-dithiol and tetravinyl-silane | 1.64 |
| 6C | sapphire | 1.76 | KER-3000-A | 1.43 | 100 | 86 | 40 | 20 | NRC-401B | 1.74 |
| 7C | sapphire | 1.76 | SCR-1011 | 1.53 | 100 | 44 | 140 | 80 | NRC-3132P | 1.93 |

| Example No. | Concave-convex microstructure layer Metal oxide particle type | Concave-convex microstructure layer Inorganic particle particle size (nm) | Concave-convex microstructure layer Microstructure height (nm) | Concave-convex microstructure layer Microstructure width (nm) | Inorganic substance content in adhesive layer (mass-%) | Inorganic substance content in concave-convex microstructure layer (mass-%) | Evaluation result Transfer | Evaluation result Adhesiveness |
|---|---|---|---|---|---|---|---|---|
| 1C | $TiO_2$ | 40 | 700 | 700 | 29 | 85 | 2A | 2A |
| 2C | $TiO_2$ | 40 | 700 | 700 | 29 | 85 | 2A | 2A |
| 3C | $ZrO_2$ | 40 | 700 | 700 | 29 | 82 | 2A | 1A |
| 4C | $ZrO_2$ | 40 | 700 | 700 | 28 | 82 | 1A | 1A |
| 5C | No | — | 700 | 700 | 0 | 20 | 2A | 2A |
| 6C | $ZrO_2$ | 40 | 700 | 700 | 28 | 82 | C | C |
| 7C | $TiO_2$ | 40 | 700 | 700 | 29 | 85 | C | C |

INDUSTRIAL APPLICABILITY

A semiconductor light emitting device and an optical film according to the invention are superior in a dicing property for singulation, and high/low thermal cycle resistance, and further exhibits a brightness improving effect owing to a high light extraction efficiency. Consequently, it can be applied favorably to fields, such as a white LED illumination, and a display backlight.

The present disclosure includes also the following:

[1-1] A semiconductor light emitting device comprising a growth substrate, a semiconductor layer on a surface of the growth substrate, an adhesive layer on the other surface of the growth substrate, and a concave-convex microstructure layer bonded with the growth substrate through the adhesive layer.

[1-2] The semiconductor light emitting device according to [1-1] above, wherein the refractive index of the concave-convex microstructure layer is 1.60 or more.

[1-3] The semiconductor light emitting device according to [1-1] or [1-2] above, wherein the concave-convex microstructure layer includes a skeleton composed of a metal oxide.

[1-4] The semiconductor light emitting device according to any one of [1-1] to [1-3] above, wherein the height of a microstructure in the concave-convex microstructure layer is from 300 nm to 1,500 nm.

[1-5] The semiconductor light emitting device according to any one of [1-1] to [1-4] above, wherein the growth substrate is a sapphire substrate.

[1-6] The semiconductor light emitting device according to any one of [1-1] to [1-5] above, wherein the adhesive layer has a hydrogen-bonding functional group.

[1-7] The semiconductor light emitting device according to [1-6] above, wherein the hydrogen-bonding functional group is one or more kinds selected from the group consisting of a hydroxy group, a thiol group, an amido group, an amino group, a carbonyl group, and a hydrogen atom directly bonded to a silicon atom.

[1-8] The semiconductor light emitting device according to any one of [1-1] to [1-7] above, wherein the film thickness of the adhesive layer is from 1 nm to 200 nm.

[2-1] A semiconductor light emitting device comprising a growth substrate, a semiconductor layer on a surface of the growth substrate, an adhesive layer on the other surface of the growth substrate, and a concave-convex microstructure layer bonded with the growth substrate through the adhesive layer.

[2-2] The semiconductor light emitting device according to [2-1] above, wherein the growth substrate is a sapphire substrate.

[2-3] A semiconductor light emitting device comprising a growth substrate, a semiconductor layer on a surface of the growth substrate, a transparent electroconductive layer on the semiconductor layer, an adhesive layer on the transparent electroconductive layer, and a concave-convex microstructure layer bonded with the transparent electroconductive layer through the adhesive layer.

[2-4] The semiconductor light emitting device according to [2-3] above, wherein the transparent electroconductive layer is composed of ITO ($In_2O_3$—$SnO_2$).

[2-5] The semiconductor light emitting device according to any one of [2-1] to [2-4] above, wherein the refractive index of the concave-convex microstructure layer is 1.60 or more.

[2-6] The semiconductor light emitting device according to any one of [2-1] to [2-5] above, wherein the concave-convex microstructure layer includes a skeleton composed of a metal oxide.

[2-7] The semiconductor light emitting device according to any one of [2-1] to [2-6] above, wherein the height of a microstructure in the concave-convex microstructure layer is from 300 nm to 1,500 nm.

[2-8] The semiconductor light emitting device according to any one of [2-1] to [2-7] above, wherein the adhesive layer has a hydrogen bonding functional group.

[2-9] The semiconductor light emitting device according to [2-8] above, wherein the hydrogen-bonding functional group is one or more kinds selected from the group consisting of a hydroxy group, a thiol group, an amido group, an amino group, a carbonyl group, and a hydrogen atom directly bonded to a silicon atom.

[2-10] The semiconductor light emitting device according to any one of [2-1] to [2-9] above, wherein the film thickness of the adhesive layer is from 1 nm to 200 nm.

[2-11] The semiconductor light emitting device according to any one of [2-1] to [2-10] above, further comprising a photocatalytically inactive layer on a surface of the concave-convex microstructure layer opposite to the surface on which the adhesive layer is formed.

[2-12] The semiconductor light emitting device according to any one of [2-1] to [2-11] above, further comprising the photocatalytically inactive layer between the adhesive layer and the concave-convex microstructure layer.

[2-13] The semiconductor light emitting device according to [2-11] or [2-12] above, wherein the photocatalytically inactive layer is composed of at least one kind of material selected from the group consisting of silicon oxide, aluminum oxide, zirconium oxide, silicon nitride, aluminum nitride, ITO ($In_2O_3$—$SnO_2$), and AZO (ZnO—$Al_2O_3$).

[2-14] The semiconductor light emitting device according to [2-11] to [2-13] above, wherein the film thickness of the photocatalytically inactive layer is from 1 nm to 150 nm.

[2-15] A method for producing a semiconductor light emitting device comprising forming a laminate comprising a growth substrate and a semiconductor layer on a surface of the growth substrate, and forming a concave-convex microstructure layer on the other surface of the growth substrate in the laminate with interpositioning of an adhesive layer.

[2-16] A method for producing a semiconductor light emitting device comprising forming a laminate comprising a growth substrate, a semiconductor layer on a surface of the growth substrate, and a transparent electroconductive layer formed on the semiconductor layer, and forming a concave-convex microstructure layer on a surface opposite to a surface in contact with the semiconductor layer of the transparent electroconductive layer in the laminate, with interpositioning of an adhesive layer.

[3-1] An optical film comprising a concave-convex microstructure lay, which contains a metal oxide and has a concave-convex pattern on a surface, and an adhesive layer with a thickness of 200 nm or less on a surface opposite to the concave-convex pattern of the concave-convex microstructure layer.

[3-2] The optical film according to [3-1] above, wherein the surface roughness Rz of the concave-convex pattern of the concave-convex microstructure layer with respect to a surface, which is adjacent to the adhesive layer, is two-thirds or less of the thickness of the adhesive layer.

[3-3] The optical film according to [3-1] or [3-2] above, wherein the thickness of the adhesive layer is 100 nm or less.

[3-4] The optical film according to any one of [3-1] to [3-3] above, wherein the concave-convex microstructure layer contains a metal oxide at 30 mass-% or more.

[3-5] The optical film according to any one of [3-1] to [3-4] above wherein the concave-convex microstructure layer contains a metal oxide particle with an average particle size of 100 nm or less.

[3-6] The optical film according to [3-5] above, wherein the metal oxide particle is composed of any metal oxide out of titanium oxide, zirconium oxide, and ITO.

[3-7] A method for producing the optical film according to any one of [3-1] to [3-6] above comprising forming a concave-convex microstructure layer by transferring, or casting and curing using a resin mold film with a concave-convex structure, and coating an adhesive layer on a surface opposite to the concave-convex pattern of the concave-convex microstructure layer.

[3-8] A method for producing a light emitting device comprising sticking the optical film according to any one of [3-1] to [3-6] above to a light emitting surface.

[3-9] A light emitting device produced by the producing method according to [3-8] above.

[4-1] An optical film comprising a protective layer, a concave-convex microstructure layer, and an adhesive layer, wherein the adhesive layer has a glass transition temperature of 10° C. or higher; the storage elastic modulus of the adhesive layer at the glass transition temperature+20° C. is 10 MPa or less; and the ratio of the storage elastic modulus of the adhesive layer at the glass transition temperature−20° C. to the storage elastic modulus of the adhesive layer at the glass transition temperature+20° C. is from 3 to 600.

[4-2] The optical film according to [4-1] above, wherein the storage elastic modulus of the adhesive layer at the glass transition temperature−20° C. is 10 MPa or more.

[4-3] The optical film according to [4-1] or [4-2] above, wherein the concave-convex microstructure layer is layered on a surface of the adhesive layer.

[4-4] The optical film according to any one of [4-1] to [4-3] above, wherein the refractive index of the concave-convex microstructure layer is 1.60 or more.

[4-5] The optical film according to any one of [4-1] to [4-4] above, wherein the concave-convex microstructure layer contains a metal oxide nanoparticle.

[5-1] A method for producing a laminate comprising sticking an optical film comprising a protective layer, a concave-convex microstructure layer, and an adhesive layer to a substrate by lamination, wherein the temperature for sticking to the substrate is not lower than the glass transition temperature of the adhesive layer; and thereafter peeling the protective layer, wherein the peeling temperature for the protective layer is not higher than the glass transition temperature of the adhesive layer.

[5-2] The method according to [5-1] above, wherein the protective layer has a concave-convex microstructure.

[5-3] The method according to [5-2] above, wherein the protective layer comprises a base film and a resin mold layer having a concave-convex microstructure.

[5-4] The method according to [5-2] or [5-3] above, wherein the concave-convex microstructure layer is formed by filling up the concave-convex microstructure of the protective layer.

[5-5] The method according to any one of [5-1] to [5-4] above, wherein the concave-convex microstructure layer has a refractive index of 1.60 or more.

[5-6] The method according to any one of [5-1] to [5-5] above, wherein the concave-convex microstructure layer exhibits a refractive index difference of from −0.15 to +0.4 with respect to the refractive index of the substrate as the reference.

[5-7] The method according to any one of [5-1] to [5-6] above, wherein the concave-convex microstructure layer contains a metal oxide nanoparticle.

[5-8] The method according to any one of [5-1] to [5-7] above, wherein the adhesive layer has a glass transition temperature of 0° C. or higher.

[5-9] The method according to any one of [5-1] to [5-8] above, wherein the substrate is a transparent conductive film such as ITO, sapphire, silicon, GaN, and silicon carbide.

[5-10] The method for producing a laminate according to [5-9] above, wherein the substrate is ITO, or sapphire.

REFERENCE SIGNS LIST 1, 2, 3 Semiconductor light emitting device
11, 21, 31 Growth substrate
12, 22, 32 Semiconductor layer
121, 221, 321 n-Semiconductor layer
122, 222, 322 Light emission layer
123, 223, 323 p-Semiconductor layer
13, 23, 33 Adhesive layer
14, 24, 34 Concave-convex microstructure layer
15, 25 n-Electrode
16, 26, 36 p-Electrode
27 Transparent electroconductive layer
28 Photocatalytically inactive layer
39 Insulation layer
4 Optical film
40 Substrate
41 Adhesive layer
42 Concave-convex microstructure layer
43 Protective layer
431 Base film
432 Resin mold layer
5 Light emitter
50 Laminate
T Top
B Bottom
h Height
w Width
t1, t2 Thickness

What is claimed is:

1. A semiconductor light emitting device comprising a semiconductor layer, an A layer, and a B layer, wherein:
    the semiconductor light emitting device is configured such that at least a part of emitted light from the semiconductor layer is emitted outward from the B layer through the A layer,
    the thickness of the A layer is from 1 nm to 200 nm,
    the B layer has a first major surface and a second major surface, while the first major surface faces the A layer and the second major surface has a concave-convex microstructure,
    the B layer contains an inorganic substance at 60 mass-% or more on the basis of the total mass of the B layer, and
    the content of an inorganic substance present in the A layer is lower than the content of the inorganic substance present in the B layer.

2. The semiconductor light emitting device according to claim 1, wherein:
    the refractive index of the B layer is 1.60 or more, and
    the refractive index of the A layer is smaller than the refractive index of the B layer.

3. The semiconductor light emitting device according to claim 1, wherein the elastic modulus of the A layer is smaller than the elastic modulus of the B layer, provided that an elastic modulus is measured based on a sectional elastic modulus profile of the semiconductor light emitting device using an atomic force microscope.

4. The semiconductor light emitting device according to claim 1, wherein the A layer contains an inorganic substance at 60 mass-% or less on the basis of the total mass of the A layer.

5. The semiconductor light emitting device according to claim 4, wherein the A layer contains an inorganic substance at 40 mass-% or less on the basis of the total mass of the A layer.

6. The semiconductor light emitting device according to claim 1, wherein the thickness of the A layer is from 1 nm to 100 nm.

7. The semiconductor light emitting device according to claim 1, wherein the height of the concave-convex microstructure of the B layer is from 300 nm to 1,500 nm.

8. The semiconductor light emitting device according to claim 1, wherein the porosity of the B layer attributable to voids with a major diameter of 50 nm or less present in the B layer is 5% or less.

9. The semiconductor light emitting device according to claim 1, further comprising a C layer either or both of: on the second major surface of the B layer; and between the A layer and the B layer.

10. The semiconductor light emitting device according to claim 9, wherein the C layer contains at least one selected from the group consisting of silicon oxide, aluminum oxide, zirconium oxide, silicon nitride, aluminum nitride, ITO ($In_2O_3$—$SnO_2$), and AZO ($ZnO$—$Al_2O_3$).

11. The semiconductor light emitting device according to claim 9, wherein the thickness of the C layer is from 1 nm to 150 nm.

12. The semiconductor light emitting device according to claim 1, further comprising a sealing material.

13. An optical film for being stuck on at least a part of a light emitting surface of a semiconductor light emitting device, wherein:
    the optical film comprises an A layer and a B layer,
    the thickness of the A layer is from 1 nm to 200 nm,
    the B layer has a first major surface and a second major surface, while the first major surface faces the A layer, and the second major surface has a concave-convex microstructure,
    the A layer contains an inorganic substance at 60 mass-% or less on the basis of the total mass of the A layer,
    the B layer contains an inorganic substance at 60 mass-% or more on the basis of the total mass of the B layer, and
    the content of the inorganic substance present in the A layer is less than the content of the inorganic substance present in the B layer.

14. The optical film according to claim 13, wherein:
    the refractive index of the B layer is 1.60 or more, and
    the refractive index of the A layer is less than the refractive index of the B layer.

15. The optical film according to claim 13, wherein:
    the glass transition temperature of the A layer is 10° C. or more,
    the storage elastic modulus of the A layer at a temperature higher than the glass transition temperature by 20° C. is 10 MPa or less, the ratio of the storage elastic modulus of the A layer at a temperature lower than the glass transition temperature by 20° C. to the storage elastic modulus of the A layer at a temperature higher than the glass transition temperature by 20° C. is from 3 to 600.

16. The optical film according to claim 15, wherein the storage elastic modulus of the A layer at a temperature lower than the glass transition temperature by 20° C. is 10 MPa or more.

17. The optical film according to claim 13, wherein the elastic modulus of the A layer is smaller than the elastic modulus of the B layer, provided that an elastic modulus is measured based on a sectional elastic modulus profile of the optical film using an atomic force microscope.

18. The optical film according to claim 13, wherein the A layer contains an inorganic substance at 40 mass-% or less on the basis of the total mass of the A layer.

19. The optical film according to claim 13, wherein the thickness of the A layer is from 1 nm to 100 nm.

20. The optical film according to claim 13, wherein the height of the concave-convex microstructure of the B layer is from 300 nm to 1,500 nm.

21. The optical film according to claim 13, wherein the porosity of the B layer attributable to voids with a major diameter of 50 nm or less present in the B layer is 5% or less.

22. The optical film according to claim 13, wherein the A layer contains metal oxide particles, and the average primary particle diameter of the metal oxide particles is 100 nm or less.

23. The optical film according to claim 13, wherein the surface roughness Rz of a surface, which faces the A layer, of a layer adjacent to the A layer is two-thirds or less of the thickness of the A layer.

24. The optical film according to claim 13, further comprising a protective layer.

25. The optical film according to claim 24, wherein the protective layer comprises a base layer, and a resin mold layer having a concave-convex microstructure.

26. The optical film according to claim 25, wherein the concave-convex microstructure of the resin mold layer and the concave-convex microstructure of the B layer face each other having profiles that are complement each other.

27. A method for producing the optical film according to claim 13 comprising:
forming the B layer by transferring, or casting and curing, using a resin mold layer having a concave-convex microstructure, and
coating the A layer on to the first major surface of the B layer.

28. A method for producing the semiconductor light emitting device according to claim 1 comprising:
forming a laminate comprising the semiconductor layer, and
forming on a surface of the laminate an A layer and the B layer with interpositioning of the A layer.

29. A method for producing a semiconductor light emitting device comprising a semiconductor layer, an A layer, and a B layer, wherein:
the semiconductor light emitting device is configured such that at least a part of emitted light from the semiconductor layer is emitted out of the B layer through the A layer,
the thickness of the A layer is from 1 nm to 200 nm,
the B layer has a first major surface and a second major surface, while the first major surface faces the A layer, and the second major surface has a concave-convex microstructure,
the A layer contains an inorganic substance at 60 mass-% or less on the basis of the total mass of the A layer,
the B layer contains an inorganic substance at 60 mass-% or more on the basis of the total mass of the B layer, and
the content of the inorganic substance present in the A layer is less than the content of the inorganic substance present in the B layer, and wherein:
the method comprises:
forming a laminate comprising the semiconductor layer, and
laminating the optical film according to claim 13 on a surface of the laminate at a temperature not lower than the glass transition temperature of the A layer such that the A layer faces the laminate.

30. The method according to claim 29, wherein:
the optical film further comprises a protective layer placed to face the A layer with interpositioning of the B layer, and
the method further comprises peeling the protective layer after lamination at a temperature not higher than the glass transition temperature of the A layer.

* * * * *